(12) United States Patent
Yamazaki et al.

(10) Patent No.: US 11,959,165 B2
(45) Date of Patent: Apr. 16, 2024

(54) SEMICONDUCTOR DEVICE COMPRISING OXIDE SEMICONDUCTOR FILM

(71) Applicant: SEMICONDUCTOR ENERGY LABORATORY CO., LTD., Atsugi (JP)

(72) Inventors: Shunpei Yamazaki, Tokyo (JP); Tetsunori Maruyama, Kanagawa (JP); Yuki Imoto, Kanagawa (JP); Hitomi Sato, Kanagawa (JP); Masahiro Watanabe, Tochigi (JP); Mitsuo Mashiyama, Tochigi (JP); Kenichi Okazaki, Tochigi (JP); Motoki Nakashima, Kanagawa (JP); Takashi Shimazu, Tokyo (JP)

(73) Assignee: Semiconductor Energy Laboratory Co., Ltd., Atsugi (JP)

(*) Notice: Subject to any disclaimer, the term of this patent is extended or adjusted under 35 U.S.C. 154(b) by 133 days.

(21) Appl. No.: 17/228,847

(22) Filed: Apr. 13, 2021

(65) Prior Publication Data

US 2021/0230740 A1    Jul. 29, 2021

Related U.S. Application Data

(63) Continuation of application No. 16/285,297, filed on Feb. 26, 2019, now Pat. No. 11,066,739, which is a
(Continued)

(30) Foreign Application Priority Data

Jun. 8, 2011   (JP) ................................. 2011-128750
Dec. 15, 2011  (JP) ................................. 2011-274954

(51) Int. Cl.
   C23C 14/34      (2006.01)
   B28B 11/24      (2006.01)
(Continued)

(52) U.S. Cl.
   CPC ........ *C23C 14/3414* (2013.01); *B28B 11/243* (2013.01); *C04B 35/453* (2013.01);
   (Continued)

(58) Field of Classification Search
   None
   See application file for complete search history.

(56) References Cited

U.S. PATENT DOCUMENTS 5,528,032 A    6/1996   Uchiyama
5,622,653 A    4/1997   Orita et al.
(Continued)

FOREIGN PATENT DOCUMENTS

CN    101587840 A    11/2009
CN    101680081 A    3/2010
(Continued)

OTHER PUBLICATIONS

German Office Action (Application No. 112012007366.5) dated Jan. 24, 2022.
(Continued)

*Primary Examiner* — Alexander G Ghyka
(74) *Attorney, Agent, or Firm* — Fish & Richardson P.C.

(57) ABSTRACT

There have been cases where transistors formed using oxide semiconductors are inferior in reliability to transistors formed using amorphous silicon. Thus, in the present invention, a semiconductor device including a highly reliable transistor formed using an oxide semiconductor is manufactured. An oxide semiconductor film is deposited by a sputtering method, using a sputtering target including an oxide semiconductor having crystallinity, and in which the direction of the c-axis of a crystal is parallel to a normal vector of the top surface of the oxide semiconductor. The target is formed by mixing raw materials so that its composition ratio can obtain a crystal structure.

6 Claims, 45 Drawing Sheets

Related U.S. Application Data continuation of application No. 15/189,104, filed on Jun. 22, 2016, now Pat. No. 10,889,888, which is a continuation of application No. 13/488,626, filed on Jun. 5, 2012, now Pat. No. 9,382,611.

(51) Int. Cl.
| | |
|---|---|
| *C04B 35/453* | (2006.01) |
| *C04B 35/64* | (2006.01) |
| *C23C 14/08* | (2006.01) |
| *H01L 21/02* | (2006.01) |
| *H01L 29/24* | (2006.01) |
| *H01L 29/66* | (2006.01) |
| *H01L 29/786* | (2006.01) |

(52) U.S. Cl.
CPC ............. *C04B 35/64* (2013.01); *C23C 14/08* (2013.01); *C23C 14/086* (2013.01); *C23C 14/345* (2013.01); *H01L 21/02565* (2013.01); *H01L 21/02631* (2013.01); *H01L 29/24* (2013.01); *H01L 29/66969* (2013.01); *H01L 29/7869* (2013.01); *C04B 2235/3284* (2013.01); *C04B 2235/3286* (2013.01); *C04B 2235/76* (2013.01)

(56) References Cited

U.S. PATENT DOCUMENTS

| | | | |
|---|---|---|---|
| 5,681,671 A | 10/1997 | Orita et al. |
| 5,700,419 A | 12/1997 | Matsunaga et al. |
| 5,731,856 A | 3/1998 | Kim et al. |
| 5,744,864 A | 4/1998 | Cillessen et al. |
| 5,843,341 A | 12/1998 | Orita et al. |
| 5,952,086 A | 9/1999 | Ohnishi et al. |
| 5,955,178 A | 9/1999 | Orita et al. |
| 5,972,527 A | 10/1999 | Kaijou et al. |
| 6,294,274 B1 | 9/2001 | Kawazoe et al. |
| 6,503,374 B1 | 1/2003 | Tseng et al. |
| 6,534,183 B1 | 3/2003 | Inoue |
| 6,563,174 B2 | 5/2003 | Kawasaki et al. |
| 6,669,830 B1 | 12/2003 | Inoue et al. |
| 6,689,477 B2 | 2/2004 | Inoue |
| 6,727,522 B1 | 4/2004 | Kawasaki et al. |
| 6,907,849 B2 | 6/2005 | Galvin |
| 6,998,070 B2 | 2/2006 | Inoue et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,306,861 B2 | 12/2007 | Inoue et al. |
| 7,323,356 B2 | 1/2008 | Hosono et al. |
| 7,385,224 B2 | 6/2008 | Ishii et al. |
| 7,393,600 B2 | 7/2008 | Inoue et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Wasaki |
| 7,462,862 B2 | 12/2008 | Hoffman et al. |
| 7,468,304 B2 | 12/2008 | Kaji et al. |
| 7,501,293 B2 | 3/2009 | Ito. et al. |
| 7,510,635 B2 | 3/2009 | Shindo et al. |
| 7,648,657 B2 | 1/2010 | Inoue et al. |
| 7,674,650 B2 | 3/2010 | Akimoto et al. |
| 7,732,819 B2 | 6/2010 | Akimoto et al. |
| 7,893,431 B2 | 2/2011 | Kim et al. |
| 7,935,964 B2 | 5/2011 | Kim et al. |
| 7,959,982 B2 | 6/2011 | Le Craz |
| 7,982,216 B2 | 7/2011 | Imai |
| 8,003,981 B2 | 8/2011 | Iwasaki et al. |
| 8,021,916 B2 | 9/2011 | Akimoto et al. |
| 8,115,883 B2 | 2/2012 | Yamazaki et al. |
| 8,137,594 B2 | 3/2012 | Imanishi et al. |
| 8,153,031 B2 | 4/2012 | Yano et al. |
| 8,193,008 B2 | 6/2012 | Umezu et al. |
| 8,202,365 B2 | 6/2012 | Umeda et al. |
| 8,264,874 B2 | 9/2012 | Saito et al. |
| 8,274,078 B2 | 9/2012 | Itagaki et al. |
| 8,304,359 B2 | 11/2012 | Yano et al. |
| 8,319,218 B2 | 11/2012 | Yamazaki et al. |
| 8,333,913 B2 | 12/2012 | Inoue et al. |
| 8,355,109 B2 | 1/2013 | Kubota et al. |
| 8,421,070 B2 | 4/2013 | Kim et al. |
| 8,450,732 B2 | 5/2013 | Kim et al. |
| 8,455,371 B2 | 6/2013 | Yano et al. |
| 8,488,077 B2 | 7/2013 | Yamazaki et al. |
| 8,492,862 B2 | 7/2013 | Yamazaki et al. |
| 8,502,220 B2 | 8/2013 | Yamazaki et al. |
| 8,598,578 B2 | 12/2013 | Yano et al. |
| 8,623,511 B2 | 1/2014 | Kawashima et al. |
| 8,641,930 B2 | 2/2014 | Yano et al. |
| 8,698,970 B2 | 4/2014 | Yamazaki et al. |
| 8,735,882 B2 | 5/2014 | Kim et al. |
| 8,784,700 B2 | 7/2014 | Inoue et al. |
| 8,795,554 B2 | 8/2014 | Yano et al. |
| 8,809,115 B2 | 8/2014 | Akimoto et al. |
| 8,872,171 B2 | 10/2014 | Yamazaki et al. |
| 8,879,011 B2 | 11/2014 | Yamazaki et al. |
| 8,889,477 B2 | 11/2014 | Yamazaki et al. |
| 8,994,889 B2 | 3/2015 | Yamazaki et al. |
| 9,136,338 B2 | 9/2015 | Yano et al. |
| 9,306,072 B2 | 4/2016 | Yamazaki et al. |
| 9,382,611 B2 | 7/2016 | Yamazaki et al. |
| 9,466,756 B2 | 10/2016 | Yamazaki et al. |
| 9,935,202 B2 | 4/2018 | Yamazaki et al. |
| 10,243,005 B2 | 3/2019 | Yamazaki et al. |
| 10,373,843 B2 | 8/2019 | Yamazaki et al. |
| 11,024,516 B2 | 6/2021 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0170311 A1 | 8/2005 | Tardieu et al. |
| 2005/0189401 A1 | 9/2005 | Butzer et al. |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0098626 A1 | 5/2007 | Shindo et al. |
| 2007/0108446 A1 | 5/2007 | Akimoto |
| 2007/0152217 A1 | 7/2007 | Lai et al. |
| 2007/0158716 A1 | 7/2007 | Rinerson et al. |
| 2007/0172591 A1 | 7/2007 | Seo et al. |

(56) References Cited

U.S. PATENT DOCUMENTS

| | | |
|---|---|---|
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0197750 A1 | 8/2008 | Katardjiev |
| 2008/0206923 A1 | 8/2008 | Kim et al. |
| 2008/0224133 A1 | 9/2008 | Park et al. |
| 2008/0237875 A1* | 10/2008 | Yamazaki ......... H01L 29/41733 257/773 |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308774 A1 | 12/2008 | Inoue et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134389 A1 | 5/2009 | Matsunaga |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278120 A1 | 11/2009 | Lee et al. |
| 2009/0278122 A1 | 11/2009 | Hosono et al. |
| 2009/0280600 A1 | 11/2009 | Hosono et al. |
| 2010/0009314 A1 | 1/2010 | Tardieu et al. |
| 2010/0025677 A1 | 2/2010 | Yamazaki et al. |
| 2010/0051949 A1 | 3/2010 | Yamazaki et al. |
| 2010/0065844 A1 | 3/2010 | Tokunaga |
| 2010/0092800 A1 | 4/2010 | Itagaki et al. |
| 2010/0108502 A1 | 5/2010 | Inoue et al. |
| 2010/0109002 A1 | 5/2010 | Itagaki et al. |
| 2010/0173106 A1 | 7/2010 | Lecraz |
| 2010/0320458 A1 | 12/2010 | Umeda et al. |
| 2010/0320459 A1 | 12/2010 | Umeda et al. |
| 2011/0062436 A1 | 3/2011 | Yamazaki et al. |
| 2011/0080774 A1 | 4/2011 | Saito et al. |
| 2011/0084264 A1 | 4/2011 | Yamazaki et al. |
| 2011/0101334 A1 | 5/2011 | Yamazaki et al. |
| 2011/0114480 A1 | 5/2011 | Yamazaki et al. |
| 2011/0114944 A1 | 5/2011 | Yamazaki et al. |
| 2011/0114999 A1 | 5/2011 | Yamazaki et al. |
| 2011/0127521 A1 | 6/2011 | Yamazaki |
| 2011/0127579 A1 | 6/2011 | Yamazaki |
| 2011/0151618 A1 | 6/2011 | Yamazaki et al. |
| 2011/0168994 A1 | 7/2011 | Kawashima et al. |
| 2011/0180392 A1 | 7/2011 | Yano et al. |
| 2011/0198594 A1 | 8/2011 | Yamazaki |
| 2011/0244652 A1 | 10/2011 | Yamazaki et al. |
| 2011/0256684 A1 | 10/2011 | Iwasaki et al. |
| 2011/0260118 A1 | 10/2011 | Yano et al. |
| 2011/0275032 A1 | 11/2011 | Tardieu et al. |
| 2011/0284848 A1 | 11/2011 | Yamazaki |
| 2012/0012847 A1 | 1/2012 | Koyama et al. |
| 2012/0032162 A1 | 2/2012 | Matsubayashi |
| 2012/0049183 A1 | 3/2012 | Yamazaki |
| 2012/0052606 A1 | 3/2012 | Yamazaki |
| 2012/0052624 A1 | 3/2012 | Yamazaki |
| 2012/0058366 A1 | 3/2012 | Iwahori et al. |
| 2012/0061663 A1 | 3/2012 | Yamazaki et al. |
| 2012/0093712 A1 | 4/2012 | Yano et al. |
| 2012/0231559 A1 | 9/2012 | Umezu et al. |
| 2012/0319100 A1 | 12/2012 | Yoshioka et al. |
| 2012/0325650 A1 | 12/2012 | Yamazaki et al. |
| 2013/0285053 A1 | 10/2013 | Kawashima et al. |
| 2013/0341180 A1 | 12/2013 | Yamazaki |
| 2014/0001040 A1 | 1/2014 | Inoue et al. |
| 2014/0021036 A1 | 1/2014 | Yamazaki |
| 2014/0042018 A1 | 2/2014 | Yamazaki |
| 2014/0291668 A1 | 10/2014 | Morosawa |
| 2014/0339073 A1 | 11/2014 | Inoue et al. |
| 2014/0357018 A1 | 12/2014 | Akimoto et al. |
| 2015/0048363 A1 | 2/2015 | Yamazaki et al. |
| 2015/0179675 A1 | 6/2015 | Yamazaki et al. |
| 2017/0016108 A1 | 1/2017 | Yamazaki et al. |
| 2018/0226510 A1 | 8/2018 | Yamazaki et al. |
| 2021/0358766 A1 | 11/2021 | Yamazaki et al. |

FOREIGN PATENT DOCUMENTS

| | | |
|---|---|---|
| CN | 101845615 A | 9/2010 |
| DE | 102007047146 | 4/2008 |
| EP | 0486182 A | 5/1992 |
| EP | 0686982 A | 12/1995 |
| EP | 0757116 A | 2/1997 |
| EP | 0869563 A | 10/1998 |
| EP | 1737044 A | 12/2006 |
| EP | 2061086 A | 5/2009 |
| EP | 2096188 A | 9/2009 |
| EP | 2226847 A | 9/2010 |
| EP | 2256814 A | 12/2010 |
| EP | 2439309 A | 4/2012 |
| EP | 2471972 A | 7/2012 |
| EP | 2544237 A | 1/2013 |
| EP | 2669402 A | 12/2013 |
| EP | 3217435 A | 9/2017 |
| EP | 3249698 A | 11/2017 |
| EP | 3540772 A | 9/2019 |
| JP | 60-198861 A | 10/1985 |
| JP | 62-122011 A | 6/1987 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 02-053239 A | 2/1990 |
| JP | 04-104937 A | 4/1992 |
| JP | 05-251705 A | 9/1993 |
| JP | 06-088218 A | 3/1994 |
| JP | 06-275697 A | 9/1994 |
| JP | 06-340468 A | 12/1994 |
| JP | 07-031950 B | 4/1995 |
| JP | 07-333438 A | 12/1995 |
| JP | 08-245220 A | 9/1996 |
| JP | 08-264794 A | 10/1996 |
| JP | 08-311643 A | 11/1996 |
| JP | 10-045496 A | 2/1998 |
| JP | 11-505377 | 5/1999 |
| JP | 11-286002 A | 10/1999 |
| JP | 2000-044236 A | 2/2000 |
| JP | 2000-150900 A | 5/2000 |
| JP | 2002-076356 A | 3/2002 |
| JP | 2002-165221 A | 6/2002 |
| JP | 2002-265221 A | 9/2002 |
| JP | 2002-289859 A | 10/2002 |
| JP | 2003-041362 A | 2/2003 |
| JP | 2003-086000 A | 3/2003 |
| JP | 2003-086808 A | 3/2003 |
| JP | 2003-193231 A | 7/2003 |
| JP | 2003-529711 | 10/2003 |
| JP | 2004-103957 A | 4/2004 |
| JP | 2004-273614 A | 9/2004 |
| JP | 2004-273732 A | 9/2004 |
| JP | 3569885 | 9/2004 |
| JP | 2005-518834 | 6/2005 |
| JP | 2006-165528 A | 6/2006 |
| JP | 2006-287084 A | 10/2006 |
| JP | 2007-073312 A | 3/2007 |
| JP | 2007-514865 | 6/2007 |

(56) References Cited

FOREIGN PATENT DOCUMENTS

| | | |
|---|---|---|
| JP | 2007-250983 A | 9/2007 |
| JP | 2008-135520 A | 6/2008 |
| JP | 2008-163441 A | 7/2008 |
| JP | 2008-214697 A | 9/2008 |
| JP | 2009-057605 A | 3/2009 |
| JP | 2009-141341 A | 6/2009 |
| JP | 2009-167095 A | 7/2009 |
| JP | 2009-533884 | 9/2009 |
| JP | 2009-231664 A | 10/2009 |
| JP | 2009-275272 A | 11/2009 |
| JP | 2010-018457 A | 1/2010 |
| JP | 2010-021170 A | 1/2010 |
| JP | 2010-070418 A | 4/2010 |
| JP | 2010-080954 A | 4/2010 |
| JP | 2010-103451 A | 5/2010 |
| JP | 2010-177431 A | 8/2010 |
| JP | 2010-206214 A | 9/2010 |
| JP | 2010-212326 A | 9/2010 |
| JP | 2010-531059 | 9/2010 |
| JP | 2011-029238 A | 2/2011 |
| JP | 2011-058012 A | 3/2011 |
| JP | 2011-084765 A | 4/2011 |
| JP | 2011-086923 A | 4/2011 |
| JP | 2011-097033 A | 5/2011 |
| JP | 2011-100979 A | 5/2011 |
| JP | 2011-105563 A | 6/2011 |
| JP | 2011-106002 A | 6/2011 |
| JP | 2011-179056 A | 9/2011 |
| JP | 5194193 | 5/2013 |
| KR | 2006-0056399 A | 5/2006 |
| KR | 2007-0087226 A | 8/2007 |
| KR | 2009-0122391 A | 11/2009 |
| KR | 2011-0010799 A | 2/2011 |
| KR | 2011-0015381 A | 2/2011 |
| KR | 2011-0022538 A | 3/2011 |
| KR | 2011-0027805 A | 3/2011 |
| KR | 2011-0058693 A | 6/2011 |
| TW | 201115741 | 5/2011 |
| WO | WO-2001/075284 | 10/2001 |
| WO | WO-2004/114391 | 12/2004 |
| WO | WO-2005/033355 | 4/2005 |
| WO | WO-2006/101450 | 9/2006 |
| WO | WO-2007/119386 | 10/2007 |
| WO | WO-2007/120010 | 10/2007 |
| WO | WO-2008/114588 | 9/2008 |
| WO | WO-2008/156311 | 12/2008 |
| WO | WO-2008/156312 | 12/2008 |
| WO | WO-2009/142289 | 11/2009 |
| WO | WO-2009/148154 | 12/2009 |
| WO | WO-2009/157535 | 12/2009 |
| WO | WO-2011/033936 | 3/2011 |
| WO | WO-2011/043176 | 4/2011 |
| WO | WO-2012/169449 | 12/2012 |

OTHER PUBLICATIONS

Kobayashi.M et al., "InGaZnO TFT Deposition Technology for Large Substrates", Ulvac Technical Journal, 2010, No. 73E, pp. 10-17.
Ogawa.N et al., "Study of ZAO Targets—Effect of Target Crystallographic Orientation—", Journal of TOSOH Research, Jul. 1, 1992, vol. 36, No. 2, pp. 161-166.
International Search Report (Application No. PCT/JP2012/064341) dated Aug. 28, 2012.
Written Opinion (Application No. PCT/JP2012/064341) dated Aug. 28, 2012.
Notification (Application No. 2012-272630) dated Sep. 10, 2013.
Information Offer Form (Application No. 2012-272630) Dated Aug. 15, 2013.
Taiwanese Office Action (Application No. 102114229) dated Aug. 22, 2013.
Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.
Silva.J et al., "Rules of Structure Formation for the Homologous InMO3(ZnO)n Compounds", Phys. Rev. Lett. (Physical Review Letters), Jun. 27, 2008, vol. 100, pp. 255501-1-255501-4.
Yan.Y et al., "Polytypoid structures in annealed In2O3.ZnO films", Appl. Phys. Lett. (Applied Physics Letters) , Nov. 2, 1998, vol. 73, No. 18, pp. 2585-2587.
Japanese Office Action (Application No. 2012-123954) dated Dec. 3, 2013.
Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Asaoka. Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Clark.S et al., "First Principles Methods Using CASTEP", Zeitschrift fur Kristallographie, 2005, vol. 220, pp. 567-570.
Coates.D et al., "Optical Studies of the Amorphous Liquid-Cholesteric Liquid Crystal Transition: The "Blue Phase"", Physics Letters, Sep. 10, 1973, vol. 45A, No. 2, pp. 115-116.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.
Fung. T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Godo.H et al., "P-9:NUMERICAL Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Hosono.H, "68.3:Invited Paper: Transparent Amorphous Oxide Semiconductors for High Performance TFT", SID Digest '07 : SID International Symposium Digest of Technical Papers, 2007, vol. 38, pp. 1830-1833.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

(56) References Cited

OTHER PUBLICATIONS

Ikeda.T et al., "Full-Functional System Liquid Crystal Display Using Cg-Silicon Technology", SID Digest '04 : SID International Symposium Digest of Technical Papers, 2004, vol. 35, pp. 860-863.
Janotti.A et al., "Native Point Defects in ZnO", Phys. Rev. B (Physical Review. B), Oct. 4, 2007, vol. 76, No. 16, pp. 165202-1-165202-22.
Janotti.A et al., "Oxygen Vacancies In ZnO", Appl. Phys. Lett. (Applied Physics Letters) , 2005, vol. 87, pp. 122102-1-122102-3.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N et al., "Spinel, YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures Over 1000° C.", Journal of Solid State Chemistry, 1985, vol. 60, pp. 382-384.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED ", IDW '06 : Proceedings of the 13th International Display Workshops, Dec. 7, 2006, pp. 663-666.
Lee.J et al., "World's Largest (15-inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", Nirim Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

(56) References Cited

OTHER PUBLICATIONS

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 DIGEST, 2007, pp. 1249-1252.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-IN. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Chinese Office Action (Application No. 201310150088.0) dated Mar. 17, 2014.

Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10.

Colla.T et al., "Experiment and simulation of cluster emission from 5 keV Ar→Cu", Nucl. Instrum. Methods Phys. Res. B(Nuclear Instruments and Methods in Physics Research B), Mar. 3, 1998, vol. 143, pp. 284-297, ELSEVIER.

Heinrich.R et al., "Projectile size effects on cluster formation in sputtering", Nucl. Instrum. Methods Phys. Res. B(Nuclear Instruments and Methods in Physics Research B), Dec. 17, 2002, vol. 207, pp. 136-144, ELSEVIER.

Henriksson.K et al., "Fragmentation of clusters sputtered from silver and gold: Molecular dynamics simulations", Phys. Rev. B (Physical Review. B), Jan. 28, 2005, vol. 71, pp. 014117-1-014117-11.

Rehn.L et al., "Origin of Atomic Clusters during Ion Sputtering", Phys. Rev. Lett. (Physical Review Letters), Nov. 12, 2001, vol. 87, No. 20, pp. 207601-1-207601-4.

Yamazaki.S et al., "Back-channel-etched thin-film transistor using c-axis-aligned crystal In—Ga—Zn oxide", J. Soc. Inf. Display (Journal of the Society for Information Display), 2014, vol. 22, No. 1, pp. 55-67.

Korean Office Action (Application No. 2012-7020228) dated Feb. 3, 2014.

Chinese Office Action (Application No. 201280000715.6) dated Apr. 30, 2015.

Chinese Journal of Low Temperature Physics, May 1, 1991, vol. 13, No. 3, pp. 216-220.

Chinese Office Action (Application No. 201280000715.6) dated Dec. 15, 2015.

Taiwanese Office Action (Application No. 105131693) dated Feb. 17, 2017.

Korean Office Action (Application No. 2013-7033903) dated Aug. 1, 2017.

Vietnamese Office Action (Application No. 1-2014-00068) dated Nov. 30, 2018.

Chinese Office Action (Application No. 201611206269.0) dated Feb. 3, 2019.

German Office Action (Application No. 112012007365.7) DATED Sep. 27, 2023.

\* cited by examiner

● In
○ Sn
○ Zn
● O

● In
● Ga
● Zn
● O

Crystal structure

Surface structure (4)

Crystal structure

Surface structure (4)

● In
○ Ga
○ Zn
● O

SEMICONDUCTOR DEVICE COMPRISING OXIDE SEMICONDUCTOR FILM

CROSS-REFERENCE TO RELATED APPLICATIONS

This application is a continuation of U.S. application Ser. No. 16/285,297, filed Feb. 26, 2019, now allowed, which is a continuation of U.S. application Ser. No. 15/189,104, filed Jun. 22, 2016, now U.S. Pat. No. 10,889,888, which is a continuation of U.S. application Ser. No. 13/488,626, filed Jun. 5, 2012, now U.S. Pat. No. 9,382,611, which claims the benefit of foreign priority applications filed in Japan as Serial No. 2011-128750 on Jun. 8, 2011, and Serial No. 2011-274954 on Dec. 15, 2011, all of which are incorporated by reference.

TECHNICAL FIELD

The present invention relates to a sputtering target and a manufacturing method thereof. In addition, the present invention relates to an oxide semiconductor film deposited by a sputtering method, using the sputtering target, and a semiconductor device including the oxide semiconductor film.

In this specification, a semiconductor device generally refers to a device which can function by utilizing semiconductor characteristics; an electro-optical device, a semiconductor circuit, and an electronic device are all included in the category of the semiconductor device.

BACKGROUND ART

A technique by which transistors are formed using semiconductor thin films formed over a substrate having an insulating surface has been attracting attention. The transistor is applied to a wide range of electronic devices such as an integrated circuit (IC) or an image display device (display device). As materials of semiconductor thin films applicable to the transistors, silicon-based semiconductor materials have been widely used, but oxide semiconductors have been attracting attention as alternative materials.

For example, disclosure is made of a transistor whose active layer is formed using an oxide semiconductor containing In, Ga, and Zn and having an electron carrier concentration of lower than $10^{18}/cm^3$, and a sputtering method is considered the most suitable as a method for depositing an oxide semiconductor film (see Patent Document 1).

REFERENCE

[Patent Document 1] Japanese Published Patent Application No. 2006-165528

DISCLOSURE OF INVENTION

There have been cases where transistors formed using oxide semiconductors are inferior in reliability to transistors formed using amorphous silicon. Thus, in the present invention, a semiconductor device including a highly reliable transistor formed using an oxide semiconductor is manufactured.

In addition, another object of one embodiment of the present invention is to provide a method for forming an oxide semiconductor which enables a highly reliable transistor to be obtained.

An oxide semiconductor film is deposited by a sputtering method, using a sputtering target including an oxide semiconductor having a crystal region in which the direction of c-axis is parallel to a normal vector of the top surface of the oxide semiconductor.

In such a manner, a crystal state of the sputtering target is transferred to a substrate, whereby an oxide semiconductor film having a crystal region in which the direction of the c-axis is parallel to a normal vector of the top surface of the oxide semiconductor film can be easily obtained.

The sputtering target including an oxide semiconductor having a crystal region in which the direction of the c-axis is parallel to a normal vector of the top surface of the oxide semiconductor is formed by mixing raw materials so that its composition ratio is the same as that in a single crystal state.

When ions collide with the surface of the sputtering target, the crystal region included in the sputtering target is cleaved along an a-b plane, and sputtered particles whose top and bottom surfaces are each aligned with a layer parallel to the a-b plane (flat-plate-like sputtered particle or pellet-like sputtered particle) are separated from the sputtering target. The flat-plate-like sputtered particles reach a substrate surface with their original crystal state maintained, whereby an oxide semiconductor film formed by the sputtering and having a crystal region in which the direction of the c-axis is parallel to a normal vector of the top surface of the oxide semiconductor film can be easily obtained.

Note that in the case where an In—Ga—Zn—O compound is used as the sputtering target, an outermost surface layer of the flat-plate-like sputtered particle is a plane including Ga and Zn in many cases.

The higher the density of the sputtering target is, the more preferable. When the density of the sputtering target is increased, the density of a film to be deposited can also be increased. Specifically, the relative density of the sputtering target is set to be higher than or equal to 90%, preferably higher than or equal to 95%, more preferably higher than or equal to 99%. Note that the relative density of the sputtering target refers to a ratio between the density of the sputtering target and the density of a material free of porosity having the same composition as the sputtering target.

In addition, it is preferable to apply at least one of the following conditions to obtain easily an oxide semiconductor film having a crystal region in which the direction of the c-axis is parallel to a normal vector of the top surface of the oxide semiconductor film.

The first condition is sufficiently low surface temperature of the sputtering target, preferably about room temperature. In a sputtering apparatus for a large substrate, a sputtering target having a large area is often used. However, it is difficult to form a sputtering target for a large substrate without a juncture. In fact, a plurality of sputtering targets are assembled to obtain a large shape. Although the targets are arranged so that spaces therebetween are as small as possible, a slight space is inevitably generated. When the surface temperature of the sputtering target increases, in some cases, Zn or the like is volatilized from such slight spaces, and the spaces might expand gradually. When the spaces expanded, a material of a backing plate or a material used for adhesion might be sputtered and cause an increase in impurity concentration. Thus, it is preferable that the sputtering target be cooled sufficiently.

The second condition is a reduction impurities contamination (e.g., hydrogen, water, carbon dioxide, and nitrogen) from a deposition chamber.

The third condition is a reduction in impurities contained in a gas that is used at the time of deposition.

By reducing impurities introduced to the oxide semiconductor film at the time of deposition, a crystal state is prevented from being broken by the impurities and an oxide semiconductor film having a crystal region in which the direction of the c-axis is parallel to a normal vector of the top surface of the oxide semiconductor film can be easily obtained.

The fourth condition is enhancement of the planarity of a film serving as a base.

When the top surface of the film serving as a base has minute unevenness, this might hinder crystal growth. Therefore, when the film serving as a base is flat, an oxide semiconductor film having a crystal region in which the direction of the c-axis is parallel to a normal vector of the top surface of the oxide semiconductor film can be easily obtained.

The fifth condition is an increase in substrate temperature at the time of deposition.

By increasing the substrate temperature, migration of sputtered particles are likely to occur on a substrate surface. With this effect, a flat-plate-like sputtered particle reaches the substrate surface, moves slightly, and then is attached to the substrate surface with a flat plane (a-b plane) of the sputtered particle facing toward the substrate surface. Therefore, an oxide semiconductor film having a crystal region in which the direction of the c-axis is parallel to a normal vector of the top surface of the oxide semiconductor film can be easily obtained.

The sixth condition is an increase in the proportion of oxygen contained in the gas that is used at the time of deposition.

The seventh condition is optimization of power used for deposition.

By increasing the proportion of oxygen contained in the deposition gas and optimizing the power used for deposition, plasma damage at the time of deposition can be alleviated. Therefore, an oxide semiconductor film having a crystal region in which the direction of the c-axis is parallel to a normal vector of the top surface of the oxide semiconductor film can be easily obtained.

With the use of such an oxide semiconductor film having a crystal region in which the direction of the c-axis is parallel to a normal vector of the top surface of the oxide semiconductor film, a highly reliable transistor can be obtained.

This is because, with the use of the oxide semiconductor film having a crystal region in which the direction of the c-axis is parallel to a normal vector of the top surface of the oxide semiconductor film, defect levels and impurity levels in the oxide semiconductor film and at the interface between the oxide semiconductor film and an insulating film in contact with the oxide semiconductor film are reduced, and such a reduction can improve the reliability of a transistor.

In addition, it is preferable to reduce the impurity concentration in the oxide semiconductor film by performing heat treatment after deposition. The heat treatment is highly effective in reducing the impurity concentration when performed in an inert atmosphere or a reduced-pressure atmosphere. For the heat treatment, it is desirable to perform a second heat treatment in an oxidation atmosphere after a first heat treatment is performed in an inert atmosphere or a reduced-pressure atmosphere. This is because the heat treatment performed in an inert atmosphere or a reduced-pressure atmosphere generates oxygen vacancies in the oxide semiconductor film as well as reducing the impurity concentration in the oxide semiconductor film By performing the heat treatment in an oxidation atmosphere, oxygen vacancies in the oxide semiconductor film can be reduced.

As an example of the oxide semiconductor film having a crystal region in which the direction of the c-axis is parallel to a normal vector of the top surface of the oxide semiconductor film, a c-axis aligned crystalline oxide semiconductor (CAAC-OS) film may be used.

The CAAC-OS film is not completely single crystal nor completely amorphous. The CAAC-OS film is an oxide semiconductor film with a crystal-amorphous mixed phase structure where a crystal region and an amorphous region are included in an amorphous phase. Note that in most cases, the crystal region fits inside a cube whose one side is less than 100 nm. From an observation image obtained with a transmission electron microscope (TEM), a boundary between an amorphous region and a crystal region in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal regions included in the CAAC-OS film, a c-axis is aligned in a direction parallel to a normal vector of a surface on which the CAAC-OS film is formed or a normal vector of a top surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal regions, the directions of the a-axis and the b-axis of one crystal region may be different from those of another crystal region. In this specification, a simple term "perpendicular" includes a range from 85° to 95°. In addition, a simple term "parallel" includes a range from −5° to 5°.

In the CAAC-OS film, distribution of crystal regions is not necessarily uniform. For example, in the formation process of the CAAC-OS film, in the case where crystal growth occurs from a top surface side of the oxide semiconductor film, the proportion of crystal regions in the vicinity of the top surface of the oxide semiconductor film is higher than that in the vicinity of the surface on which the oxide semiconductor film is formed in some cases. Further, when an impurity is added to the CAAC-OS film, the crystal region in a region to which the impurity is added becomes amorphous in some cases.

Since the c-axes of the crystal regions included in the CAAC-OS film are aligned in the direction parallel to a normal vector of a surface on which the CAAC-OS film is formed or a normal vector of a top surface of the CAAC-OS film, the directions of the c-axes may be different from each other depending on the shape of the CAAC-OS film (the cross-sectional shape of the surface where the CAAC-OS film is formed or the cross-sectional shape of the top surface of the CAAC-OS film). Note that when the CAAC-OS film is formed, the direction of the c-axis of the crystal region is the direction parallel to a normal vector of the surface where the CAAC-OS film is formed or a normal vector of the top surface of the CAAC-OS film. The crystal region is formed by deposition or by performing treatment for crystallization such as heat treatment after deposition.

With use of the CAAC-OS film in a transistor, change in electric characteristics of the transistor due to irradiation with visible light or ultraviolet light can be reduced. Thus, the transistor has high reliability.

An example of a crystal structure of the CAAC-OS film will be described in detail with reference to FIGS. 22A to 22E, FIGS. 23A to 23C, FIGS. 24A to 24C, and FIGS. 25A and 25B. In FIGS. 22A to 22E, FIGS. 23A to 23C, FIGS.

24A to 24C, and FIGS. 25A and 25B, the vertical direction corresponds to the c-axis direction and a plane perpendicular to the c-axis direction corresponds to the a-b plane, unless otherwise specified. In the case where the expressions "an upper half" and "a lower half" are simply used, they refer to an upper half above the a-b plane and a lower half below the a-b plane (an upper half and a lower half with respect to the a-b plane). Furthermore, in FIGS. 22A to 22E, O surrounded by a circle represents tetracoordinate O and O surrounded by a double circle represents tricoordinate O.

FIG. 22A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 22A is actually an octahedral structure, but is illustrated as a planar structure for simplicity. Note that three tetracoordinate O atoms exist in each of an upper half and a lower half in FIG. 22A. In the small group illustrated in FIG. 22A, electric charge is 0 (zero).

FIG. 22B illustrates a structure including one pentacoordinate Ga atom, three tricoordinate oxygen (hereinafter referred to as tricoordinate O) atoms proximate to the Ga atom, and two tetracoordinate O atoms proximate to the Ga atom (or near neighbor Ga atom). All the tricoordinate O atoms are on the a-b plane. One tetracoordinate O atom is located in each of an upper half and a lower half in FIG. 22B. An In atom can also have the structure illustrated in FIG. 22B because an In atom can have five ligands. In the small group illustrated in FIG. 22B, electric charge is 0.

FIG. 22C illustrates a structure including one tetracoordinate Zn atom and four tetracoordinate O atoms proximate to the Zn atom. In FIG. 22C, one tetracoordinate O atom exists in an upper half and three tetracoordinate O atoms exist in a lower half. In the small group illustrated in FIG. 22C, electric charge is 0.

FIG. 22D illustrates a structure including one hexacoordinate Sn atom and six tetracoordinate O atoms proximate to the Sn atom. In FIG. 22D, three tetracoordinate O atoms exist in each of an upper half and a lower half. In the small group illustrated in FIG. 22D, electric charge is +1.

FIG. 22E illustrates a small group including two Zn atoms. In FIG. 22E, one tetracoordinate O atom exists in each of an upper half and a lower half. In the small group illustrated in FIG. 22E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 22A has three proximate In atoms in the downward direction, and the three O atoms in the lower half has three proximate In atoms in the upward direction. The one O atom in the upper half with respect to the pentacoordinate Ga atom in FIG. 22B has one proximate Ga atom in the downward direction, and the one O atom in the lower half has one proximate Ga atom in the upward direction. The one O atom in the upper half with respect to the one tetracoordinate Zn atom in FIG. 22C has one proximate Zn atom in the downward direction, and the three O atoms in the lower half has three proximate Zn atoms in the upward direction. In this manner, the number of tetracoordinate O atoms above a metal atom is equal to the number of metal atoms proximate to and below the tetracoordinate O atoms; similarly, the number of tetracoordinate O atoms below a metal atom is equal to the number of metal atoms proximate to and above the tetracoordinate O atoms.

Since the coordination number of the tetracoordinate O atom is 4, the sum of the number of metal atoms proximate to and below the O atom and the number of metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded to each other. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition, a medium group can also be formed in a different manner by combining a plurality of small groups so that the total electric charge of the layered structure is 0.

FIG. 23A illustrates a model of a medium group included in a layered structure of an In—Sn—Zn—O compound. FIG. 23B illustrates a large group including three medium groups. FIG. 23C illustrates an atomic arrangement where the layered structure in FIG. 23B is observed from the c-axis direction.

In FIG. 23A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 23A, one tetracoordinate O atom existing in each of an upper half and a lower half with respect to an In atom is denoted by circled 1. FIG. 23A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O compound in FIG. 23A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 22E can be given. For example, with one small group including two Zn atoms, electric charge of one small group including a Sn atom can be cancelled, so that the total electric charge of the layered structure can be 0.

Specifically, when the large group illustrated in FIG. 23B is repeated, a crystal of an In—Sn—Zn—O compound ($In_2SnZn_3O_8$) can be obtained. Note that a layered structure of the obtained crystal of the In—Sn—Zn—O compound can be expressed as a composition formula, $In_2SnZnO_6$(ZnO). (in is a natural number).

The above-described rule also applies to the following oxides: an In—Sn—Ga—Zn—O compound, an In—Ga—Zn—O compound, an In—Al—Zn—O compound, a Sn—Ga—Zn—O compound, an Al—Ga—Zn—O compound, a Sn—Al—Zn—O compound, an In—Hf—Zn—O compound, an In—La—Zn—O compound, an In—Ce—Zn—O compound, an In—Pr—Zn—O compound, an In—Nd—Zn—O compound, an In—Sm—Zn—O compound, an In—Eu—Zn—O compound, an In—Gd—Zn—O compound, an In—Tb—Zn—O compound, an In—Dy—Zn—O compound, an In—Ho—Zn—O compound, an In—Er—Zn—O compound, an In—Tm—Zn—O compound, an In—Yb—Zn—O compound, an In—Lu—Zn—O compound, an In—Zn—O compound, a Sn—Zn—O compound, an Al—Zn—O compound, a Zn—Mg—O compound, a Sn—Mg—O compound, an In—Mg—O compound, an In—Ga—O compound, and the like.

For example, FIG. 24A illustrates a model of a medium group included in a layered structure of an In—Ga—Zn—O compound.

In the medium group included in the layered structure of the In—Ga—Zn—O compound in FIG. 24A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

FIG. 24B illustrates a large group including three medium groups. Note that FIG. 24C illustrates an atomic arrangement in the case where the layered structure in FIG. 24B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O compound, a large group can be formed using not only the medium group illustrated in FIG. 18A but also a medium group in which the arrangement of the In atom, the Ga atom, and the Zn atom is different from that in FIG. 24A.

Specifically, when the large group illustrated in FIG. 24B is repeated, a crystal of an In—Ga—Zn—O compound can be obtained. Note that a layered structure of the obtained crystal of the In—Ga—Zn—O compound can be expressed as a composition formula, $InGaO_3(ZnO)_n$ (n is a natural number).

In the case where n=1 ($InGaZnO_4$), a crystal structure illustrated in FIG. 25A can be obtained, for example Note that in the crystal structure in FIG. 25A, since a Ga atom and an In atom each have five ligands as described in FIG. 22B, a structure in which Ga is replaced with In can be obtained.

In the case where n=2 ($InGaZn_2O_5$), a crystal structure illustrated in FIG. 25B can be obtained, for example Note that in the crystal structure in FIG. 25B, since a Ga atom and an In atom each have five ligands as described in FIG. 22B, a structure in which Ga is replaced with In can be obtained.

Note that it is preferable that the sputtering target contain In, Ga, and Zn.

The sputtering target is formed in the following manner, for example. First, an $InO_X$ raw material, a $GaO_Y$ raw material, and a $ZnO_Z$ raw material are mixed in a predetermined ratio; the mixed material is baked and ground to form an In—Ga—Zn—O compound powder; the compound powder is spread over a mold and molded; baking is performed; pressure treatment is performed; and then a compound film is formed. The compound powder is spread again over the compound film in the mold and molded, baking is performed, and then pressure treatment is performed to make the compound film thicker. A plate-like compound which is the compound film with a thickness larger than or equal to 2 mm and smaller than or equal to 20 mm is formed by performing the steps for increasing the thickness of the compound film n times (n is a natural number), and the plate-like compound is attached to a backing plate, whereby the sputtering target is formed. Note that X, Y, and Z are each a given positive number.

The backing plate is a plate-like member on which the sputtering target is attached. A metal material having high conductivity and a high heat dissipation property, preferably Cu, is used for the backing plate. However, in some cases, the backing plate does not have a sufficient cooling capability even when Cu is used. When the cooling capability is insufficient, the temperature of the top surface of the sputtering target becomes extremely high at the time of sputtering. It is preferable that the sputtering target be cooled efficiently by cooling water that passes through a water channel which is formed in the backing plate so that the backing plate has sufficient cooling capability with sufficient strength. Further, it is important to sufficiently improve the adhesiveness between the backing plate and the sputtering target so as to improve the cooling capability. It is essential that the backing plate and the sputtering target are attached to each other with a metal having sufficiently high thermal conductance and a low melting point (e.g., In), without a space therebetween.

Note that although, in this specification, the sputtering target refers to a material to be sputtered itself, in some cases, a backing plate and a material to be sputtered which is provided over the backing plate are collectively referred to as a sputtering target for simplicity.

When an $InO_X$ raw material, a $GaO_Y$ raw material, and a $ZnO_Z$ raw material are mixed in a predetermined ratio and the mixed material is baked, a polycrystal of an In—Ga—Zn—O compound can be obtained. Note that X, Y, and Z are each a given positive number. The polycrystal contains many crystal structures in a layer form when seen from the direction perpendicular to the c-axis direction. Therefore, the compound powder obtained by grinding the mixed material includes many flat-plate-like crystal particles. When these flat-plate-like crystal particles are spread over the mold and vibration is externally applied at the time of molding, the crystal particles are arranged with flat planes facing upward. After that, the proportion of the crystal structures in a layer form when seen from a direction perpendicular to the c-axis direction, that is, forming superposed layers that can be seen from a direction perpendicular to the c-axis direction, is further increased by spreading and molding the obtained compound powder and then performing baking and pressure treatment. In such a manner, the steps of grinding, molding, baking, and pressure treatment may be repeated, and with such repetition, the proportion of the crystal structures in a layer form when seen from the direction perpendicular to the c-axis direction can be gradually increased.

The In—Ga—Zn—O compound which includes many crystal structures in a layer form when seen from the direction perpendicular to the c-axis direction will be described below.

When a crystal has an equilibrium form, the area of a surface along a plane having a small surface energy becomes large. Also, cleavage of a crystal is likely to occur in a plane having a small surface energy. Calculation results of the surface energy of each plane are described below.

Here, the surface energy refers to an energy obtained by subtracting the energy of a crystal structure from the energy of a surface structure and then dividing the value by a surface area.

First principle calculation software, CASTEP, which is based on the density functional theory was used for the calculation, an ultrasoft type was used for pseudopotential, and the cut-off energy was 400 eV.

FIGS. 40 to 43 each illustrate a crystal structure and a surface structure used for the calculation. Note that in the surface structures in FIGS. 40 to 43, a spatial portion indicates a vacuum. That is, a plane in contact with the spatial portion is a surface. Note that although there are both an upper surface and a lower surface, a lower space is omitted for simplicity.

The surface energy of a surface structure (1) in FIG. 40 is an average value of a surface energy of a (001) plane including In and O and a surface energy of a (001) plane including Ga and O. The surface energy of a surface structure (2) is an average value of a surface energy of a (001) plane including Ga and O and a surface energy of a (001) plane including Zn and O. The surface energy of a surface structure (3) is an average value of a surface energy of a (001) plane including Zn and O and a surface energy of a (001) plane including In and O. The surface energy of the (001) plane including In and O, the surface energy of the (001) plane including Ga and O, and the surface energy of the (001) plane including Zn and O were calculated simultaneously by calculating the obtained surface energies of the surface structure (1), the surface structure (2), and the surface structure (3). In this specification, planes parallel to an a-b plane are described as a (001) plane for simplicity. Note that in some cases, other planes (e.g., a (100) plane and a (10-1) plane) are described in a similar manner.

A surface structure (4) illustrated in FIG. 41 is a (001) plane in which Ga and Zn are mixed, which exists both at an upper surface and a lower surface.

Note that a structure illustrated in FIG. 42 and a structure illustrated in FIG. 43 are a (100) plane and a (10-1) plane, respectively. Note that the (100) plane and the (10-1) plane each include plural kinds of surface energies. Since there are all kinds of elements in the outermost surfaces of the (100) plane and the (10-1) plane, an average value of typical two surface energies was regarded as a surface energy of each plane. In addition, a surface structure (6) and a surface structure (7) illustrate different surfaces and are simply described as a (10-1) plane_a and a (10-1) plane_b, respectively, for simplicity.

The surface energy of the surface structure (1) was 1.54 J/m$^2$.

The surface energy of the surface structure (2) was 1.24 J/m$^2$.

The surface energy of the surface structure (3) was 1.57 J/m$^2$.

When the surface energies of the surface structure (1), the surface structure (2), and the surface structure (3) were simultaneously calculated, the surface energy of the (001) plane including In and O was 1.88 J/m$^2$.

When the surface energies of the surface structure (1), the surface structure (2), and the surface structure (3) were simultaneously calculated, the surface energy of the (001) plane including Ga and O was 1.21 J/m$^2$.

When the surface energies of the surface structure (1), the surface structure (2), and the surface structure (3) were simultaneously calculated, the surface energy of the (001) plane including Zn and O was 1.26 J/m$^2$.

The surface energy of the surface structure (4) was 0.35 J/m$^2$.

The surface energy of the surface structure (5) was 1.64 J/m$^2$.

The surface energy of the surface structure (6) was 1.72 J/m$^2$.

The surface energy of the surface structure (7) was 1.79 J/m$^2$.

The above calculation results show that the surface energy of the surface structure (4) is the smallest. That is, the surface energy of the surface structure which is perpendicular to the c-axis direction is the smallest.

Therefore, the crystal of the In—Ga—Zn—O compound has high proportion of surface structures which are perpendicular to the c-axis direction.

Here, the predetermined ratio of the InO$_X$ raw material, the GaO$_Y$ raw material, and the ZnO$_Z$ raw material is 2:2:1, 8:4:3, 3:1:1, 1:1:1, 4:2:3, or 3:1:2 in a molar ratio.

Note that the raw materials and a mixture ratio thereof can be changed as appropriate depending on a sputtering target to be formed.

Note that before the plate-like compound is attached to the backing plate, heat treatment may be performed on the plate-like compound at a temperature higher than or equal to 1000° C. and lower than or equal to 1500° C.

A highly reliable transistor can be obtained by depositing an oxide semiconductor film by using the sputtering target formed in the above manner.

A sputtering target including an oxide semiconductor having a crystal region in which the direction of the c-axis is parallel to a normal vector of the top surface of the oxide semiconductor can be provided.

With the use of the sputtering target, an oxide semiconductor film having a crystal region in which the direction of the c-axis is parallel to a normal vector of the top surface of the oxide semiconductor film can be deposited, and a highly reliable transistor can be obtained by using the oxide semiconductor film.

BEST MODE FOR CARRYING OUT THE INVENTION

Figure 1:
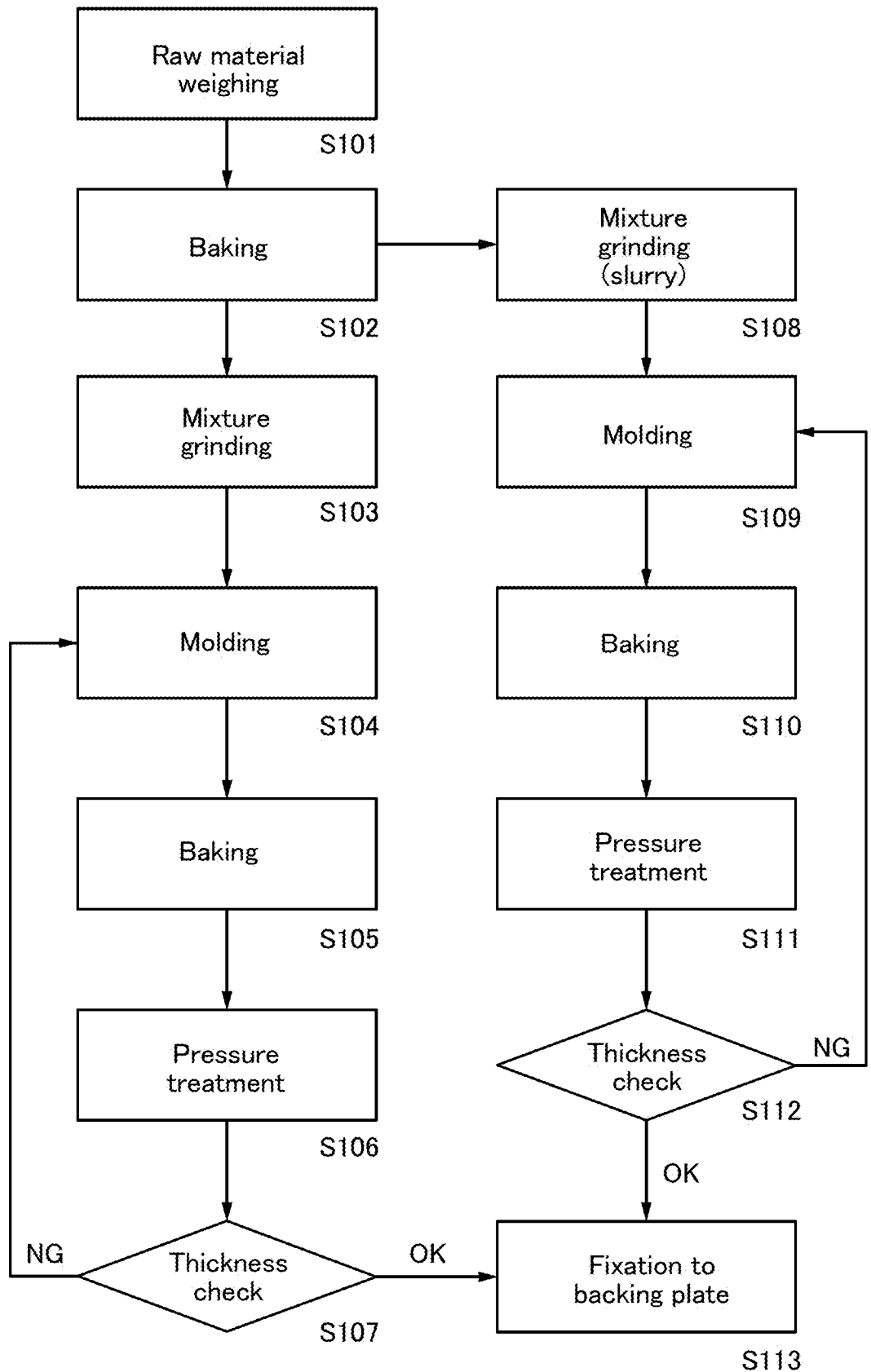
FIG. 1 is a flow chart illustrating an example of a method for manufacturing a sputtering target.

Hereinafter, embodiments of the present invention will be described in detail with reference to the accompanying drawings. However, the present invention is not limited to the description below, and it is easily understood by those skilled in the art that modes and details thereof can be modified in various ways. Therefore, the present invention is not construed as being limited to description of the embodiments. In describing structures of the present invention with reference to the drawings, the same reference numerals are used in common for the same portions in different drawings. Note that the same hatch pattern is applied to similar parts, and the similar parts are not especially denoted by reference numerals in some cases.

Note that the ordinal numbers such as "first" and "second" in this specification are used for convenience and do not denote the order of steps or the stacking order of layers. In addition, the ordinal numbers in this specification do not denote particular names which specify the present invention.

Embodiment 1

In this embodiment, a method for manufacturing a sputtering target including an oxide semiconductor having a crystal region in which the direction of the c-axis is parallel to a normal vector of the top surface of the oxide semiconductor will be described.

Initially, the method for manufacturing a sputtering target including an oxide semiconductor having a crystal region in which the direction of the c-axis is parallel to a normal vector of the top surface of the oxide semiconductor will be described with reference to FIG. 1, FIGS. 2A to 2E, FIGS. 3A to 3D, and FIGS. 4A and 4B.

First, a raw material is weighed (step S101).

Here, an $InO_X$ raw material, a $GaO_Y$ raw material, and a $ZnO_Z$ raw material are prepared as raw material of the sputtering target. Note that X, Y, and Z are each a given positive number; for example, X, Y, and Z are 1.5, 1.5, and 1, respectively. It is needless to say that the above raw materials are an example, and raw materials can be selected as appropriate in order to obtain a desired compound. For example, a $MO_Y$ raw material may be used instead of the $GaO_Y$ raw material. Note that Sn, Hf, or Al can be used as M Alternatively, the following lanthanoid may be used as M: La, Ce, Pr, Nd, Sm, Eu, Gd, Tb, Dy, Ho, Er, Tm, Yb, or Lu. Although the case where three kinds of raw materials are used is shown as an example in this embodiment, one embodiment of the present invention is not limited thereto. For example, this embodiment may be applied to the case where four or more kinds of raw materials are used or the case where one or two kinds of raw materials are used.

Next, the $InO_X$ raw material, the $GaO_Y$ raw material, and the $ZnO_Z$ raw material are mixed in a predetermined ratio.

For example, the predetermined ratio of the $InO_X$ raw material, the $GaO_Y$ raw material, and the $ZnO_Z$ raw material is 2:2:1, 8:4:3, 3:1:1, 1:1:1, 4:2:3, 1:1:2, 3:1:4, or 3:1:2 in a molar ratio. With the use of a mixed material having such a ratio, a sputtering target including an oxide semiconductor having a crystal region in which the direction of the c-axis is parallel to a normal vector of the top surface of the oxide semiconductor can be easily obtained. Note that also in the case where the $MO_Y$ raw material is used instead of the $GaO_Y$ raw material, the ratio of the $InO_X$ raw material, the $MO_Y$ raw material, and the $ZnO_Z$ raw material is 2:2:1, 8:4:3, 3:1:1, 1:1:1, 4:2:3, 1:1:2, 3:1:4, or 3:1:2 in a molar ratio.

An In—Ga—Zn—O compound is obtained by performing first baking on the mixed material of the $InO_X$ raw material, the $GaO_Y$ raw material, and the $ZnO_Z$ raw material that are mixed in a predetermined ratio (step S102).

Next, a compound powder 5002 is obtained by grinding the compound (step S103).

The In—Ga—Zn—O compound includes many crystal structures in a layer form when seen from the direction perpendicular to the c-axis direction. Therefore, the obtained compound powder 5002 includes many flat-plate-like crystal particles.

The first baking is performed in an inert atmosphere, an oxidation atmosphere, or a reduced-pressure atmosphere at a temperature higher than or equal to 400° C. and lower than or equal to 1700° C., preferably higher than or equal to 900° C. and lower than or equal to 1500° C. The first baking is performed for longer than or equal to 3 minutes and shorter than or equal to 24 hours, preferably longer than or equal to 30 minutes and shorter than or equal to 17 hours, more preferably longer than or equal to 30 minutes and shorter than or equal to 5 hours, for example. When the first baking is performed under the above conditions, secondary reactions other than the main reaction can be suppressed, the impurity concentration in the compound powder 5002 is reduced, and a sputtering target including an oxide semiconductor having a crystal region in which the direction of the c-axis is parallel to a normal vector of the top surface of the oxide semiconductor can be easily obtained.

The first baking may be performed plural times at different temperatures and/or in different atmospheres. For example, the mixed material may be first held at a first temperature in a first atmosphere and then at a second temperature in a second atmosphere.

Specifically, it is preferable that the first atmosphere be an inert atmosphere or a reduced-pressure atmosphere and the second atmosphere be an oxidation atmosphere. This is because oxygen vacancies are generated in the compound when impurities contained in the mixed material are reduced in the first atmosphere and thus it is preferable that oxygen vacancies in the obtained compound be reduced in the second atmosphere. Although described after, in an oxide semiconductor, impurities such as hydrogen and oxygen vacancies cause generation of carriers, which results in deteriorated electric characteristics and reduced reliability of a transistor including the oxide semiconductor. Thus, in order to reduce the impurities and oxygen vacancies in the oxide semiconductor, it is preferable to reduce the impurities and oxygen vacancies in the sputtering target itself.

Figure 2A:
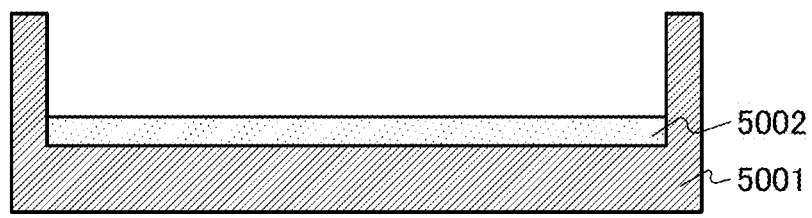
FIGS. 2A to 2E illustrate an example of a method for manufacturing a sputtering target.
Figure 2B:
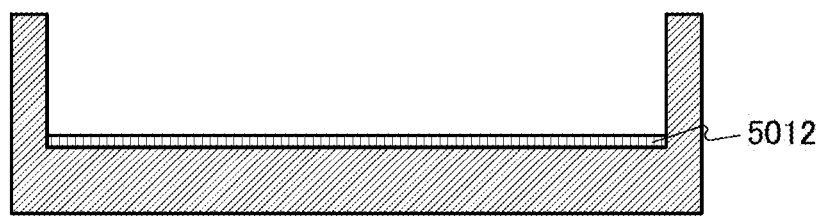

Next, as illustrated in FIG. 2A, the compound powder 5002 is spread over a mold 5001 and molded (step S104). Molding refers to spreading the compound powder over a mold uniformly. For example, the compound powder is introduced to the mold, and then vibration is externally applied so that the compound powder is molded. Alternatively, the compound powder is introduced to the mold, and then molding is performed using a roller or the like so as to obtain a uniform thickness.

When the compound powder 5002 including many flat-plate-like crystal particles is spread over the mold 5001 and molded, the crystal particles are arranged with the flat planes facing upward. Therefore, the proportion of the crystal structures in a layer form when seen from the direction perpendicular to the c-axis direction can be further increased by spreading and molding the obtained compound powder.

The mold 5001 may be formed of a metal or an oxide and the upper shape thereof is rectangular or rounded.

Next, second baking is performed on the compound powder 5002 (step S105). After that, first pressure treatment is performed on the compound powder 5002 which has been subjected to the second baking (step S106), whereby a compound film 5012 is obtained (see FIG. 2B). The second baking is performed under conditions similar to those of the first baking. The crystallinity of the compound can be enhanced by performing the second baking.

Note that the first pressure treatment may be performed in any manner as long as the compound powder 5002 can be pressed. For example, a weight which is formed of the same kind of material as the mold 5001 can be used. Alternatively, the compound powder 5002 may be pressed under high pressure using compressed air. Besides, the first pressure treatment can be performed using a known technique. Note that the first pressure treatment may be performed at the same time as the second baking.

Planarization treatment may be performed after the first pressure treatment. As the planarization treatment, chemical mechanical polishing (CMP) treatment or the like can be employed.

The compound film 5012 obtained in such a manner has a high proportion of crystal regions in which the direction of the c-axis is parallel to a normal vector of the top surface of the compound film 5012.

Next, the thickness of the obtained compound film 5012 is checked (step S107). As it will be explained later, when the compound film 5012 has a desired thickness (when a plate-like compound 5032 is obtained), the manufacturing method proceeds to a step S113 and the plate-like compound 5032 is attached to a backing plate 5003. Note that for the backing plate, a metal material having high conductivity and a high heat dissipation property (for example, Cu) is used. It is preferable that the sputtering target be cooled by cooling water that passes through a water channel which is formed in the backing plate. Further, in order to improve the adhesiveness between the backing plate and the sputtering target, the backing plate and the sputtering target are attached to each other without a space between with a metal which has sufficiently high thermal conductance and a low melting point (e.g., In).

Figure 2C:
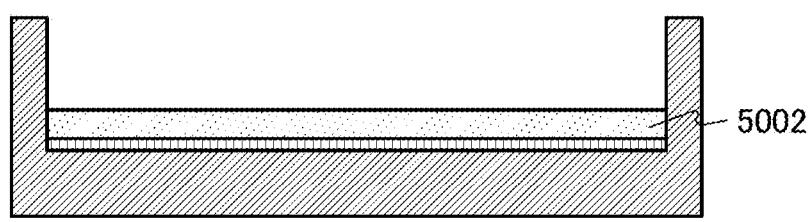
Figure 2D:
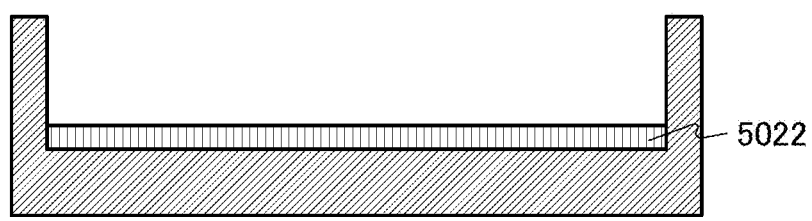

When it is determined during the step 107 that the thickness of the compound film 5012 is smaller than a desired thickness, the compound powder 5002 is spread over the compound film 5012 and molded as illustrated in FIG. 2C (step S104).

Next, third baking is performed on the compound powder 5002 and the compound film 5012, including the mold 5001 (step S105). After that, second pressure treatment is performed on the compound powder 5002 and the compound film 5012 which have been subjected to the third baking (step S106), whereby a compound film 5022 is obtained with a thickness larger than the thickness of the compound film 5012 (see FIG. 2D). The compound film 5022 is obtained through crystal growth of the compound film 5012 serving as a seed crystal; therefore, the compound film 5022 has a high proportion of crystal regions in which the direction of the c-axis is parallel to a normal vector of the top surface of the compound film 5022.

The crystallinity of the compound powder and the compound film can be enhanced by performing the third baking. The third baking is performed under conditions similar to those of the first baking.

The second pressure treatment is performed under conditions similar to those of the first pressure treatment. Through the second pressure treatment, crystal alignment in the obtained compound film 5022 is gradually improved compared to that in the compound film 5012. That is, the compound film 5022 has a much higher proportion of crystal regions in which the direction of the c-axis is parallel to a normal vector of the top surface of the compound film 5022. This is because flat-plate-like crystal particles are arranged with the flat planes facing upward by the second pressure treatment. Note that the second pressure treatment may be performed at the same time as the third baking.

Again, the thickness of the obtained compound film 5022 is checked (step S107).

As described above, the thickness of the compound film can be gradually increased while the crystal alignment is improved.

Figure 2E:
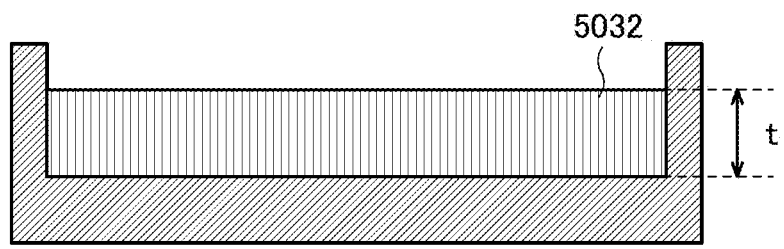

By repeating these steps of increasing the thickness of a compound film n times (n is a natural number), the plate-like compound 5032 having a desired thickness (t), for example, larger than or equal to 2 mm and smaller than or equal to 20 mm, preferably larger than or equal to 3 mm and smaller than or equal to 20 mm can be obtained (see FIG. 2E).

After that, planarization treatment may be performed.

Figure 4A:
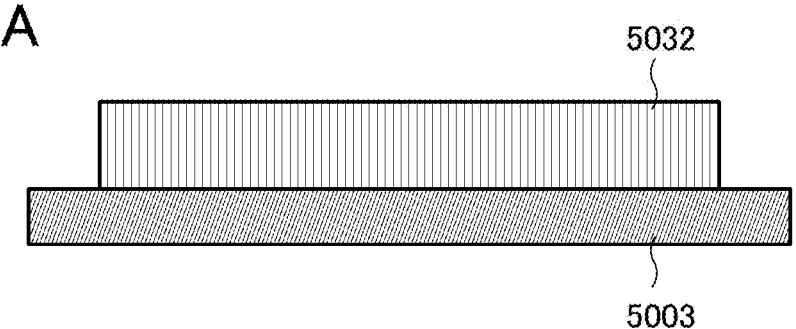
FIGS. 4A and 4B illustrate an example of a method for manufacturing a sputtering target.

Next, the plate-like compound 5032 obtained is attached to the backing plate 5003 as illustrated in FIG. 4A (step S113). Note that a material having a low melting point, such as In, may be provided as an adhesive on the surface of the backing plate 5003. In the above manner, the sputtering target including an oxide semiconductor having a crystal region in which the direction of the c-axis is parallel to a normal vector of the top surface of the oxide semiconductor can be formed.

Figure 4B:
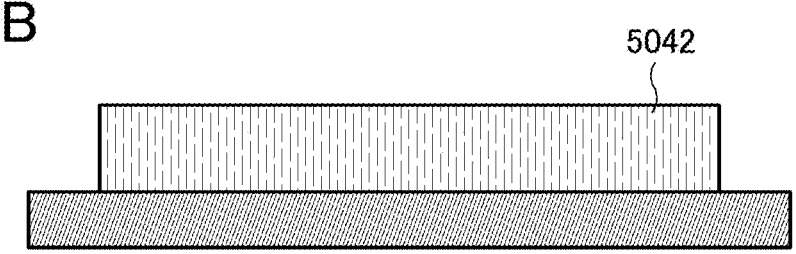

Alternatively, fourth baking is performed on the obtained plate-like compound 5032 to obtain a plate-like compound 5042, and the obtained plate-like compound 5042 is attached to the backing plate 5003 (see FIG. 4B). Note that In may be provided as an adhesive on the surface of the backing plate 5003. The fourth baking is performed under conditions similar to those of the first baking. In the above manner, the sputtering target including an oxide semiconductor having a crystal region in which the direction of the c-axis is parallel to a normal vector of the top surface of the oxide semiconductor can be formed.

In a similar manner, a method for manufacturing a plate-like compound 5132 similar to the plate-like compound 5032 through steps different from the steps S101 to S107 will be described with reference to FIG. 1 and FIGS. 3A to 3D.

Note that the steps up to the step S102 are the same; therefore, the description is omitted.

The compound obtained in the step S102 is ground to obtain the compound powder.

After that, the compound powder is mixed with water, a dispersant, and a binder to obtain slurry (step S108).

Figure 3A:
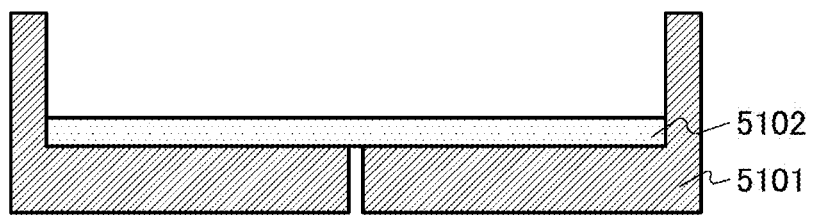
FIGS. 3A to 3D illustrate an example of a method for manufacturing a sputtering target.

Next, slurry 5102 is poured into a mold 5101 covered with a filter permeating moisture (see FIG. 3A). The mold 5101, which is made of a material similar to, for example, that of the mold 5001, can be provided with one or plural minute holes at the bottom. With the plural minute holes, the slurry can be dried rapidly.

After that, suction is applied through the filter and the one or the plural minute holes at the bottom of the mold 5101 into which the slurry 5102 is poured (step S109). By performing suction and molding, crystal particles including many flat-plate-like crystal particles are arranged with the flat planes facing upward.

Next, the obtained molded body is dried and the binder is removed. The drying is preferably natural drying because the molded body is less likely to be cracked. After drying, the molded body is subjected to heat treatment at a temperature higher than or equal to 300° C. and lower than or equal to 700° C., so that residual moisture which cannot be taken out by natural drying, and the binder are removed.

Next, the dried molded body is baked (step S110). The baking is performed under conditions similar to those of the second baking (step S105).

Figure 3B:
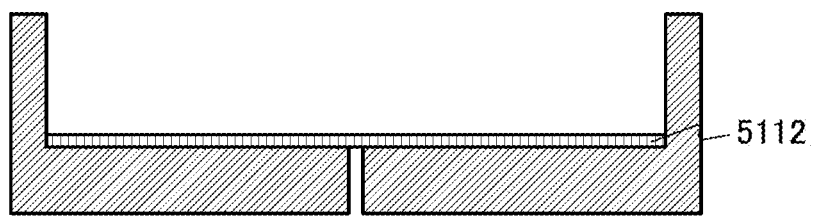
Figure 3C:
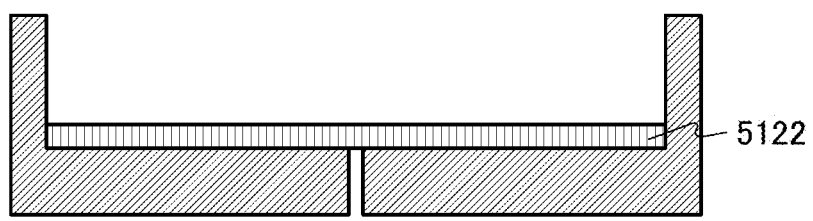

Next, as illustrated in FIG. 3B, pressure treatment is performed on the baked molded body, whereby a compound film 5112 is obtained (step S111). The obtained compound film 5112 has a high proportion of crystal regions in which the direction of the c-axis is parallel to a normal vector of the top surface of the compound film 5112. The pressure treatment is performed under conditions similar to those of the first pressure treatment (step S106).

After that, planarization treatment may be performed.

Next, the thickness of the obtained compound film 5112 is checked (step S112). When the compound film 5112 has a desired thickness (when the plate-like compound 5132 is obtained), the manufacturing method proceeds to the step S113 and the plate-like compound 5132 is attached to the backing plate 5003. The description of the case where the thickness of the compound film 5112 is smaller than a desired thickness will be given below.

When the thickness of the compound film 5112 here is smaller than a desired thickness, the step S109 is repeated. Then, the molded body which is obtained in the step S109 is overlapped with the compound film 5112 and is subjected to baking (step S110) and pressure treatment (step S111) again, whereby a compound film 5122 with a thickness larger than the thickness of the compound film 5112 can be obtained (see FIG. 3C). The baking is performed under conditions similar to those of the third baking. The pressure treatment is performed under conditions similar to those of the second pressure treatment.

Figure 3D:
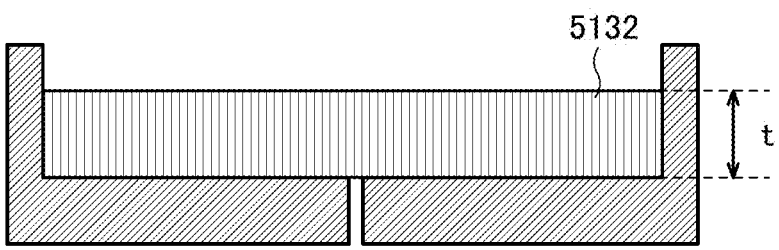

By repeating the above steps, the plate-like compound 5132 having a desired thickness can be obtained (see FIG. 3D).

After that, planarization treatment may be performed.

In addition, baking similar to the fourth baking may be performed on the obtained plate-like compound 5132.

The obtained plate-like compound 5132 is attached to the backing plate 5003 (step S113).

Here, a crystal state of a compound (sample A) which was obtained in the following manner is shown. An $In_2O_3$ raw material, a $Ga_2O_3$ raw material, and a ZnO raw material were mixed and ground to obtain slurry; the slurry object was molded, dried, and degreased; and then baking was performed at 1400° C. in an oxygen atmosphere.

Figure 5A:
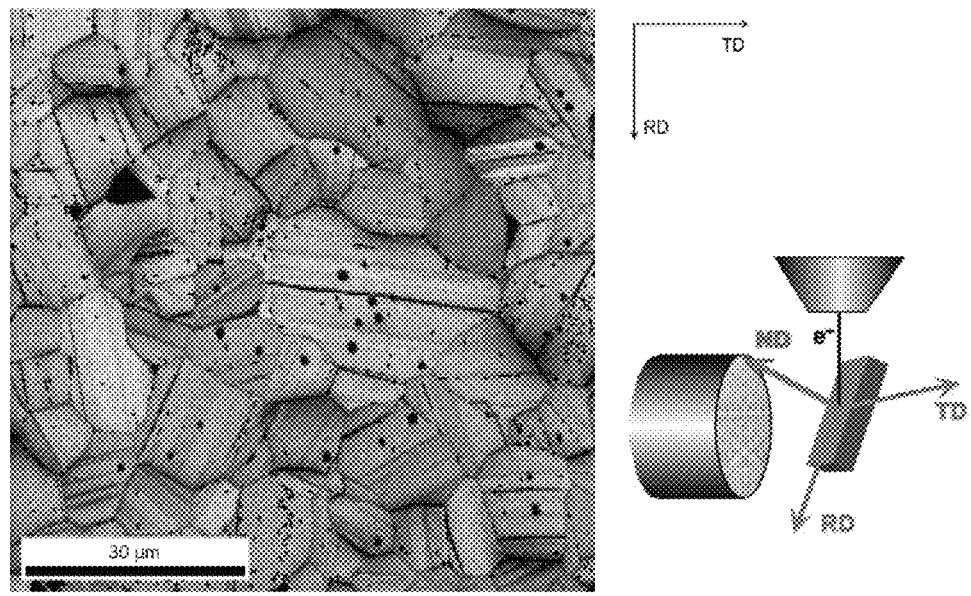
FIGS. 5A and 5B are images of a sample A by EBSD.
Figure 5B:
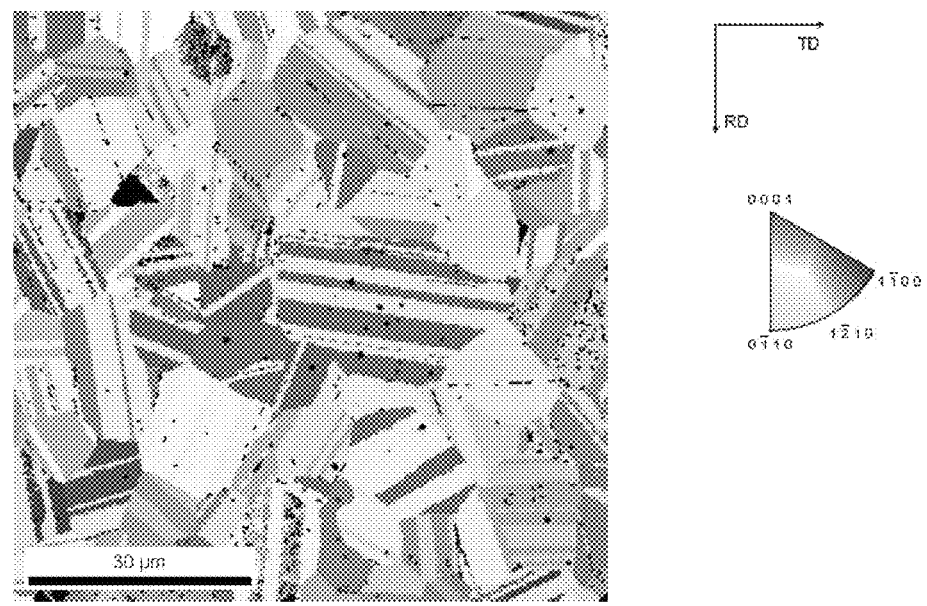

A surface crystal state of the sample A was evaluated by electron backscatter diffraction (EBSD) pattern. FIG. 5A shows an image quality map, and FIG. 5B shows an inverse pole figure color map.

The following points of the sample A were found by EBSD: the sample A was polycrystal; although not shown, each crystal particle was able to be mapped with a pattern of $InGaZnO_4$ diffracted electron beams (Kikuchi lines) by orientation analysis; and the sample A included no crystal particle of the $In_2O_3$ raw material, the $Ga_2O_3$ raw material, and the ZnO raw material.

Next, the sample A was subjected to X-ray diffraction (XRD) and the crystal state was evaluated. An X-ray diffractometer ATX-G manufactured by Rigaku Corporation was used for the XRD. The conditions of the XRD were as follows: scanning was performed by out-of-plane method at $2\theta/\omega$, the scanning range was set to 5 deg. to 100 deg., the step width was set to 0.02 deg., and the scanning speed was set to 3.0 deg./min.

Figure 6:
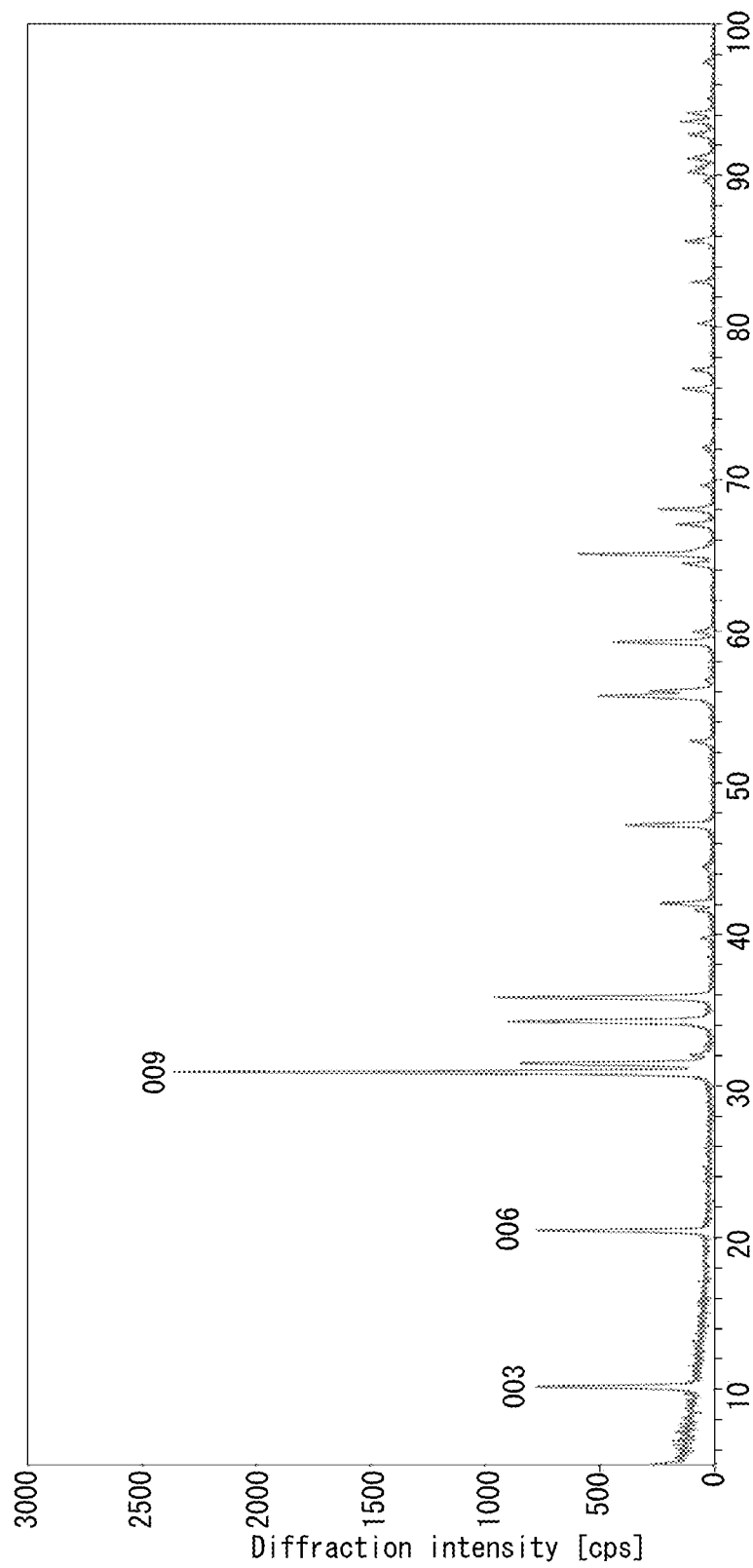
FIG. 6 is a graph showing an XRD spectrum of a sample A.

According to FIG. 6, the sample A is a crystal of $InGaZnO_4$, which has a peak with the highest intensity ratio in a (009) plane. This shows that the compound which is the sample A has a high proportion of crystal regions in which the direction of the c-axis is parallel to a normal vector of the top surface of the compound.

It is thus indicated that, in the compound shown in this embodiment, the rate of c-axis alignment is gradually increased by repeating grinding, molding, baking, and pressure treatment.

Note that the sputtering target formed in such a manner can have high density. When the density of the sputtering target is increased, the density of a film to be deposited can also be increased. Specifically, the relative density of the sputtering target can be set to be higher than or equal to 90%, preferably higher than or equal to 95%, more preferably higher than or equal to 99%.

By the above method, a sputtering target including a high-density oxide semiconductor having a crystal region in which the direction of the c-axis is parallel to a normal vector of the top surface of the oxide semiconductor can be obtained.

Embodiment 2

In this embodiment, a deposition apparatus for depositing an oxide semiconductor film having a crystal region in which the direction of the c-axis is parallel to a normal vector of the top surface of the oxide semiconductor film will be described.

First, a structure of a deposition apparatus which allows the entry of few impurities at the time of deposition will be described with reference to FIGS. 7A and 7B.

Figure 7A:
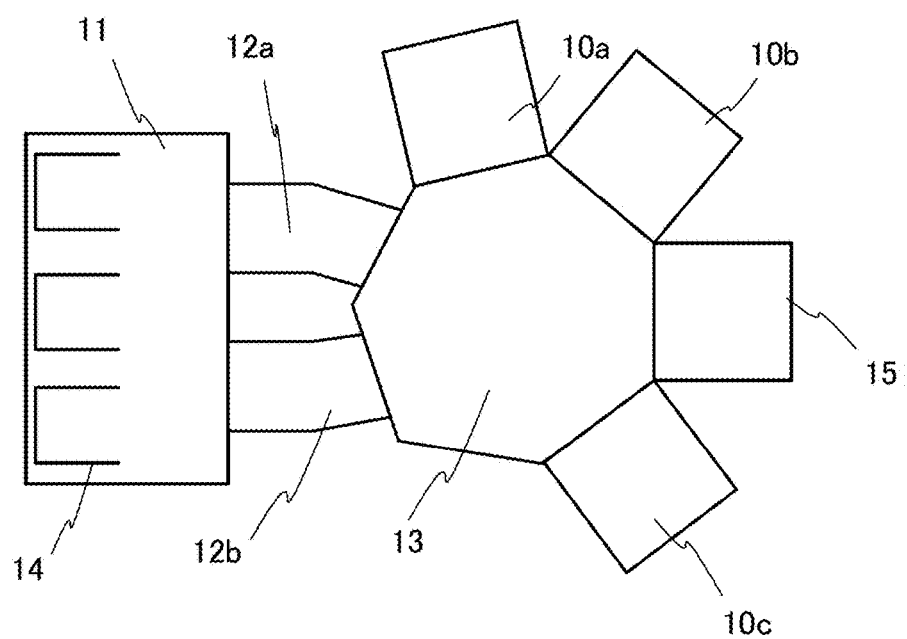
FIGS. 7A and 7B are top views which illustrate an example of a deposition apparatus.

FIG. 7A illustrates a multi-chamber deposition apparatus. The deposition apparatus includes a substrate supply chamber 11 provided with three cassette ports 14 for holding substrates, load lock chambers 12a and 12b, a transfer chamber 13, a substrate heating chamber 15, and deposition chambers 10a, 10b, and 10c. The substrate supply chamber 11 is connected to the load lock chambers 12a and 12b. The load lock chambers 12a and 12b are connected to the transfer chamber 13. The substrate heating chamber 15 and the deposition chambers 10a, 10b, and 10c are each connected only to the transfer chamber 13. A gate valve is provided for a connecting portion between chambers so that each chamber can be independently kept under vacuum. Although not illustrated, the transfer chamber 13 has one or more substrate transfer robots. Here, it is preferable that the substrate heating chamber 15 also serve as a plasma treatment chamber. With a single wafer multi-chamber deposition apparatus, it is possible to transfer a substrate without exposure to the air between treatment and treatment, and adsorption of impurities to a substrate can be suppressed. In addition, the order of deposition, heat treatment, or the like can be freely determined. Note that the number of the deposition chambers, the number of the load lock chambers, and the number of the substrate heating chambers are not limited to the above, and can be determined as appropriate depending on the space for placement or the process.

Evacuation of the inside of the deposition chamber (sputtering chamber) illustrated in FIG. 7A will be described with reference to FIG. 8. A deposition chamber 10 includes a sputtering target 32 and a target holder 34 for holding a sputtering target.

Figure 8:
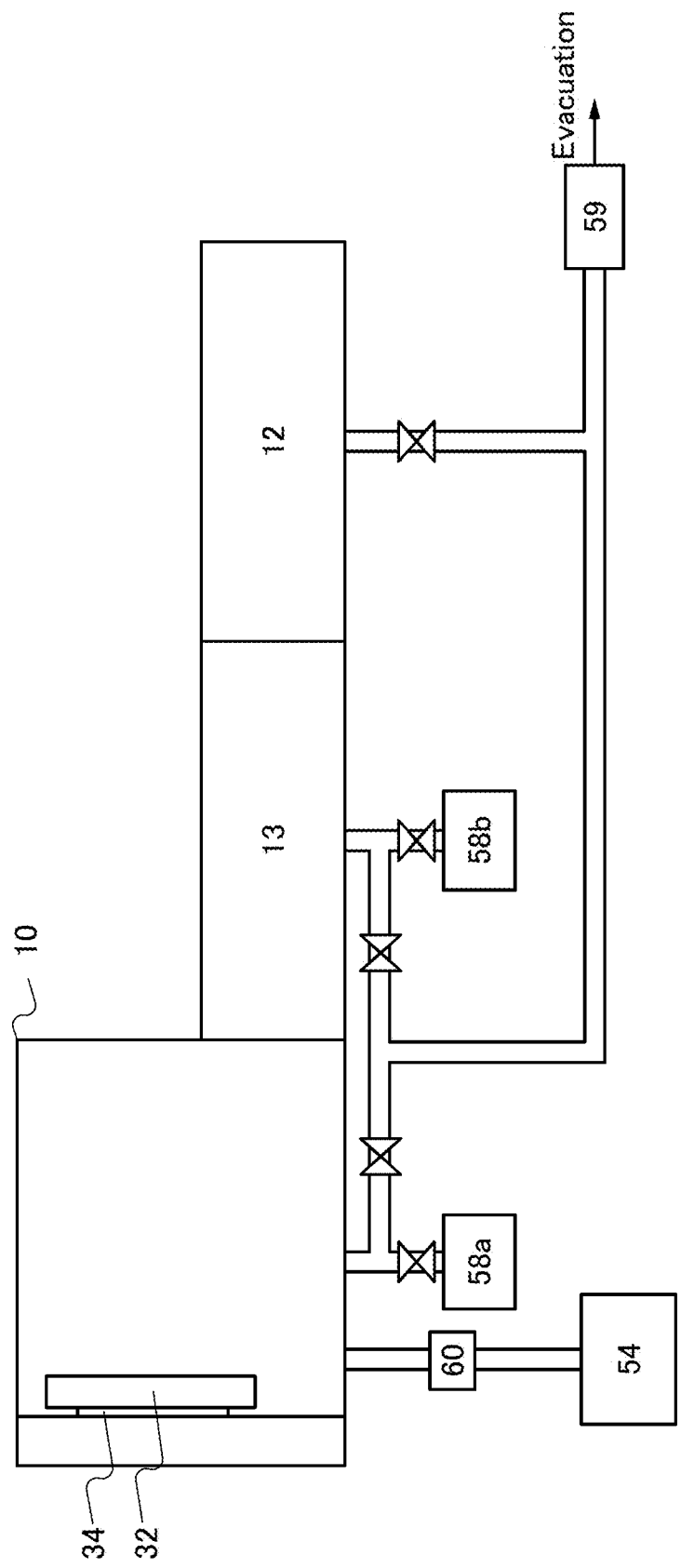
FIG. 8 illustrates an example of a deposition chamber.

The deposition chamber 10 illustrated in FIG. 8 is connected to the transfer chamber 13 through a gate valve, and the transfer chamber 13 is connected to a load lock chamber 12 through a gate valve.

The deposition chamber 10 in FIG. 8 is connected to a refiner 54 through a mass flow controller 60. Note that although refiners 54 and mass flow controllers 60 can be provided for each of a plurality of kinds of gases, only one refiner 54 and one mass flow controller 60 are provided for simplicity, and the others are omitted.

The deposition chamber 10 in FIG. 8 is connected to a cryopump 58a through a valve.

The transfer chamber 13 in FIG. 8 is connected to a cryopump 58b through a valve.

The load lock chamber 12 in FIG. 8 is connected to a vacuum pump 59 through a valve.

Note that the vacuum pump 59 can be a pump in which a dry pump and a mechanical booster pump are connected in series. In this case, the mechanical booster pump of the vacuum pump 59 is connected to the deposition chamber 10 and the transfer chamber 13 each through a valve. With such a structure, evacuation can be performed using the vacuum pump 59 when the pressure inside the deposition chamber 10 is in the range of atmospheric pressure to low vacuum (about 0.1 Pa to 10 Pa) and then evacuation can be performed using the cryopump 58a or 58b when the pressure inside the deposition chamber 10 is in the range of low vacuum to high vacuum ($1\times10^{-4}$ Pa to $1\times10^{-7}$ Pa) by switching the valve.

In a similar manner, an evacuation example of the deposition chamber in FIG. 7A will be described with reference to FIG. 9.

Figure 9:
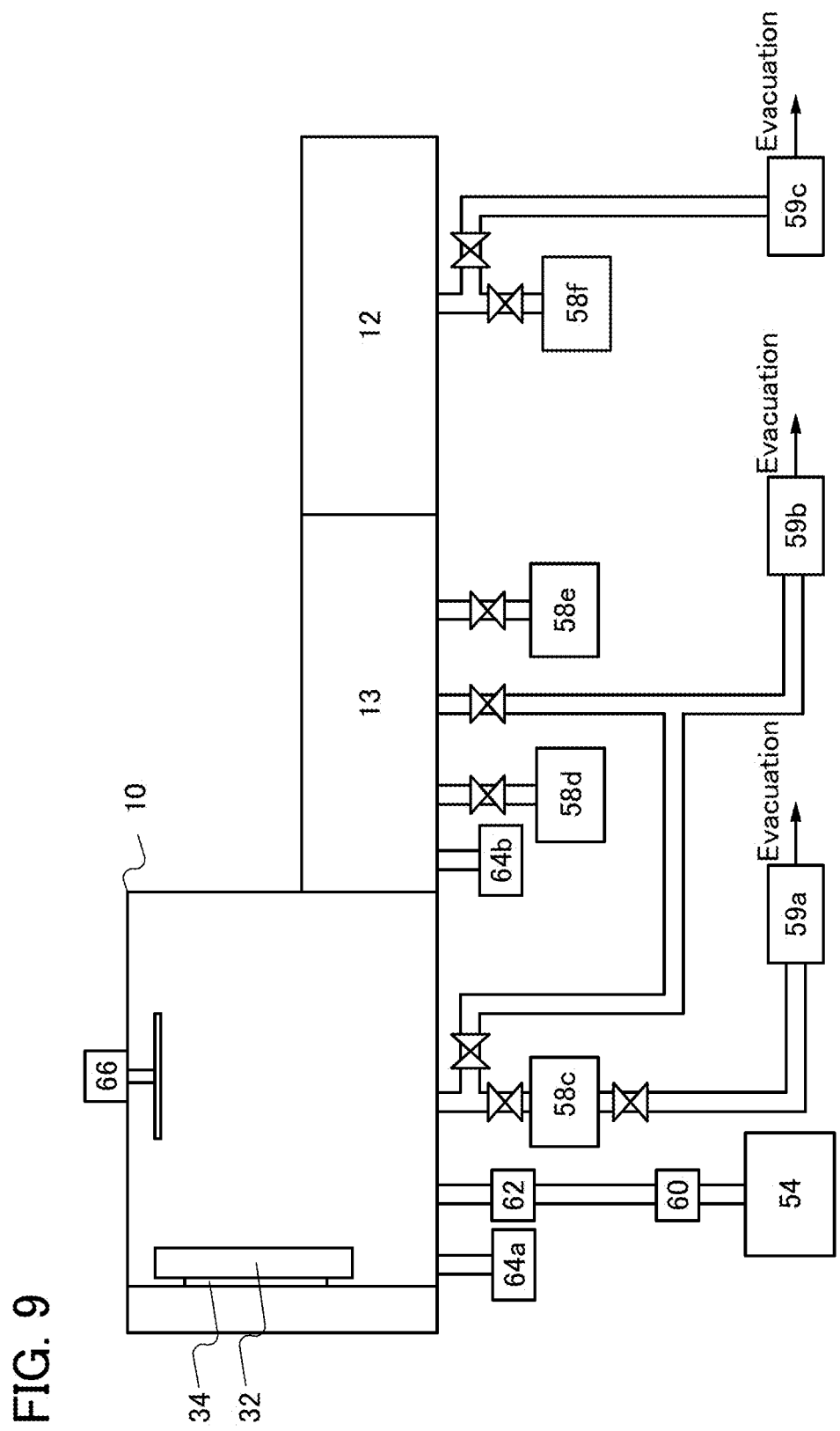
FIG. 9 illustrates an example of a deposition chamber.

The deposition chamber 10 illustrated in FIG. 9 is connected to the transfer chamber 13 through a gate valve, and the transfer chamber 13 is connected to the load lock chamber 12 through a gate valve.

The deposition chamber 10 in FIG. 9 is connected to the mass flow controller 60 through a gas heating system 62, and the gas heating system 62 is connected to the refiner 54 through the mass flow controller 60. With the gas heating system 62, a gas to be introduced to the deposition chamber 10 can be heated to a temperature higher than or equal to 40° C. and lower than or equal to 400° C., preferably higher than or equal to 50° C. and lower than or equal to 200° C. Note that although gas heating systems 62, refiners 54, and mass flow controllers 60 can be provided for each of a plurality of kinds of gases, only one gas heating system 62, one refiner 54, and one mass flow controller 60 are provided for simplicity and the others are omitted.

The deposition chamber 10 in FIG. 9 is connected to a turbo molecular pump 58c through a valve. Note that as a donkey pump, a vacuum pump 59a is provided to the turbo molecular pump 58c through a valve. The vacuum pump 59a can have a structure similar to that of the vacuum pump 59.

In addition, the deposition chamber 10 in FIG. 9 is provided with a cryotrap 66.

It is known that the turbo molecular pump 58c is capable of stably evacuating a large-sized molecule, needs low frequency of maintenance, and thus enables high productivity, whereas it has a low capability in evacuating hydrogen and water. Hence, the cryotrap 66 having a high capability in evacuating a molecule having a relatively high melting point, such as water, is connected to the deposition chamber 10. The temperature of a refrigerator of the cryotrap 66 is set to be lower than or equal to 100 K, preferably lower than or equal to 80 K. In the case where the cryotrap 66 includes a plurality of refrigerators, it is preferable to set the temperature of each refrigerator at a different temperature because efficient evacuation is possible. For example, the temperatures of a first-stage refrigerator and a second-stage refrigerator may be set at lower than or equal to 100 K and lower than or equal to 20 K, respectively.

The transfer chamber 13 in FIG. 9 is connected to cryopumps 58d and 58e each through a valve. In the case of one cryopump, evacuation cannot be performed while the cryopump is in regeneration; however, in the case of two or more cryopumps which are connected in parallel, even when one of the cryopumps is in regeneration, evacuation can be performed using any of the other cryopumps. Note that regeneration of a cryopump refers to treatment for discharging molecules entrapped in the cryopump. When molecules are entrapped too much in a cryopump, the evacuation capability of the cryopump is lowered; therefore, regeneration is performed regularly.

The load lock chamber 12 in FIG. 9 is connected to a cryopump 58f and a vacuum pump 59c each through a valve.

A vacuum pump 59b is connected to the deposition chamber 10 and the transfer chamber 13 each through a valve. Note that the vacuum pump 59b can have a structure similar to that of the vacuum pump 59.

In a similar manner, an evacuation example of the substrate heating chamber in FIG. 7A will be described with reference to FIG. 10.

Figure 10:
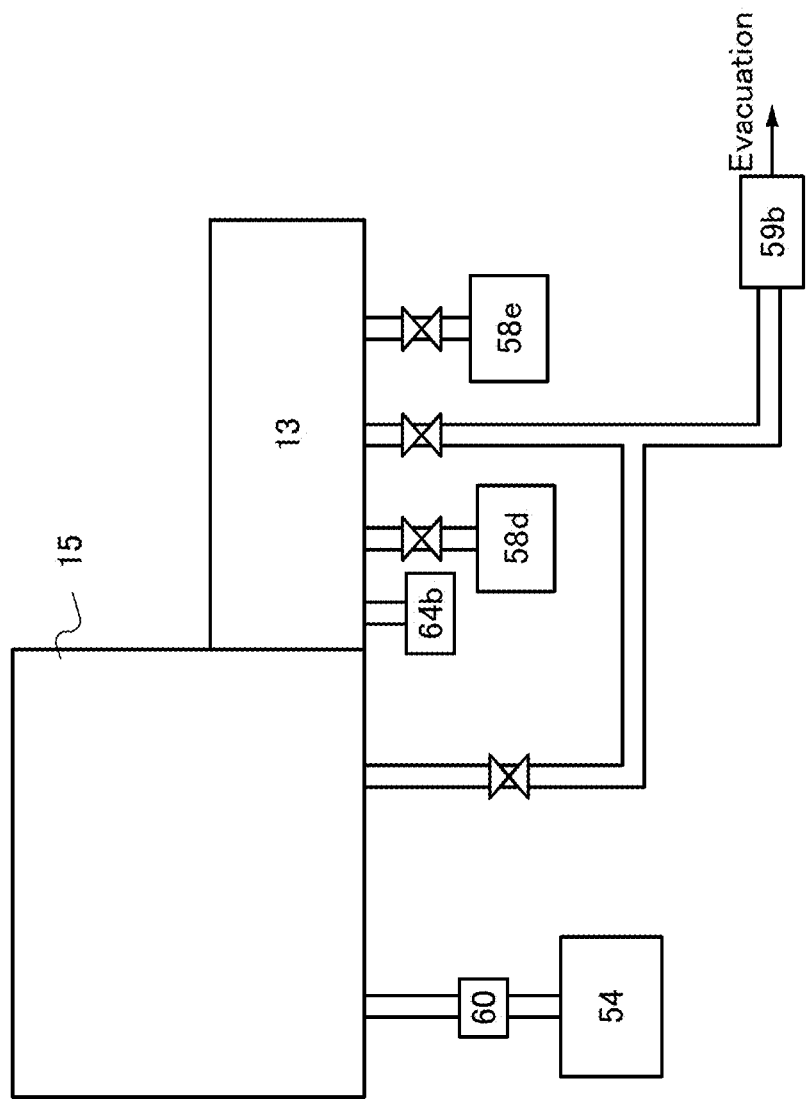
FIG. 10 illustrates an example of a heat treatment chamber.

The substrate heating chamber 15 illustrated in FIG. 10 is connected to the transfer chamber 13 through a gate valve. Note that the transfer chamber 13, which is connected to the load lock chamber 12 through a gate valve, is omitted from the drawing. In addition, the inside of the load lock chamber 12 is evacuated in a manner similar to that in FIG. 9.

The substrate heating chamber 15 in FIG. 10 is connected to the refiner 54 through the mass flow controller 60. Note that although refiners 54 and mass flow controllers 60 can be provided as much as the number of kinds of gases, only one refiner 54 and one mass flow controller 60 are provided for simplicity and the others are omitted.

The substrate heating chamber 15 in FIG. 10 is connected to the vacuum pump 59b through a valve.

The substrate heating chamber 15 may be provided with a stage on which a plurality of substrates can be set. In the substrate heating chamber 15, for example, a resistance heater or the like may be used for heating. Alternatively, heat conduction or heat radiation from a medium such as a heated gas may be used for heating. For example, a rapid thermal annealing (RTA) apparatus such as a gas rapid thermal annealing (GRTA) apparatus or a lamp rapid thermal annealing (LRTA) apparatus can be used. The LRTA apparatus is an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. In the GRTA apparatus, heat treatment is performed using a high-temperature gas. An inert gas is used as the gas.

Note that the back pressure of each of the deposition chamber 10 and the substrate heating chamber 15 is less than or equal to $1 \times 10^{-4}$ Pa, preferably less than or equal to $3 \times 10^{-5}$ Pa, more preferably less than or equal to $1 \times 10^{-4}$ Pa.

In each of the deposition chamber 10 and the substrate heating chamber 15, the partial pressure of a gas molecule having a mass-to-charge ratio (m/z) of 18 is less than or equal to $3 \times 10^{-5}$ Pa, preferably less than or equal to $1 \times 10^{-4}$ Pa, more preferably less than or equal to $3 \times 10^{-6}$ Pa.

In each of the deposition chamber 10 and the substrate heating chamber 15, the partial pressure of a gas molecule having a mass-to-charge ratio (m/z) of 28 is less than or equal to $3 \times 10^{-5}$ Pa, preferably less than or equal to $1 \times 10^{-5}$ Pa, more preferably less than or equal to $3 \times 10^{-6}$ Pa.

In each of the deposition chamber 10 and the substrate heating chamber 15, the partial pressure of a gas molecule having a mass-to-charge ratio (m/z) of 44 is less than or equal to $3 \times 10^{-5}$ Pa, preferably less than or equal to $1 \times 10^{-5}$ Pa, more preferably less than or equal to $3 \times 10^{-6}$ Pa.

Further, in each of the deposition chamber 10 and the substrate heating chamber 15, the leakage rate is less than or equal to $3 \times 10^{-6}$ Pa·m³/s, preferably less than or equal to $1 \times 10^{-6}$ Pa·m³/s.

In each of the deposition chamber 10 and the substrate heating chamber 15, the leakage rate of a gas molecule having a mass-to-charge ratio (m/z) of 18 is less than or equal to $1 \times 10^{-7}$ Pa·m³/s, preferably less than or equal to $3 \times 10^{-8}$ Pa·m³/s.

In each of the deposition chamber 10 and the substrate heating chamber 15, the leakage rate of a gas molecule having a mass-to-charge ratio (m/z) of 28 is less than or equal to $1 \times 10^{-5}$ Pa·m³/s, preferably less than or equal to $1 \times 10^{-6}$ Pa·m³/s.

In each of the deposition chamber 10 and the substrate heating chamber 15, the leakage rate of a gas molecule having a mass-to-charge ratio (m/z) of 44 is less than or equal to $3 \times 10^{-6}$ Pa·m³/s, preferably less than or equal to $1 \times 10^{-6}$ Pa·m³/s.

Note that a total pressure and a partial pressure can be measured using a mass analyzer. For example, Qulee CGM-051, a quadrupole mass analyzer (also referred to as Q-mass) manufactured by ULVAC, Inc. can be used. Note that a leakage rate can be derived from the total pressure and partial pressure measured using the mass analyzer.

The leakage rate depends on external leakage and internal leakage. The external leakage refers to inflow of gas from the outside of a vacuum system through a minute hole, a sealing defect, or the like. The internal leakage is due to leakage through a partition, such as a valve, in a vacuum system or due to gas released from an internal member. Measures need to be taken from both aspects of external leakage and internal leakage in order that the leakage rate be set to be lower than or equal to the above value.

For example, an open/close portion of the deposition chamber can be sealed with a metal gasket. For the metal gasket, a metal material covered with iron fluoride, aluminum oxide, or chromium oxide is preferably used. The metal gasket enables higher adhesion than an O-ring, leading to a reduction in the external leakage. Further, with the use of a metal material covered with iron fluoride, aluminum oxide, chromium oxide, or the like which is in the passive state, the release of gas containing impurities released from the metal gasket is suppressed, so that the internal leakage can be reduced.

For a member of the deposition apparatus, aluminum, chromium, titanium, zirconium, nickel, or vanadium, which releases a smaller amount of gas containing impurities, is used. Alternatively, an alloy material containing iron, chromium, nickel, and the like covered with the above material may be used. The alloy material containing iron, chromium, nickel, and the like is rigid, resistant to heat, and suitable for processing. Here, when surface unevenness of the member is decreased by polishing or the like to reduce the surface area, the release of gas can be reduced.

Alternatively, the above member of the deposition apparatus may be covered with iron fluoride, aluminum oxide, chromium oxide, or the like.

The member of the deposition apparatus is preferably formed using only a metal material when possible. For example, in the case where a viewing window formed using quartz or the like is provided, a surface is preferably covered thinly with iron fluoride, aluminum oxide, chromium oxide, or the like to suppress the release of gas.

In the case where the refiner is provided just before a deposition gas is introduced, the length of a pipe between the refiner and the deposition chamber is less than or equal to 10 m, preferably less than or equal to 5 m, more preferably less than or equal to 1 m. When the length of the pipe is less than or equal to 10 m, less than or equal to 5 m, or less than or equal to 1 m, the effect of the release of gas from the pipe can be reduced accordingly.

As the pipe for the deposition gas, a metal pipe the inside of which is covered with iron fluoride, aluminum oxide, chromium oxide, or the like can be used. With the above pipe, the amount of released gas containing impurities is small and the entry of impurities into the deposition gas can be reduced as compared with a SUS316L-EP pipe, for example. Further, a high-performance ultra-compact metal gasket joint (UPG joint) can be used as a joint of the pipe. A structure where all the materials of the pipe are metal materials is preferable because the effect of the generated released gas or the external leakage can be reduced as compared with a structure where resin or the like is used.

When an adsorbate is present in the deposition chamber, the adsorbate does not affect the pressure in the deposition chamber because it is adsorbed onto an inner wall or the like; however, the adsorbate causes gas to be released when the inside of the deposition chamber is evacuated. Therefore, although there is no correlation between the leakage rate and the evacuation rate, it is important that the adsorbate present in the deposition chamber be desorbed as much as possible and evacuation be performed in advance with the use of a pump with high evacuation capability. Note that the deposition chamber may be baked to promote desorption of the adsorbate. By the baking, the desorption rate of the adsorbate can be increased about tenfold. The baking may be performed at a temperature in the range of 100° C. to 450° C. At this time, when the adsorbate is removed while an inert gas is introduced to the deposition chamber, the desorption rate of water or the like, which is difficult to desorb simply by evacuation, can be further increased. Note that when the inert gas to be introduced is heated to substantially the same temperature as the baking temperature of the deposition chamber, the desorption rate of the adsorbate can be further increased. Here, a rare gas is preferably used as an inert gas. Depending on the kind of a film to be deposited, oxygen or the like may be used instead of an inert gas. For example, in the case of depositing an oxide, using oxygen which is the main component of the oxide is preferable in some cases.

Alternatively, treatment for evacuating the inside of the deposition chamber is preferably performed a certain period of time after a heated oxygen gas, a heated inert gas such as a heated rare gas, or the like is introduced to increase pressure in the deposition chamber. The introduction of the heated gas can desorb the adsorbate in the deposition chamber, and the impurities present in the deposition chamber can be reduced. Note that an advantageous effect can be achieved when this treatment is repeated more than or equal to twice and less than or equal to 30 times, preferably more than or equal to 5 times and less than or equal to 15 times. Specifically, an inert gas, oxygen, or the like at a temperature in the range of 40° C. to 400° C., preferably 50° C. to 200° C. is supplied to the deposition chamber, so that the pressure therein can be kept in the range of 0.1 Pa to 10 kPa, preferably 1 Pa to 1 kPa, more preferably 5 Pa to 100 Pa for longer than or equal to 1 minute and shorter than or equal to 300 minutes, preferably longer than or equal to 5 minutes and shorter than or equal to 120 minutes. After that, the inside of the deposition chamber is evacuated for longer than or equal to 5 minutes and shorter than or equal to 300 minutes, preferably longer than or equal to 10 minutes and shorter than or equal to 120 minutes.

The desorption rate of the adsorbate can be further increased also by dummy deposition. Here, the dummy deposition refers to deposition on a dummy substrate by a sputtering method or the like, in which a film is deposited on the dummy substrate and the inner wall of the deposition chamber so that impurities in the deposition chamber and an adsorbate on the inner wall of the deposition chamber are confined in the film. For a dummy substrate, a material which releases a smaller amount of gas is preferably used, and for example, a material similar to that of a substrate 100 which is to be described later may be used. By performing dummy deposition, impurity concentration in a film to be deposited later can be reduced. Note that the dummy deposition may be performed at the same time as the baking of the deposition chamber.

Figure 7B:
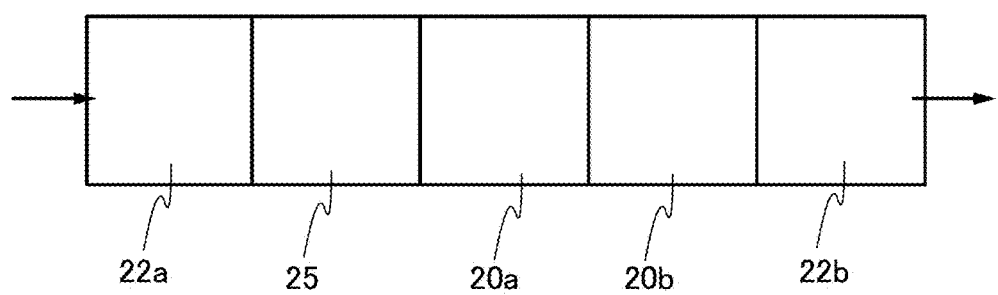

FIG. 7B illustrates a deposition apparatus having a structure different from that in FIG. 7A. The deposition apparatus includes a load lock chamber 22a, a substrate heating chamber 25, deposition chambers 20a and 20b, and a load lock chamber 22b. The load lock chamber 22a is connected to the substrate heating chamber 25. The substrate heating chamber 25 is connected to the deposition chamber 20a. The deposition chamber 20a is connected to the deposition chamber 20b. The deposition chamber 20b is connected to the load lock chamber 22b. A gate valve is provided for a connecting portion between chambers so that each chamber can be independently kept in a vacuum state. Note that the deposition chambers 20a and 20b have structures similar to those of the deposition chambers 10a, 10b, and 10c in FIG. 7A. The substrate heating chamber 25 has a structure similar to that of the substrate heating chamber 15 in FIG. 7A. A substrate is transferred in only one direction indicated by arrows in FIG. 7B, and an inlet and an outlet for the substrate are different. Unlike the single wafer multi-chamber deposition apparatus in FIG. 7A, there is no transfer chamber, and the footprint can be reduced accordingly. Note that the number of the deposition chambers, the number of the load lock chambers, and the number of the substrate heating chambers are not limited to the above, and can be determined as appropriate depending on the space for placement or the process. For example, the deposition chamber 20b may be omitted, or a second substrate heating chamber or a third deposition chamber which is connected to the deposition chamber 20b may be provided.

When an oxide semiconductor film is deposited with the use of the above deposition apparatus, the entry of impurities into the oxide semiconductor film can be suppressed. Furthermore, when a film in contact with the oxide semiconductor film is deposited with the use of the above deposition apparatus, the entry of impurities into the oxide semiconductor film from the film in contact therewith can be suppressed.

Next, a method for depositing an oxide semiconductor film having a crystal region in which the direction of the c-axis is parallel to a normal vector of the top surface of the oxide semiconductor film will be described.

An oxide semiconductor film is deposited using the sputtering target including an oxide semiconductor having a crystal region in which the direction of the c-axis is parallel to a normal vector of the top surface of the oxide semiconductor, which is described in Embodiment 1.

The surface temperature of the sputtering target is set to be lower than or equal to 100° C., preferably lower than or equal to 50° C., more preferably about room temperature. In a sputtering apparatus for a large substrate, a large sputtering target is often used. However, it is difficult to form a sputtering target for a large substrate without a juncture. In fact, although to obtain a large shape a plurality of sputtering targets are arranged so that there is as little space as possible therebetween, a slight space is inevitably generated. When the surface temperature of the sputtering target increases, in some cases, Zn or the like is volatilized from such a slight space, and the space might be expanded gradually. When the space expands, a material of a backing plate or a material used for adhesion might be sputtered and cause an increase in impurity concentration. Thus, it is preferable that the sputtering target be cooled sufficiently.

Specifically, for the backing plate, a metal material having high conductivity and a high heat dissipation property (specifically Cu) is used. The sputtering target can be cooled efficiently by making a sufficient amount of cooling water flow through a water channel which is formed in the backing plate. Here, the sufficient amount of cooling water, which depends on the size of the sputtering target, is set to be greater than or equal to 3 L/min, greater than or equal to 5 L/min, or greater than or equal to 10 L/min in the case of, for example, a circular target whose diameter is 300 mm.

Figure 44:
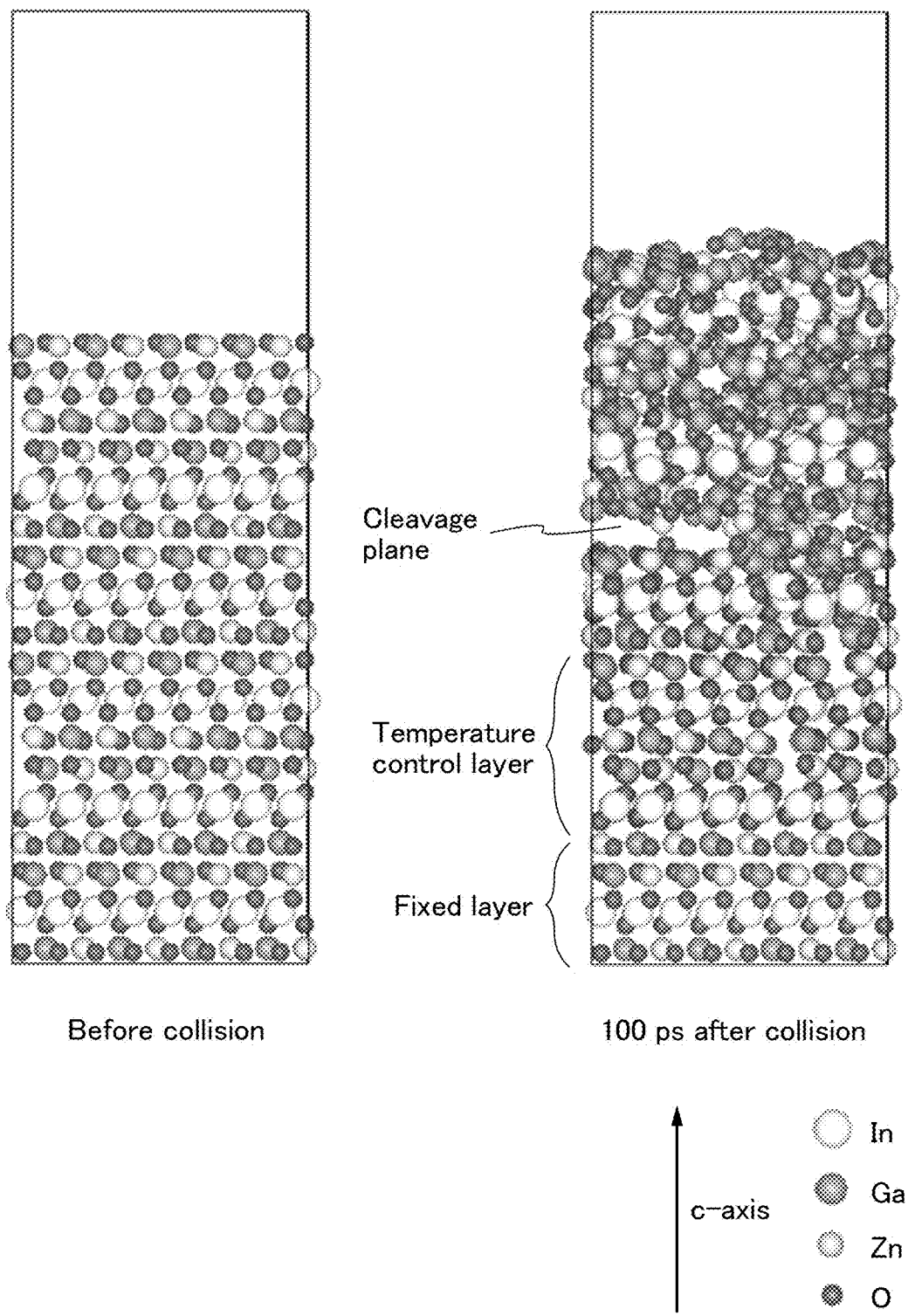
FIG. 44 illustrates a calculated crystal structure before and after collision with an argon atom.

Here, collision of an argon atom with a crystal of an In—Ga—Zn—O compound having an atomic ratio of In:Ga:Zn=1:1:1 was evaluated by classical molecular dynamics simulation, and results thereof are shown in FIG. 44.

For the simulation, Materials Explorer 5.0 manufactured by Fujitsu Limited was used, and the temperature, the time step size, and the number of steps were set to be 300 K, 0.01 fs, and ten million times, respectively.

Note that for the simulation, a single crystal of the In—Ga—Zn—O compound including 2688 atoms was used. An argon atom having an energy of 300 eV was made to collide from the direction parallel to the c-axis direction of the single crystal. A fixed layer shown in FIG. 44 is a layer which prevents the positions of the atoms from moving. A temperature control layer in FIG. 44 is a layer whose temperature is constantly set to a fixed temperature (300 K).

FIG. 44 shows a state before collision of the argon atom and a state 100 picoseconds after the collision.

FIG. 44 shows that the crystal of the In—Ga—Zn—O compound is cleaved along an a-b plane 100 picoseconds after the collision of the argon atom. Specifically, the crystal is cleaved along a plane including Ga and Zn.

That is, when an ion collides with the surface of the sputtering target, the crystal region included in the sputtering target is cleaved along the a-b plane, and flat-plate-like sputtered particles are separated from the sputtering target.

The oxide semiconductor film is deposited in an oxygen atmosphere with a substrate temperature higher than or equal to 100° C. and lower than or equal to 600° C., preferably higher than or equal to 150° C. and lower than or equal to 550° C., more preferably higher than or equal to 200° C. and lower than or equal to 500° C. The thickness of the oxide semiconductor film is larger than or equal to 1 nm and smaller than or equal to 40 nm, preferably larger than or equal to 3 nm and smaller than or equal to 20 nm. As the substrate temperature at the time of the deposition is higher, the impurity concentration of the obtained oxide semiconductor film is lower. Further, migration of sputtered particles on a deposition surface is likely to occur; therefore, the atomic arrangement in the oxide semiconductor film is ordered and the density thereof is increased, so that a polycrystalline oxide semiconductor film or a CAAC-OS film is readily formed. Furthermore, when an oxygen atmosphere is employed for the deposition, plasma damage is alleviated and a surplus atom such as a rare gas atom is not contained in the oxide semiconductor film, so that a polycrystalline oxide semiconductor film or a CAAC-OS film is likely to be formed. Note that a mixed atmosphere including an oxygen gas and a rare gas may be used. In that case, the percentage of an oxygen gas is set to be higher than or equal to 30 vol. %, preferably higher than or equal to 50 vol. %, more preferably higher than or equal to 80 vol. %. Note that as the oxide semiconductor film has a smaller thickness, a phenomenon in which a threshold voltage is shifted to a negative direction when a transistor has a shorter channel length is suppressed. However, when the oxide semiconductor film is too thin, the oxide semiconductor film is significantly influenced by interface scattering; thus, the field-effect mobility might be decreased.

Note that in the case where the sputtering target includes Zn, plasma damage is alleviated by the deposition in an oxygen atmosphere; thus, a film in which Zn is unlikely to be volatilized can be obtained.

The oxide semiconductor film is deposited under conditions in which the deposition pressure is less than or equal to 0.8 Pa, preferably less than or equal to 0.4 Pa, and the distance between the sputtering target and a substrate is less than or equal to 40 mm, preferably less than or equal to 25 mm. When the oxide semiconductor film is deposited under such a condition, the frequency of the collision between a sputtered particle and another sputtered particle, a gas molecule, or an ion can be reduced. That is, depending on the deposition pressure, the distance between the sputtering target and the substrate is made shorter than the mean free path of a sputtered particle, a gas molecule, or an ion, so that the entry of impurities into the film can be reduced.

For example, when the pressure is 0.4 Pa and the temperature is 25° C. (the absolute temperature is 298 K), a hydrogen molecule ($H_2$) has a mean free path of 48.7 mm, a helium molecule (He) has a mean free path of 57.9 mm, a water molecule ($H_2O$) has a mean free path of 31.3 mm, an ethane molecule ($CH_4$) has a mean free path of 13.2 mm, a neon molecule (Ne) has a mean free path of 42.3 mm, a nitrogen molecule ($N_2$) has a mean free path of 23.2 mm, a carbon monoxide molecule (CO) has a mean free path of 16.0 mm, an oxygen molecule ($O_2$) has a mean free path of 26.4 mm, an argon molecule (Ar) has a mean free path of 28.3 mm, a carbon dioxide molecule ($CO_2$) has a mean free path of 10.9 mm, a krypton molecule (Kr) has a mean free path of 13.4 mm, and a xenon molecule (Xe) has a mean free path of 9.6 mm Note that doubling of the pressure halves a mean free path and doubling of the absolute temperature doubles a mean free path.

The mean free path depends on pressure, temperature, and the diameter of a molecule. In the case where pressure and temperature are constant, as the diameter of a molecule is larger, the mean free path is shorter. Note that the diameters of the following molecules are as follows: $H_2$: 0.218 nm; He: 0.200 nm; $H_2O$: 0.272 nm; $CH_4$: 0.419 nm; Ne: 0.234 nm; $N_2$: 0.316 nm; CO: 0.380 nm; $O_2$: 0.296 nm; Ar: 0.286 nm; $CO_2$: 0.460 nm; Kr: 0.415 nm; and Xe: 0.491 nm.

Thus, as the diameter of a molecule is larger, the mean free path is shorter and the growth of a crystal region is inhibited due to the large diameter of the molecule when the molecule enters the film. For this reason, it can be said that, for example, a molecule whose diameter is larger than that of Ar is likely to behave as an impurity.

Here, whether the crystal structure can be maintained in the case where $CO_2$ is added between layers of an In—Ga—Zn—O crystal was evaluated by classical molecular dynamics simulation.

Figure 26:
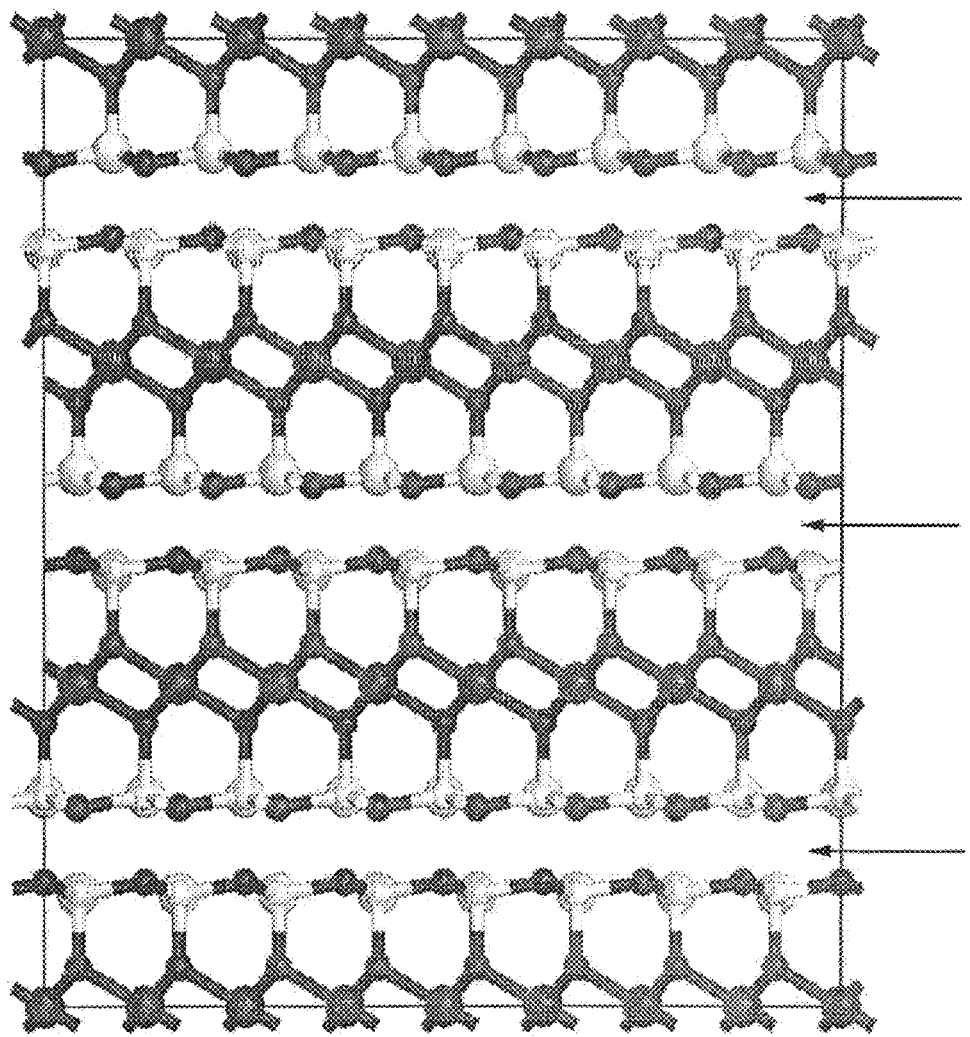
FIG. 26 illustrates a crystal structure of an oxide semiconductor according to one embodiment of the present invention.

FIG. 26 is a schematic diagram of an In—Ga—Zn—O crystal. Here, $CO_2$ was added to layers indicated by arrows in FIG. 26. The additive rate of $CO_2$ with respect to all atoms in the In—Ga—Zn—O crystal was 0.07% ($5.19 \times 10^{19}$/$cm^3$), 0.15% ($1.04 \times 10^{20}$/$cm^3$), 0.22% ($1.65 \times 10^{20}$/$cm^3$), 0.30% ($2.08 \times 10^{20}$/$cm^3$), 0.37% ($2.60 \times 10^{20}$/$cm^3$), 0.44% ($3.11 \times 10^{20}$/$cm^3$), 0.52% ($3.63 \times 10^{20}$/$cm^3$), 0.59% ($4.15 \times 10^{20}$/$cm^3$), or 0.67% ($4.67 \times 10^{20}$/$cm^3$).

For the simulation, Materials Explorer 5.0 manufactured by Fujitsu Limited was used, and the temperature, the pressure, the time step size, the number of steps were 298 K, 1 atmospheric pressure, 0.2 fs, and five million, respectively.

As a result, when the additive rate of $CO_2$ was 0.07% to 0.52%, the In—Ga—Zn—O crystal was maintained, whereas when the additive rate of $CO_2$ was 0.59% to 0.67%, the In—Ga—Zn—O crystal was not able to be maintained.

This result reveals that the proportion of $CO_2$ with respect to all atoms in the In—Ga—Zn—O crystal needs to be less than or equal to 0.52% or less than 0.59% so that the In—Ga—Zn—O crystal can be obtained.

Next, heat treatment is performed. The heat treatment is performed in a reduced-pressure atmosphere, an inert atmosphere, or an oxidation atmosphere. By the heat treatment, the impurity concentration in the oxide semiconductor film can be reduced.

The heat treatment is preferably performed in a manner such that after heat treatment is performed in a reduced-pressure atmosphere or an inert atmosphere, the atmosphere is switched to an oxidation atmosphere with the temperature maintained and heat treatment is further performed. When the heat treatment is performed in a reduced-pressure atmosphere or an inert atmosphere, the impurity concentration in the oxide semiconductor film can be reduced; however, oxygen vacancies are caused at the same time. By the heat treatment in an oxidation atmosphere, the caused oxygen vacancies can be reduced.

When heat treatment is performed on the oxide semiconductor film after the deposition in addition to the substrate heating at the time of the deposition, the impurity concentration in the film can be reduced.

Specifically, the concentration of hydrogen in the oxide semiconductor film, which is measured by secondary ion mass spectrometry (SIMS), can be set to be lower than $5 \times 10^{19}$ atoms/$cm^3$, preferably lower than or equal to $5 \times 10^{18}$ atoms/$cm^3$, more preferably lower than or equal to $1 \times 10^{18}$ atoms/$cm^3$, still more preferably lower than or equal to $5 \times 10^{17}$ atoms/$cm^3$.

The concentration of nitrogen in the oxide semiconductor film, which is measured by SIMS, can be set to be lower than $5 \times 10^{19}$ atoms/$cm^3$, preferably lower than or equal to $5 \times 10^{18}$ atoms/$cm^3$, more preferably lower than or equal to $1 \times 10^{18}$ atoms/$cm^3$, still more preferably lower than or equal to $5 \times 10^{17}$ atoms/$cm^3$.

The concentration of carbon in the oxide semiconductor film, which is measured by SIMS, can be set to be lower than $5 \times 10^{19}$ atoms/$cm^3$, preferably lower than or equal to $5 \times 10^{18}$ atoms/$cm^3$, more preferably lower than or equal to $1 \times 10^{18}$ atoms/$cm^3$, still more preferably lower than or equal to $5 \times 10^{17}$ atoms/$cm^3$.

The amount of each of the following gas molecules released from the oxide semiconductor film is less than or equal to $1 \times 10^{19}$/$cm^3$, preferably less than or equal to $1 \times 10^{18}$/$cm^3$ or less, which is measured by thermal desorption spectroscopy (TDS) analysis: a gas molecule having a mass-to-charge ratio (m/z) of 2 (e.g., water molecule), a gas molecule having a mass-to-charge ratio (m/z) of 18, a gas molecule having a mass-to-charge ratio (m/z) of 28, and a gas molecule having a mass-to-charge ratio (m/z) of 44.

A measurement method of the amount of released oxygen atoms, which is to be described later, is referred to for a measurement method of the release amount using TDS analysis.

Here, the partial pressure of each molecule at the time of the deposition of the oxide semiconductor film in the deposition chamber of the deposition apparatus described in this embodiment will be described. The total pressure and partial pressure at the time of the deposition were measured using Qulee CGM-051, a quadrupole mass analyzer manufactured by ULVAC, Inc.

The oxide semiconductor film is deposited under conditions in which the substrate temperature is 150° C., an In—Ga—Zn—O compound target having an atomic ratio of In:Ga:Zn=1:1:1 is used as the sputtering target, deposition gases are 50 sccm of argon and 50 sccm of oxygen, the power is 9 kW (AC), and the distance between the target and a substrate is 150 mm.

Figure 45:
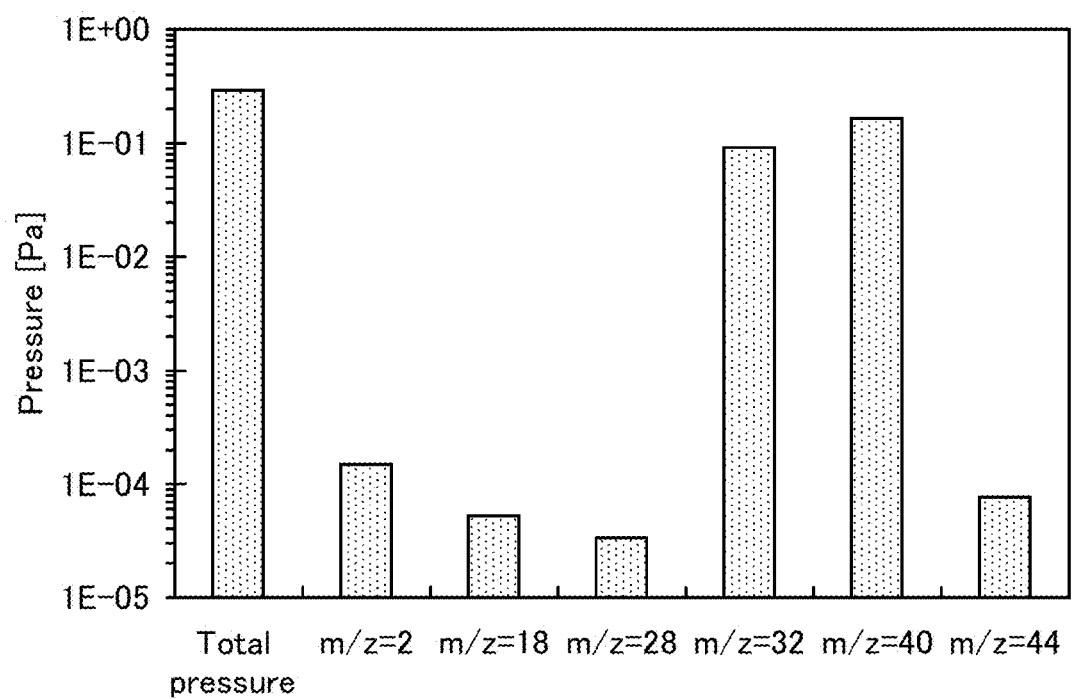
FIG. 45 shows pressures at the time of deposition.

FIG. 45 shows the following pressures, established 100 seconds after the start of the deposition: a total pressure, a partial pressure having a mass-to-charge ratio (m/z) of 2, a partial pressure having a mass-to-charge ratio (m/z) of 18, a partial pressure having a mass-to-charge ratio (m/z) of 28, a partial pressure having a mass-to-charge ratio (m/z) of 40, and a partial pressure having a mass-to-charge ratio (m/z) of 44.

FIG. 45 shows that, in the case where the deposition apparatus described in this embodiment is used, a partial pressure having a mass-to-charge ratio (m/z) of 2, a partial pressure having a mass-to-charge ratio (m/z) of 18, a partial pressure having a mass-to-charge ratio (m/z) of 28, and a partial pressure having a mass-to-charge ratio (m/z) of 44 at the time of the deposition are $1.5 \times 10^{-4}$ Pa, $5 \times 10^{-5}$ Pa, $3 \times 10^{-5}$ Pa, and $8 \times 10^{-5}$ Pa, respectively, which become sequentially smaller, and that entry of impurities is unlikely to occur at the time of the deposition.

With the use of the deposition apparatus as described above, an oxide semiconductor film having a crystal region in which the direction of the c-axis is parallel to a normal vector of the top surface of the oxide semiconductor film can be obtained. Since the oxide semiconductor film having a crystal region in which the direction of the c-axis is parallel to a normal vector of the top surface of the oxide semiconductor film has excellent semiconductor characteristics, a transistor formed using such an oxide semiconductor film can attain high reliability.

This embodiment can be implemented in appropriate combination with any of the other embodiments.

Embodiment 3

A transistor formed using the oxide semiconductor film deposited using the sputtering target described in Embodiment 1 and the deposition apparatus described in Embodiment 2 will be described with reference to FIGS. 11A and 11B, FIGS. 12A and 12B, FIGS. 13A and 13B, FIGS. 14A and 14B, FIGS. 15A to 15C, and FIGS. 16A and 16B.

Transistors illustrated in FIGS. 11A and 11B, FIGS. 12A and 12B, FIGS. 13A and 13B, and FIGS. 14A and 14B are excellent in productivity because the number of photolithography processes is small. The transistors in FIGS. 11A and 11B, FIGS. 12A and 12B, FIGS. 13A and 13B, and FIGS. 14A and 14B are preferably used for display devices which need transistors with relatively large sizes, for example.

Figure 11A:
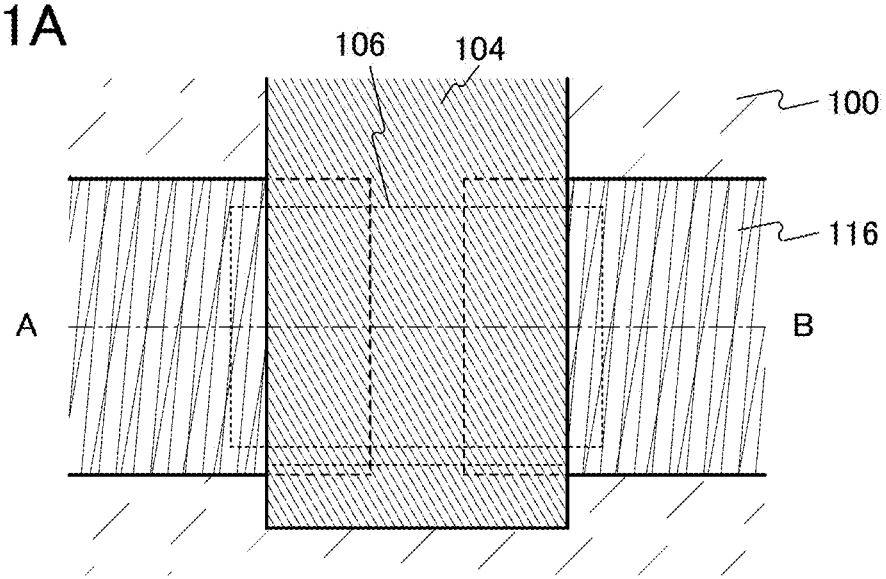
FIGS. 11A and 11B are a top view and a cross-sectional view illustrating an example of a transistor.
Figure 11B:
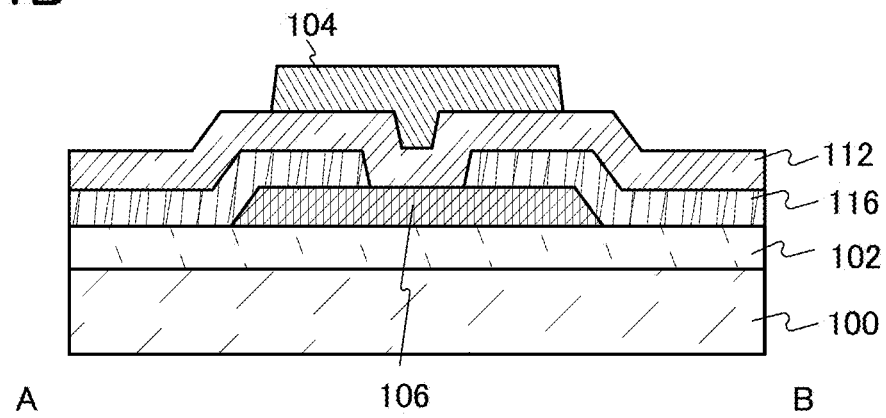

First, the structure of the transistor in FIGS. 11A and 11B will be described. FIG. 11A is a top view of the transistor. FIG. 11B is a cross-sectional view taken along the dashed-dotted line A-B in FIG. 11A.

The transistor in FIG. 11B includes the substrate 100, a base insulating film 102 provided over the substrate 100, an oxide semiconductor film 106 provided over the base insulating film 102, a pair of electrodes 116 which is provided over and at least partly in contact with the oxide semiconductor film 106, a gate insulating film 112 provided to cover the oxide semiconductor film 106 and the pair of electrodes 116, and a gate electrode 104 provided to overlap with the oxide semiconductor film 106 with the gate insulating film 112 provided therebetween.

Here, the oxide semiconductor film 106 is deposited using the sputtering target including an oxide semiconductor having a crystal region in which the direction of the c-axis is parallel to a normal vector of the top surface of the oxide semiconductor, which is described in Embodiment 1. In addition, the oxide semiconductor film 106 is deposited using the deposition apparatus described in Embodiment 2.

The thickness of the oxide semiconductor film 106 is larger than or equal to 1 nm and smaller than or equal to 50 nm, preferably larger than or equal to 3 nm and smaller than or equal to 20 nm. Particularly in the case where the transistor has a channel length of shorter than or equal to 30 nm and the oxide semiconductor film 106 has a thickness of around 5 nm, a phenomenon in which a threshold voltage is shifted to a negative direction when a transistor has a shorter channel length can be suppressed, and stable electric characteristics can be obtained.

The oxide semiconductor film 106 preferably contains at least In and Zn. Further, it is preferable that the oxide semiconductor film 106 contain Ga, Sn, Hf, or Al in addition to In and Zn so that variations in electric characteristics of the transistor can be reduced.

Alternatively, the oxide semiconductor film 106 may contain one or more kinds of lanthanoid such as La, Ce, Pr, Nd, Sm, Eu, Gd, Tb, Dy, Ho, Er, Tm, Yb, and Lu in addition to In and Zn so that variations in electric characteristics of the transistor can be reduced.

For the oxide semiconductor film 106, instead of the In—Ga—Zn—O compound, any of the followings may be used, for example: an In—Zn—O compound, a Sn—Zn—O compound, an Al—Zn—O compound, a Zn—Mg—O compound, a Sn—Mg—O compound, an In—Mg—O compound, an In—Ga—O compound, an In—Al—Zn—O compound, an In—Sn—Zn—O compound, a Sn—Ga—Zn—O compound, an Al—Ga—Zn—O compound, a Sn—Al—Zn—O compound, an In—Hf—Zn—O compound, an In—La—Zn—O compound, an In—Ce—Zn—O compound, an In—Pr—Zn—O compound, an In—Nd—Zn—O compound, an In—Sm—Zn—O compound, an In—Eu—Zn—O compound, an In—Gd—Zn—O compound, an In—Tb—Zn—O compound, an In—Dy—Zn—O compound, an In—Ho—Zn—O compound, an In—Er—Zn—O compound, an In—Tm—Zn—O compound, an In—Yb—Zn—O compound, an In—Lu—Zn—O compound, an In—Sn—Ga—Zn—O compound, an In-Hf-Ga—Zn—O compound, an In—Al—Ga—Zn—O compound, an In—Sn—Al—Zn—O compound, an In—Sn—Hf—Zn—O compound, and an In—Hf—Al—Zn—O compound. In that case, a sputtering target can be formed by changing raw materials as appropriate with reference to the method for manufacturing a sputtering target, which is described in Embodiment 1.

For example, high field-effect mobility can be achieved relatively easily in the case of a transistor formed using an In—Sn—Zn—O compound. Specifically, the transistor can have a field-effect mobility of 31 $cm^2$/Vs or more, 40 $cm^2$/Vs or more, 60 $cm^2$/Vs or more, 80 $cm^2$/Vs or more, or 100 $cm^2$/Vs or more. Also in the case of a transistor formed using a material other than an In—Sn—Zn—O compound (e.g., an In—Ga—Zn—O compound), the field-effect mobility can be increased by reducing the defect density.

In the case where an In—Zn—O compound is used for the oxide semiconductor film 106, the atomic ratio of In to Zn is in the range of 0.5:1 to 50:1, preferably 1:1 to 20:1, more preferably 1.5:1 to 15:1. When the atomic ratio of In to Zn is in the above range, the field-effect mobility of the transistor can be increased. Here, when the atomic ratio of In:Zn:O of the compound is X:Y:Z, Z>1.5X+Y is preferably satisfied.

A material represented by a chemical formula $InMO_3(ZnO)_m$ (m>0) may be used for the oxide semiconductor film 106. Here, M represents one or more metal elements selected from Zn, Ga, Al, Mn, Sn, Hf, and Co. For example, M may be Ga, Ga and Al, Ga and Mn, Ga and Co, or the like.

For the oxide semiconductor film 106, a material which has a band gap greater than or equal to 2.5 eV, preferably greater than or equal to 2.8 eV, more preferably greater than or equal to 3.0 eV is selected to reduce the off-state current of the transistor.

Note that it is preferable that an alkali metal, an alkaline earth metal, and the like be reduced from the oxide semiconductor film 106 so that the impurity concentration is extremely low. When the oxide semiconductor film 106 contains any of the above impurities, recombination in a band gap occurs owing to a level formed by the impurity, so that the off-state current of the transistor is increased.

As for alkali metal concentrations in the oxide semiconductor film 106, which are measured by SIMS, the concentration of sodium is set to be lower than or equal to $5\times10^{16}$ atoms/$cm^3$, preferably lower than or equal to $1\times10^{16}$ atoms/ cm$^3$, more preferably lower than or equal to 1×10$^{15}$ atoms/ cm$^3$; the concentration of lithium is set to be lower than or equal to 5×10$^{15}$ atoms/cm$^3$, preferably lower than or equal to 1×10$^{15}$ atoms/cm$^3$; and the concentration of potassium is set to be lower than or equal to 5×10$^{15}$ atoms/cm$^3$, preferably lower than or equal to 1×10$^{15}$ atoms/cm$^3$.

The use of the oxide semiconductor film 106 described above makes it possible to reduce the off-state current of the transistor. For example, the off-state current of the transistor with a channel length of 3 μm and a channel width of 1 μm can be set to be lower than or equal to 1×10$^{-18}$ A, lower than or equal to 1×10$^{-21}$ A, or lower than or equal to 1×10$^{-24}$ A. Therefore, a memory cell which has excellent data retention and low power consumption can be manufactured.

There is no particular limitation on the substrate 100 as long as it has at least heat resistance enough to withstand heat treatment performed later. For example, a glass substrate, a ceramic substrate, a quartz substrate, or a sapphire substrate may be used as the substrate 100. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used as the substrate 100. It is preferable to use any of these substrates further provided with a semiconductor element, as the substrate 100.

Still alternatively, a flexible substrate may be used as the substrate 100. As a method of providing a transistor over a flexible substrate, there is a method in which a transistor is formed over a non-flexible substrate, and then the transistor is separated and transferred to the substrate 100 which is a flexible substrate. In that case, a separation layer is preferably provided between the non-flexible substrate and the transistor.

The base insulating film 102 can be formed to have a single-layer structure or a layered structure using one or more of silicon oxide, silicon oxynitride, silicon nitride oxide, silicon nitride, aluminum oxide, aluminum nitride, hafnium oxide, zirconium oxide, yttrium oxide, lanthanum oxide, cesium oxide, tantalum oxide, and magnesium oxide.

It is preferable that the base insulating film 102 be sufficiently flat. Specifically, the base insulating film 102 is provided so as to have an average surface roughness (Ra) less than or equal to 1 nm, preferably less than or equal to 0.3 nm, more preferably less than or equal to 0.1 nm. When the average surface roughness Ra is less than or equal to the above value, a crystal region is easily formed in the oxide semiconductor film 106. Note that an average surface roughness Ra is obtained by expanding centerline average roughness, which is defined by JIS B 0601, into three dimensions for application to a plane. Moreover, an average surface roughness Ra can be expressed as the average value of the absolute values of deviations from a reference surface to a specific surface and is defined by Formula 1.

$$Ra = \frac{1}{S_0} \int_{y_1}^{y_2} \int_{x_1}^{x_2} |f(x, y) - Z_0| dx dy \quad \text{[FORMULA 1]}$$

Note that, in Formula 1, $S_0$ represents the area of a measurement surface (a rectangular region which is defined by four points represented by the coordinates $(x_1,y_1)$, $(x_1,y_2)$, $(x_2,y_1)$, and $(x_2,y_2)$), and $Z_0$ represents the average height of the measurement surface. Evaluation of Ra can be performed using an atomic force microscope (AFM).

In this specification, silicon oxynitride refers to a substance in which the oxygen content is higher than the nitrogen content. For example, silicon oxynitride contains oxygen, nitrogen, silicon, and hydrogen at concentrations ranging from 50 atomic % to 70 atomic % inclusive, from 0.5 atomic % to 15 atomic % inclusive, from 25 atomic % to 35 atomic % inclusive, and from 0 atomic % to 10 atomic % inclusive, respectively. Silicon nitride oxide refers to a substance in which the nitrogen content is higher than the oxygen content. For example, silicon nitride oxide contains oxygen, nitrogen, silicon, and hydrogen at concentrations ranging from 5 atomic % to 30 atomic % inclusive, from 20 atomic % to 55 atomic % inclusive, from 25 atomic % to 35 atomic % inclusive, and from 10 atomic % to 25 atomic % inclusive, respectively. Note that the above ranges are obtained in the case where measurements are performed using Rutherford backscattering spectrometry (RBS) and hydrogen forward scattering (HFS). Moreover, the total of the percentages of the constituent elements does not exceed 100 atomic %.

It is preferable that an insulating film from which oxygen is released by heat treatment be used as the base insulating film 102.

To release oxygen by heat treatment means that the amount of released oxygen which is converted into oxygen atoms is greater than or equal to 1.0×10$^{18}$ atoms/cm$^3$ or greater than or equal to 3.0×10$^{20}$ atoms/cm$^3$ in thermal desorption spectroscopy (TDS) analysis.

Here, a measurement method of the amount of released oxygen which is converted into oxygen atoms using TDS analysis will be described.

The amount of a released gas in TDS analysis is proportional to the integral value of intensity of ions of the released gas. Therefore, the amount of a released gas can be calculated by comparison between the integral value of the measured ion intensity and a reference value of a standard sample. The reference value of a standard sample refers to, in a sample containing an atom at a predetermined density, the ratio of the density of the atom to the integral value of ion intensity corresponding to the atom.

For example, the amount of oxygen molecules ($N_{O2}$) released from an insulating film can be found according to Formula 2 with the TDS analysis results of a silicon wafer containing hydrogen at a predetermined density which is the standard sample and the TDS analysis results of the insulating film. Here, all gases having a mass number of 32 which are obtained in the TDS analysis are assumed to originate from an oxygen molecule. A CH$_3$OH gas, which is given as a gas having a mass number of 32, is not taken into consideration on the assumption that it is unlikely to be present. Further, an oxygen molecule including an oxygen atom having a mass number of 17 or 18 which is an isotope of an oxygen atom is also not taken into consideration because the proportion of such a molecule in the natural world is minimal.

$$N_{O2} = \frac{N_{H2}}{S_{H2}} \times S_{O2} \times \alpha \quad \text{[FORMULA 2]}$$

The value $N_{H2}$ is obtained by conversion of the amount of hydrogen molecules desorbed from the standard sample into densities. The integral value of ion intensity in the case where the standard sample is subjected to the TDS analysis is denoted by $S_{H2}$. Here, the reference value of the standard sample is set to $N_{H2}/S_{H2}$. The integral value of ion intensity in the case where the insulating film is subjected to the TDS analysis is denoted by $S_{O2}$. A coefficient affecting the ion intensity in the TDS analysis is denoted by a. Japanese Published Patent Application No. H6-275697 can be referred to for details of Formula 2. Note that the amount of oxygen released from the above insulating film is measured with EMD-WA1000S/W, a thermal desorption spectroscopy apparatus produced by ESCO Ltd., with the use of a silicon wafer containing a hydrogen atom at $1\times10^{16}$ atoms/cm$^3$ as the standard sample.

Further, in the TDS analysis, oxygen is partly detected as an oxygen atom. The ratio between oxygen molecules and oxygen atoms can be calculated from the ionization rate of the oxygen molecules. Note that, since the above coefficient α includes the ionization rate of the oxygen molecules, the amount of the released oxygen atoms can be estimated through the evaluation of the amount of the released oxygen molecules.

Note that the amount of the released oxygen molecules is denoted by $N_{O2}$. The amount of released oxygen in the case of being converted into oxygen atoms is twice the amount of the released oxygen molecules.

In the above structure, the film from which oxygen is released by heat treatment may be oxygen-excess silicon oxide ($SiO_X$ (X>2)). In the oxygen-excess silicon oxide ($SiO_X$ (X>2)), the number of oxygen atoms per unit volume is more than twice the number of silicon atoms per unit volume. The number of silicon atoms and the number of oxygen atoms per unit volume are measured by Rutherford backscattering spectrometry.

The supply of oxygen from the base insulating film 102 to the oxide semiconductor film 106 can reduce the interface state density at the interface between the oxide semiconductor film 106 and the base insulating film 102. As a result, carrier trapping at the interface between the oxide semiconductor film 106 and the base insulating film 102 due to the operation of a transistor, or the like can be suppressed, and thus, a highly reliable transistor can be obtained.

Further, electric charges are generated due to oxygen vacancies in the oxide semiconductor film 106 in some cases. In general, some oxygen vacancies in the oxide semiconductor film 106 serve as donors and cause release of electrons which are carriers. Consequently, the threshold voltage of a transistor shifts in the negative direction. When oxygen is sufficiently supplied from the base insulating film 102 to the oxide semiconductor film 106 so that the oxide semiconductor film 106 preferably contains excessive oxygen, oxygen vacancies in the oxide semiconductor film 106, which cause the negative shift of the threshold voltage, can be reduced.

The excessive oxygen is mainly oxygen existing between lattices of the oxide semiconductor film 106. When the concentration of oxygen is set in the range of $1\times10^{16}$ atoms/cm$^3$ to $2\times10^{20}$ atoms/cm$^3$, crystal distortion or the like is not caused and thus a crystal region is not destroyed, which is preferable.

The pair of electrodes 116 can be formed to have a single-layer structure or a layered structure using one or more of Al, Ti, Cr, Co, Ni, Cu, Y, Zr, Mo, Ag, Ta, and W, a nitride of any of these elements, an oxide of any of these elements, and an alloy of any of these elements. Alternatively, an oxide or an oxynitride which contains at least In and Zn may be used. For example, an In—Ga—Zn—O—N compound may be used.

The gate insulating film 112 can be formed using a material selected from materials similar to those of the base insulating film 102.

The gate electrode 104 can be formed using a material selected from materials similar to those of the pair of electrodes 116.

Figure 12A:
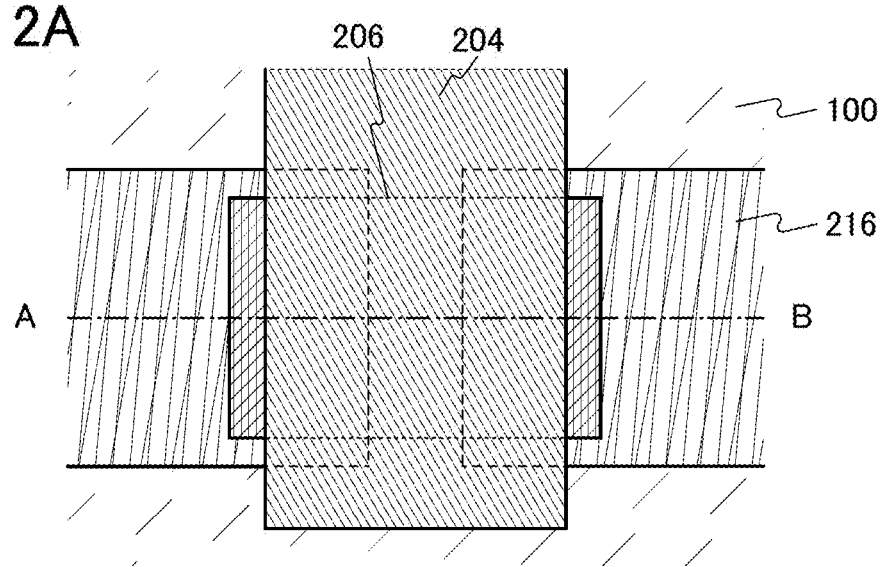
FIGS. 12A and 12B are a top view and a cross-sectional view illustrating an example of a transistor.
Figure 12B:
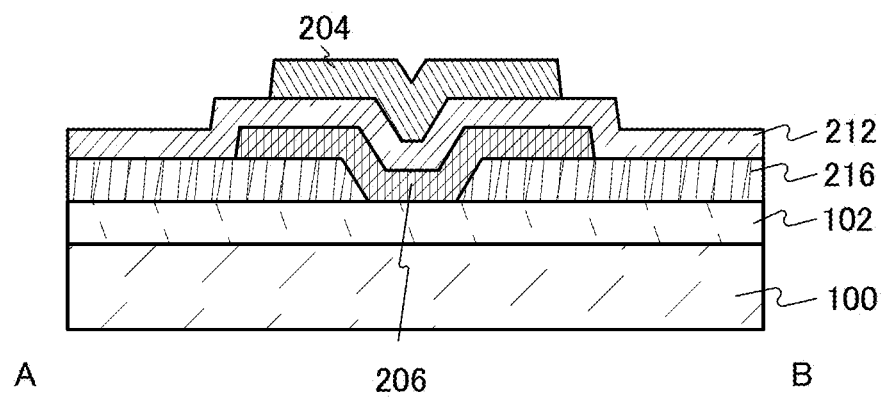

Next, the structure of the transistor in FIGS. 12A and 12B will be described. FIG. 12A is a top view of the transistor. FIG. 12B is a cross-sectional view taken along the dashed-dotted line A-B in FIG. 12A.

The transistor in FIG. 12B includes the substrate 100, the base insulating film 102 provided over the substrate 100, a pair of electrodes 216 provided over the base insulating film 102, an oxide semiconductor film 206 which is provided over the pair of electrodes 216 and is at least partly in contact with the pair of electrodes 216 and the base insulating film 102, a gate insulating film 212 provided to cover the pair of electrodes 216 and the oxide semiconductor film 206, and a gate electrode 204 provided to overlap with the oxide semiconductor film 206 with the gate insulating film 212 provided therebetween.

Note that the pair of electrodes 216, the oxide semiconductor film 206, the gate insulating film 212, and the gate electrode 204 can be formed using methods and materials similar to those of the pair of electrodes 116, the oxide semiconductor film 106, the gate insulating film 112, and the gate electrode 104, respectively.

Figure 13A:
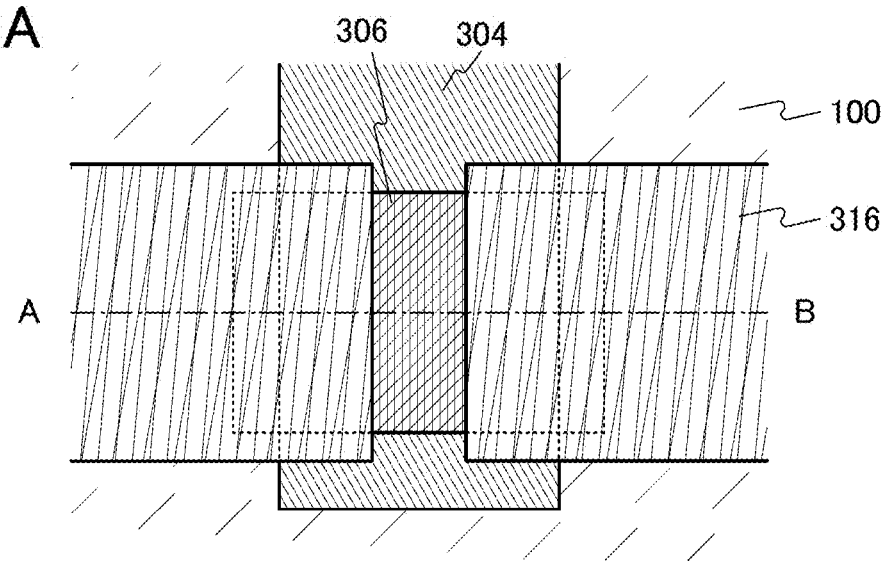
FIGS. 13A and 13B are a top view and a cross-sectional view illustrating an example of a transistor.
Figure 13B:
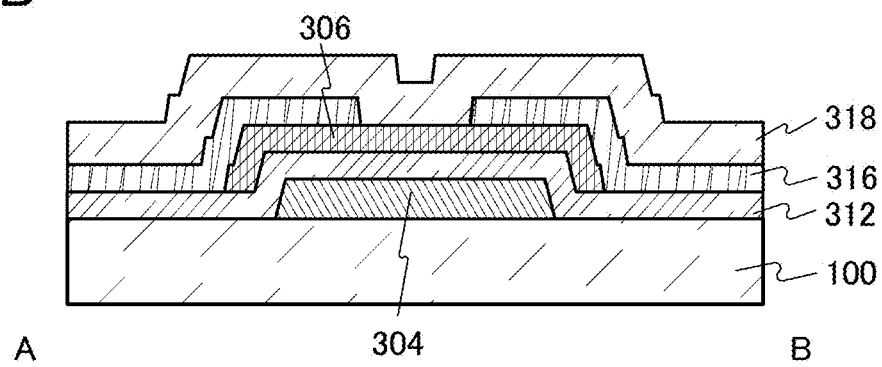

The structure of the transistor in FIGS. 13A and 13B will be described. FIG. 13A is a top view of the transistor. FIG. 13B is a cross-sectional view taken along the dashed-dotted line A-B in FIG. 13A.

The transistor in FIG. 13B includes the substrate 100, a gate electrode 304 provided over the substrate 100, a gate insulating film 312 provided to cover the gate electrode 304, an oxide semiconductor film 306 provided to overlap with the gate electrode 304 with the gate insulating film 312 provided therebetween, a pair of electrodes 316 which is provided over and at least partly in contact with the oxide semiconductor film 306, and a protective insulating film 318 provided to cover the oxide semiconductor film 306 and the pair of electrodes 316.

Note that the pair of electrodes 316, the oxide semiconductor film 306, the gate insulating film 312, and the gate electrode 304 can be formed using methods and materials similar to those of the pair of electrodes 116, the oxide semiconductor film 106, the gate insulating film 112, and the gate electrode 104, respectively.

The protective insulating film 318 can be provided using a material selected from materials similar to those of the base insulating film 102.

Figure 14A:
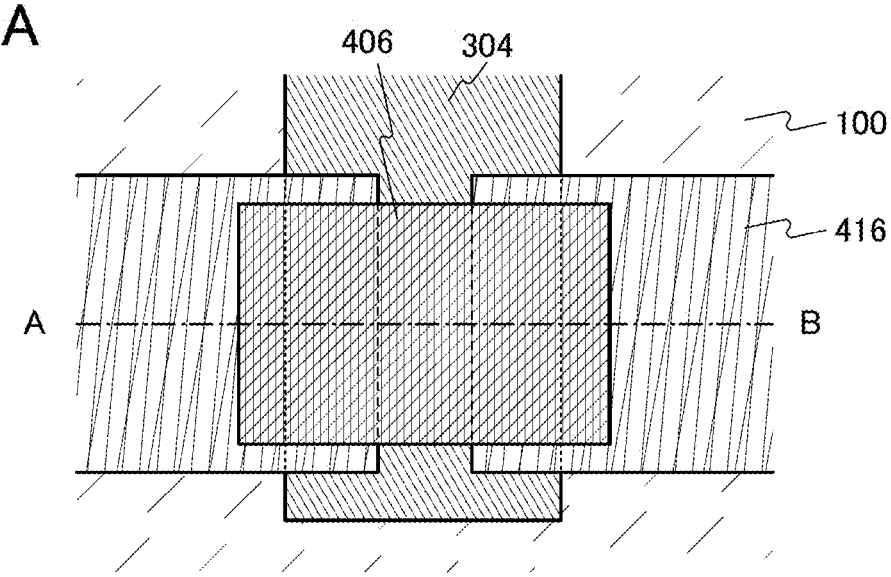
FIGS. 14A and 14B are a top view and a cross-sectional view illustrating an example of a transistor.
Figure 14B:
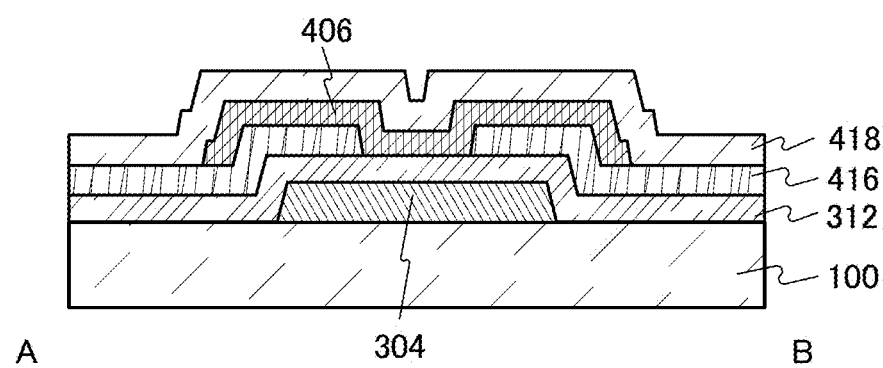

The structure of the transistor in FIGS. 14A and 14B will be described. FIG. 14A is a top view of the transistor. FIG. 14B is a cross-sectional view taken along dashed-dotted line A-B in FIG. 14A.

The transistor in FIG. 14B includes the substrate 100, the gate electrode 304 provided over the substrate 100, the gate insulating film 312 provided to cover the gate electrode 304, a pair of electrodes 416 provided over the gate insulating film 312, an oxide semiconductor film 406 which is provided over the pair of electrodes 416 and is at least partly in contact with the pair of electrodes 416 and the gate insulating film 312, and a protective insulating film 418 provided to cover the pair of electrodes 416 and the oxide semiconductor film 406.

Note that the pair of electrodes 416, the oxide semiconductor film 406, and the protective insulating film 418 can be formed using methods and materials similar to those of the pair of electrodes 116, the oxide semiconductor film 106, and the protective insulating film 318, respectively.

The manufacturing processes of the transistors illustrated in FIGS. 15A to 15C and FIGS. 16A and 16B are a little more complicated than those of the transistors illustrated in FIGS. 11A and 11B, FIGS. 12A and 12B, FIGS. 13A and 13B, and FIGS. 14A and 14B. However, a phenomenon in which a threshold voltage is shifted to a negative direction when a transistor has a shorter channel length is less likely to occur with less parasitic capacitance; therefore, the structures of the transistors in FIGS. 15A to 15C and FIGS. 16A and 16B are suitable for a minute transistor whose electric characteristics need to be excellent.

Figure 15A:
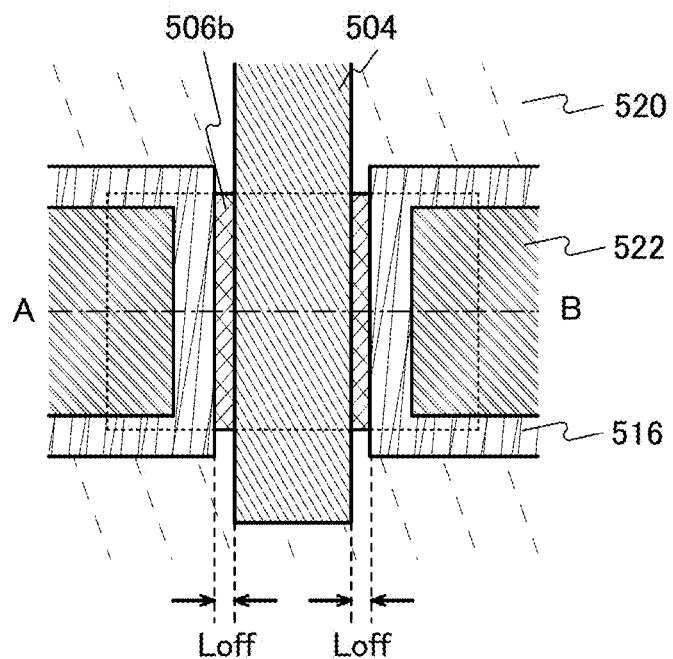
FIGS. 15A to 15C are a top view and cross-sectional views illustrating examples of a transistor.
Figure 15B:
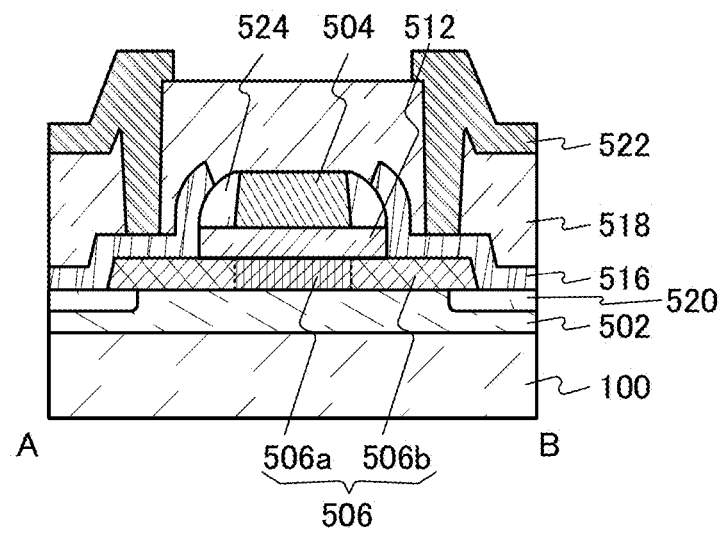
Figure 15C:
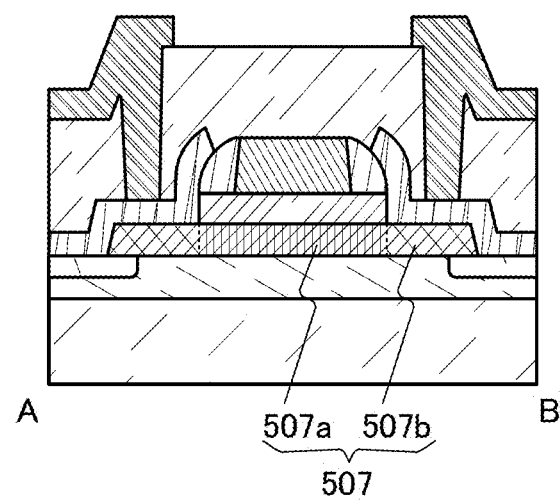

The structure of the transistor in FIGS. 15A to 15C will be described. FIG. 15A is a top view of the transistor. FIGS. 15B and 15C are each a cross-sectional view taken along the dashed-dotted line A-B in FIG. 15A.

The transistor in FIG. 15B includes the substrate 100; a base insulating film 502 provided over the substrate 100; a protective film 520 provided on the periphery of the base insulating film 502; an oxide semiconductor film 506 which is provided over the base insulating film 502 and the protective film 520 and which includes a high-resistance region 506a and low-resistance regions 506b; a gate insulating film 512 provided over the oxide semiconductor film 506; a gate electrode 504 provided to overlap with the oxide semiconductor film 506 with the gate insulating film 512 provided therebetween; sidewall insulating films 524 provided in contact with side surfaces of the gate electrode 504; a pair of electrodes 516 provided over and at least partly in contact with the oxide semiconductor film 506; a protective insulating film 518 provided to cover the gate electrode 504, the sidewall insulating films 524, and the pair of electrodes 516; and wirings 522 provided in contact with the pair of electrodes 516 through openings formed in the protective insulating film 518.

Note that the pair of electrodes 516, the gate insulating film 512, the protective insulating film 518, and the gate electrode 504 can be formed using methods and materials similar to those of the pair of electrodes 116, the gate insulating film 112, the protective insulating film 318, and the gate electrode 104, respectively.

The oxide semiconductor film 506 can be provided in a manner such that an impurity having a function of reducing the resistance value of the oxide semiconductor film is added through the gate insulating film with the use of the gate electrode 504 as a mask so that the low-resistance regions 506b are formed. At this time, a region to which the impurity is not added serves as the high-resistance region 506a. As the impurity, phosphorus, nitrogen, boron, or the like can be used. After the addition of the impurity, heat treatment for activation at a temperature higher than or equal to 250° C. and lower than or equal to 650° C. is performed. Note that an ion implantation method is preferably employed to add the impurity because, in such a case, less hydrogen enters the oxide semiconductor film compared to the case where an ion doping method is employed to add the impurity. Note that the employment of an ion doping method is not excluded.

The oxide semiconductor film 506 can alternatively be provided in a manner such that an impurity having a function of reducing the resistance value of the oxide semiconductor film is added through the gate insulating film with the use of the gate electrode 504 and the sidewall insulating films 524 as masks so that the low-resistance regions 506b are formed. At this time, a region to which the impurity is not added serves as the high-resistance region 506a. Specifically, a region overlapping with the sidewall insulating films 524 is not the low-resistance regions 506b but the high-resistance region 506a (see FIG. 15C).

Note that by addition of the impurity through the gate insulating film, damage caused at the time of addition of the impurity to the oxide semiconductor film can be reduced. However, the impurity may be implanted without passing through the gate insulating film.

The base insulating film 502 can be formed in a manner such that an insulating film formed using a method and a material similar to those of the base insulating film 102 is processed to have groove portions.

The protective film 520 can be formed in a manner such that an insulating film is formed so as to fill groove portions formed in the base insulating film 502 and then subjected to CMP treatment.

The protective film 520 can be formed to have a single-layer structure or a layered structure using one or more of silicon nitride oxide, silicon nitride, aluminum oxide, aluminum nitride, hafnium oxide, zirconium oxide, yttrium oxide, lanthanum oxide, cesium oxide, tantalum oxide, and magnesium oxide.

It is preferable that the protective film 520 do not allow permeation of oxygen even when heat treatment at a temperature higher than or equal to 250° C. and lower than or equal to 450° C., preferably higher than or equal to 150° C. and lower than or equal to 800° C. is performed for one hour, for example.

When the protective film 520 with such a property is provided on the periphery of the base insulating film 502, oxygen released from the base insulating film 502 by heat treatment can be prevented from diffusing toward the outside of the transistor. Since oxygen is held in the base insulating film 502 in this manner, the field-effect mobility of the transistor can be prevented from decreasing, a variation in threshold voltage can be reduced, and the reliability can be improved.

Note that a structure without the protective film 520 may be employed.

The sidewall insulating films 524 are formed in a manner such that an insulating film is provided to cover the gate electrode 504 and then is etched. Highly anisotropic etching is employed for the etching. The sidewall insulating films 524 can be formed in a self-aligned manner by performing a highly anisotropic etching step on the insulating film. For example, a dry etching method is preferably employed. As an etching gas used for a dry etching method, for example, a gas containing fluorine such as trifluoromethane, octafluorocyclobutane, or tetrafluoromethane can be given. A rare gas or hydrogen may be added to the etching gas. As a dry etching method, a reactive ion etching (RIE) method in which high-frequency voltage is applied to a substrate is preferably used.

The wirings 522 can be provided using a material selected from materials similar to those of the gate electrode 104.

Figure 16A:
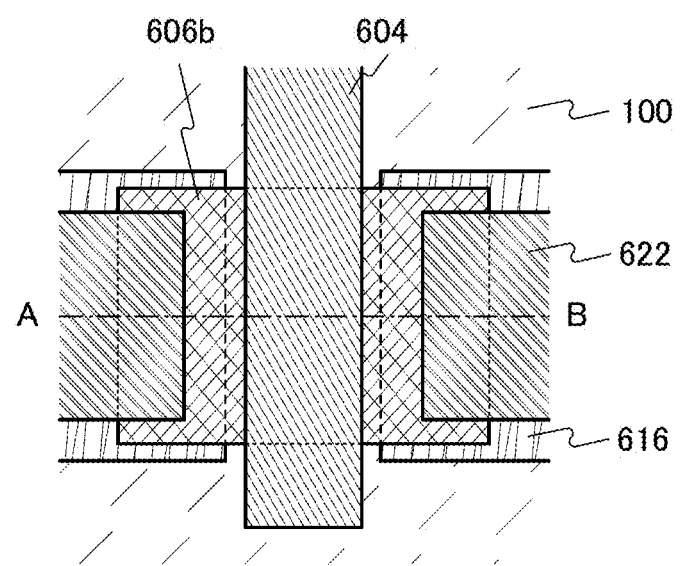
FIGS. 16A and 16B are a top view and a cross-sectional view illustrating an example of a transistor.

The structure of the transistor in FIGS. 16A and 16B will be described. FIG. 16A is a top view of the transistor. A cross-sectional view taken along the dashed-dotted line A-B in FIG. 16A is FIG. 16B.

Figure 16B:
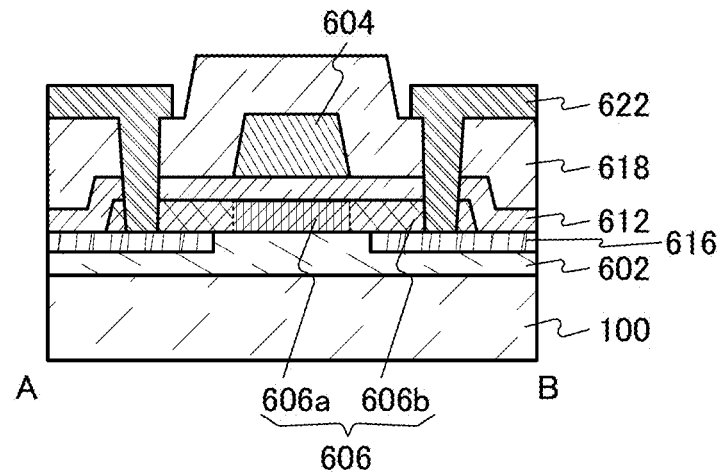

The transistor illustrated in FIG. 16B includes the substrate 100; a base insulating film 602 having groove portions, which is provided over the substrate 100; a pair of electrodes 616 provided in the groove portions of the base insulating film 602; an oxide semiconductor film 606 which is provided over the base insulating film 602 and the pair of electrodes 616 and which includes a high-resistance region 606a and low-resistance regions 606b; a gate insulating film 612 provided over the oxide semiconductor film 606; a gate electrode 604 provided to overlap with the oxide semiconductor film 606 with the gate insulating film 612 provided therebetween; a protective insulating film 618 provided to cover the gate insulating film 612 and the gate electrode 604; and wirings 622 provided in contact with the pair of electrodes 616 through openings formed in the protective insulating film 618, the gate insulating film 612, and the oxide semiconductor film 606.

Note that the gate insulating film 612, the protective insulating film 618, the oxide semiconductor film 606, the wirings 622, and the gate electrode 604 can be formed using methods and materials similar to those of the gate insulating film 112, the protective insulating film 318, the oxide semiconductor film 506, the wirings 522, and the gate electrode 104, respectively.

The base insulating film 602 can be formed in a manner such that an insulating film formed using a method and a material similar to those of the base insulating film 102 is processed to have groove portions.

The pair of electrodes 616 can be formed in a manner such that a conductive film is formed so as to fill the groove portions formed in the base insulating film 602 and then subjected to CMP treatment.

The field-effect mobility of transistors will be described below with reference to FIG. 27, FIGS. 28A to 28C, FIGS. 29A to 29C, and FIGS. 30A to 30C.

The field-effect mobility of a transistor tends to be measured lower than its intrinsic field-effect mobility for a variety of reasons; this phenomenon occurs not only in the case of using an oxide semiconductor. One of the causes for a reduction in the field-effect mobility is a defect inside a semiconductor or a defect at the interface between the semiconductor and an insulating film. Here, the field-effect mobility on the assumption that no defect exists inside the semiconductor is calculated theoretically using a Levinson model.

Assuming that the intrinsic field-effect mobility of the transistor is $\mu_0$ and a potential barrier (such as a grain boundary) exists in the semiconductor, the measured field-effect mobility $\mu$ is expressed by Formula 3.

$$\mu = \mu_0 \exp\left(-\frac{E}{kT}\right) \qquad \text{[FORMULA 3]}$$

Here, the height of the potential barrier is denoted by E, the Boltzmann constant is denoted by k, and the absolute temperature is denoted by T. Note that according to the Levinson model, the height of the potential barrier E is assumed to be attributed to a defect and is expressed by Formula 4.

$$E = \frac{e^2 N^2}{8\varepsilon n} = \frac{e^3 N^2 t}{8\varepsilon C_{ox} V_{gs}} \qquad \text{[FORMULA 4]}$$

Here, the elementary charge is denoted by e, the average defect density per unit area in a channel is denoted by N, the permittivity of the semiconductor is denoted by $\varepsilon$, the carrier density per unit area in the channel is denoted by n, the gate insulating film capacitance per unit area is denoted by $C_{ox}$, the gate voltage is denoted by $V_{gs}$, and the thickness of the channel is denoted by t. In the case where the thickness of a semiconductor layer is less than or equal to 30 nm, the thickness of the channel may be regarded as being the same as the thickness of the semiconductor layer.

The drain current $I_{ds}$ in a linear region can be expressed by Formula 5.

$$\frac{I_{ds}}{V_{gs}} = \frac{W\mu V_{ds} C_{ox}}{L} \exp\left(-\frac{E}{kT}\right) \qquad \text{[FORMULA 5]}$$

Here, the channel length is denoted by L and the channel width is denoted by W, and the channel length L and the channel width W are each 10 μm here. In addition, the drain voltage is denoted by $V_{ds}$.

When taking logarithms of both sides of Formula 5, Formula 6 can be obtained.

$$\ln\left(\frac{I_{ds}}{V_{gs}}\right) = \qquad \text{[FORMULA 6]}$$
$$\ln\left(\frac{W\mu V_{ds} C_{ox}}{L}\right) - \frac{E}{kT} = \ln\left(\frac{W\mu V_{ds} C_{ox}}{L}\right) - \frac{e^3 N^2 t}{8kT\varepsilon C_{ox} V_{gs}}$$

The right side of Formula 6 is a function of the gate voltage $V_{gs}$; thus, the defect density N can be obtained from the slope of a line in a graph which is obtained by plotting actual measured values with the value of $\ln(I_{ds}/V_{gs})$ as the ordinate and the value of $1/V_{gs}$ as the abscissa. That is, the defect density N in a semiconductor can be obtained from the $V_{gs}$-$I_{ds}$ characteristics of the transistor.

The defect density N in the semiconductor depends on a substrate temperature in deposition of the semiconductor. In the case where the semiconductor is an oxide semiconductor deposited using an In—Sn—Zn—O sputtering target having an atomic ratio of In:Sn:Zn=1:1:1, the defect density N in the oxide semiconductor is approximately $1\times10^{12}/\text{cm}^2$.

By calculation with Formula 3 and Formula 4 on the basis of the above defect density N in the oxide semiconductor, the intrinsic field-effect mobility $\mu_0$ of the transistor is determined to be 120 cm²/Vs. Thus, in an ideal transistor in which no defect exists inside the oxide semiconductor and at the interface between the oxide semiconductor and the gate insulating film that is in contact with the oxide semiconductor, the field-effect mobility $\mu_0$ is found to be 120 cm²/Vs. In contrast, in the case of using an oxide semiconductor with many defects, the field-effect mobility $\mu$ of a transistor is approximately 30 cm²/Vs.

Note that even when no defect exists inside a semiconductor, scattering at the interface between a channel and a gate insulating film affects the transport property of the transistor. The field-effect mobility $\mu_1$ at a position that is a distance x away from the interface between the channel and the gate insulating film can be expressed by Formula 7.

$$\frac{1}{\mu_1} = \frac{1}{\mu_0} + \frac{D}{B}\exp\left(-\frac{x}{l}\right) \qquad \text{[FORMULA 7]}$$

Here, the intensity of an electric field generated by the gate electrode is denoted by D, a constant is denoted by B, and the depth at which the adverse effect of scattering at the interface is caused is denoted by l. The constant B and the depth l can be obtained from actual measurement results of the electric characteristics of a transistor; according to the above measurement results of the electric characteristics of the transistor formed using an oxide semiconductor, the constant B is $4.75\times10^7$ cm/s and the depth l is 10 nm. When the intensity D is increased, i.e., when the gate voltage $V_{gs}$ is increased, the second term of Formula 7 is increased and accordingly the field-effect mobility $\mu_1$ is decreased.

Figure 27:
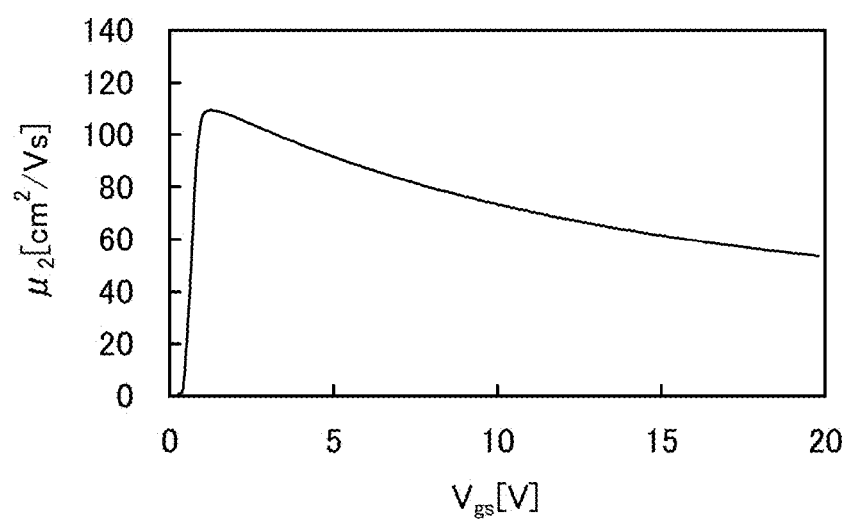
FIG. 27 shows $V_{gs}$ dependence of field-effect mobility obtained by calculation.

Calculation results of the field-effect mobility $\mu_2$ of an ideal transistor in which no defect exists in an oxide semiconductor and at the interface between the oxide semiconductor and a gate insulating film in contact with the oxide semiconductor are shown in FIG. 27. For the calculation, Sentaurus Device manufactured by Synopsys, Inc. was used, and the band gap, the electron affinity, the relative permittivity, and the thickness of the oxide semiconductor were assumed to be 2.8 eV, 4.7 eV, 15, and 15 nm, respectively. Further, the work functions of a gate, a source, and a drain were assumed to be 5.5 eV, 4.6 eV, and 4.6 eV, respectively. The thickness of a gate insulating film was assumed to be 100 nm, and the relative permittivity thereof was assumed to be 4.1. The channel length and the channel width were each assumed to be 10 μm, and the drain voltage $V_{ds}$ was assumed to be 0.1 V.

FIG. 27 reveals that the field-effect mobility $\mu_2$ has a peak of greater than or equal to 100 cm²/Vs at the gate voltage $V_{gs}$ of around 1 V and is decreased as the gate voltage $V_{gs}$ becomes higher because the influence of interface scattering is increased.

Calculation results in the case where such an ideal transistor is miniaturized are shown in FIGS. 28A to 28C, FIGS. 29A to 29C, and FIGS. 30A to 30C. Note that the calculation is performed assuming that transistors having the structures illustrated in FIGS. 15A to 15C are used.

Here, the resistivity of the low-resistance region 506b was assumed to be $2 \times 10^{-3}$ Ωcm, and the width of the gate electrode 504, that of the sidewall insulating film 524, and the channel width were assumed to be 33 nm, 5 nm, and 40 nm, respectively. Note that although the channel region is referred to as high-resistance region 506a for convenience, the channel region was assumed here to be an intrinsic semiconductor.

Figure 28A:
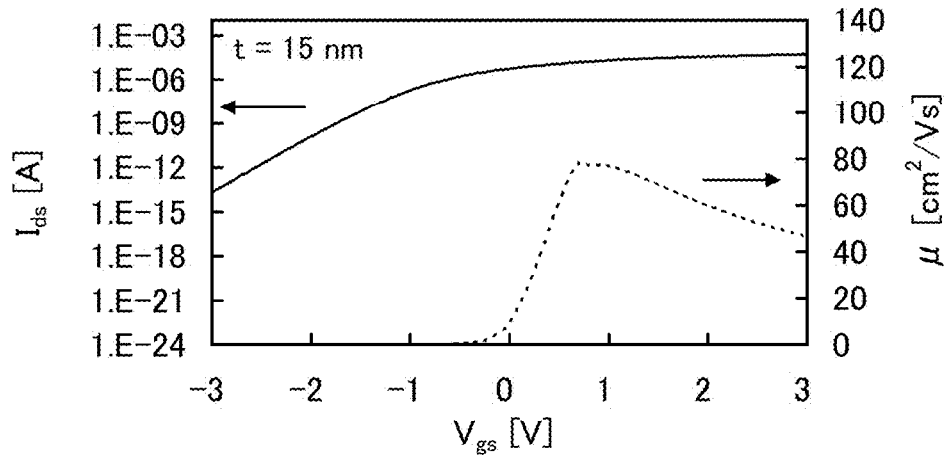
FIGS. 28A to 28C show $V_{gs}$ dependence of a drain current $I_{ds}$ and field-effect mobility obtained by calculation.
Figure 28B:
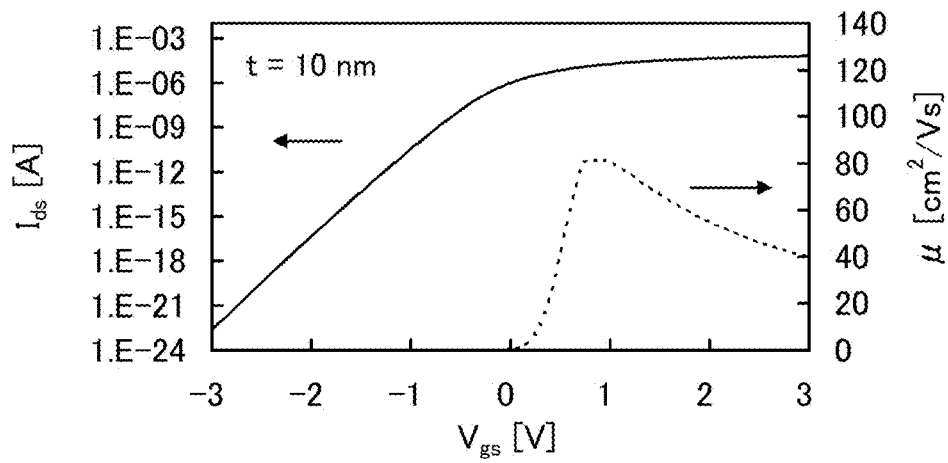
Figure 28C:
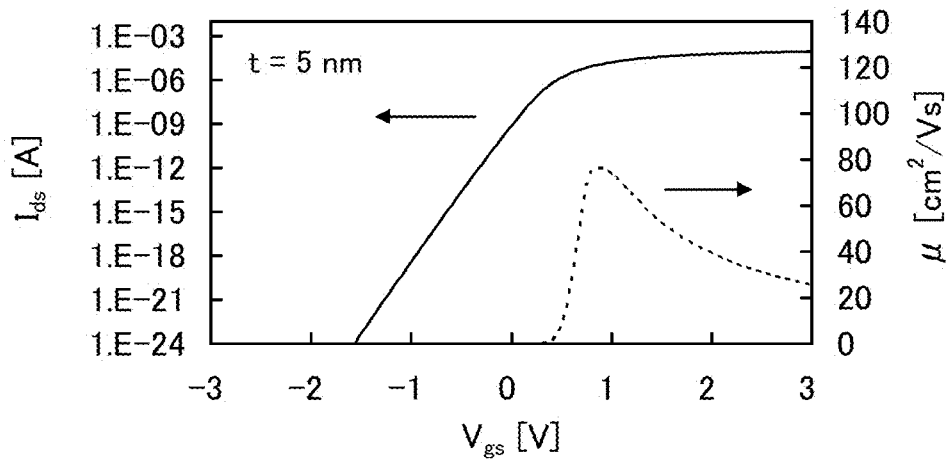

For the calculation, Sentaurus Device manufactured by Synopsys, Inc. was used. FIGS. 28A to 28C show $V_{gs}$ dependence of the drain current $I_{ds}$ (solid line) and the field-effect mobility μ (dotted line) of the transistor having the structure illustrated in FIG. 15B. The drain current $I_{ds}$ was obtained by calculation under the assumption that the drain voltage $V_{ds}$ was 1 V, and the field-effect mobility μ was obtained by calculation under the assumption that the drain voltage $V_{ds}$ is 0.1 V. FIG. 28A shows the results where the thickness of the gate insulating film was 15 nm, FIG. 28B shows the results where the thickness of the gate insulating film was 10 nm, and FIG. 28C shows the results where the thickness of the gate insulating film was 5 nm.

FIGS. 28A to 28C show that as the gate insulating film becomes thinner, the drain current $I_{ds}$ in an off state (here, in the range of the gate voltage $V_{gs}$ from −3 V to 0 V) decreases. On the other hand, there is no noticeable change in the peak value of the field-effect mobility μ and the drain current $I_{ds}$ in an on state (here, in the range of the gate voltage $V_{gs}$ from 0 V to 3 V). FIGS. 28A to 28C show that the drain current $I_{ds}$ exceeds 10 μA, which is requisite for a memory and the like that are semiconductor devices, at the gate voltage $V_{gs}$ of around 1 V.

In a similar manner, the calculation was also conducted on the transistor illustrated in FIG. 15C. The transistor in FIG. 15C is different from the transistor illustrated in FIG. 15B in that an oxide semiconductor film 507 including a high-resistance region 507a and low-resistance regions 507b is provided. Specifically, in the transistor in FIG. 15C, a region of the oxide semiconductor film 507, which overlaps with the sidewall insulating film 524, is included in the high-resistance region 507a. In other words, the transistor has an offset region whose width is the same as the width of the sidewall insulating film 524. Note that the width of the offset region is also referred to as an offset length ($L_{off}$) (see FIG. 15A). Note that the offset length $L_{off}$ on the right side is the same as the offset length $L_{off}$ on the left side for the sake of convenience.

Figure 29A:
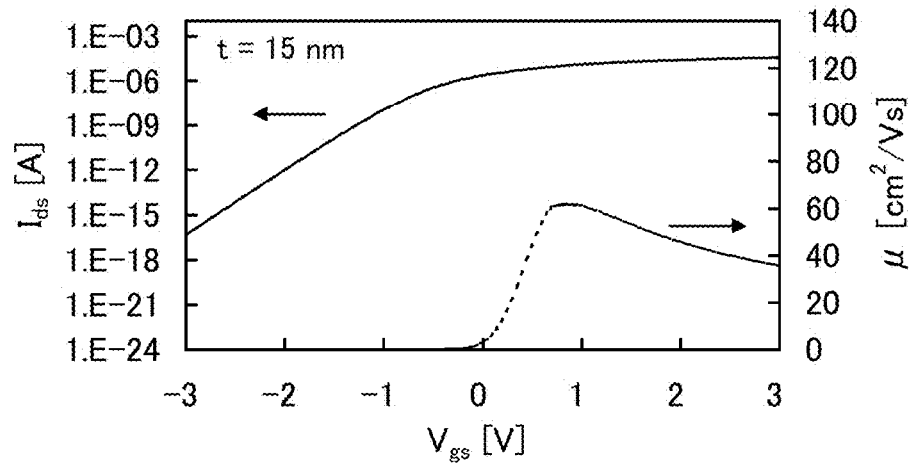
FIGS. 29A to 29C show $V_{gs}$ dependence of a drain current $I_{ds}$ and field-effect mobility obtained by calculation.
Figure 29B:
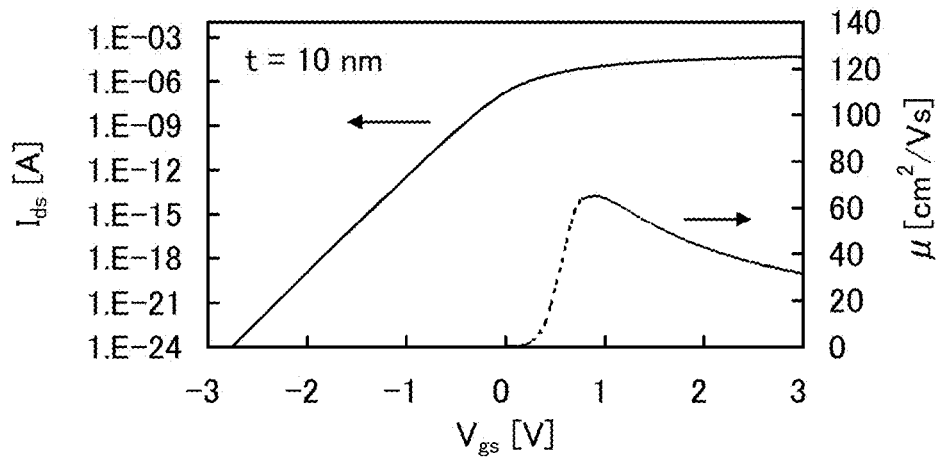
Figure 29C:
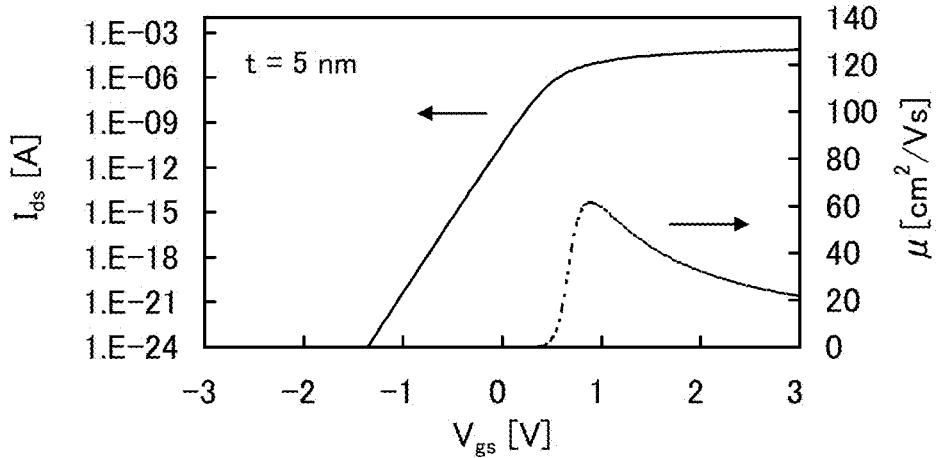

FIGS. 29A to 29C show $V_{gs}$ dependence of the drain current $I_{ds}$ (solid line) and the field-effect mobility μ (dotted line) of the transistor in FIG. 15C in which the offset length $L_{off}$ is 5 nm. Note that the drain current $I_{ds}$ was calculated under the assumption that the drain voltage $V_{ds}$ was 1 V, and the field-effect mobility μ was calculated under the assumption that the drain voltage $V_{ds}$ was 0.1 V. FIG. 29A shows the results where the thickness of the gate insulating film was 15 nm, FIG. 29B shows the results where the thickness of the gate insulating film was 10 nm, and FIG. 29C shows the results where the thickness of the gate insulating film was 5 nm.

Figure 30A:
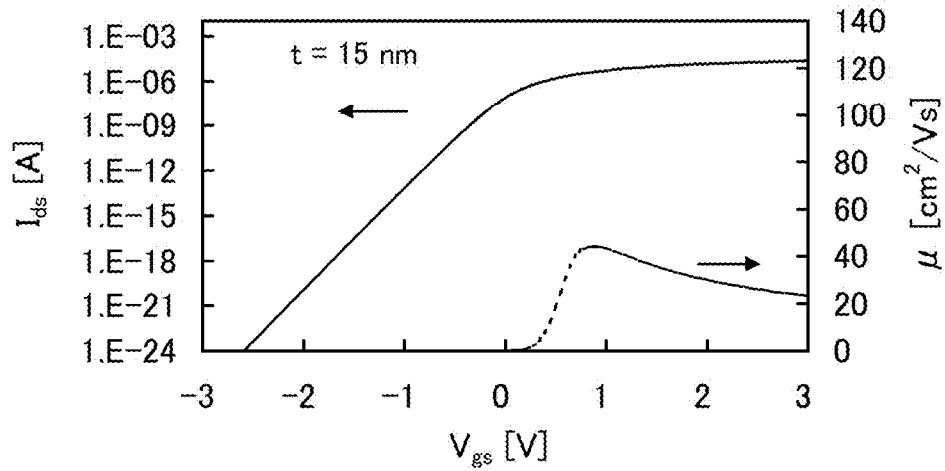
FIGS. 30A to 30C show $V_{gs}$ dependence of a drain current $I_{ds}$ and field-effect mobility obtained by calculation.
Figure 30B:
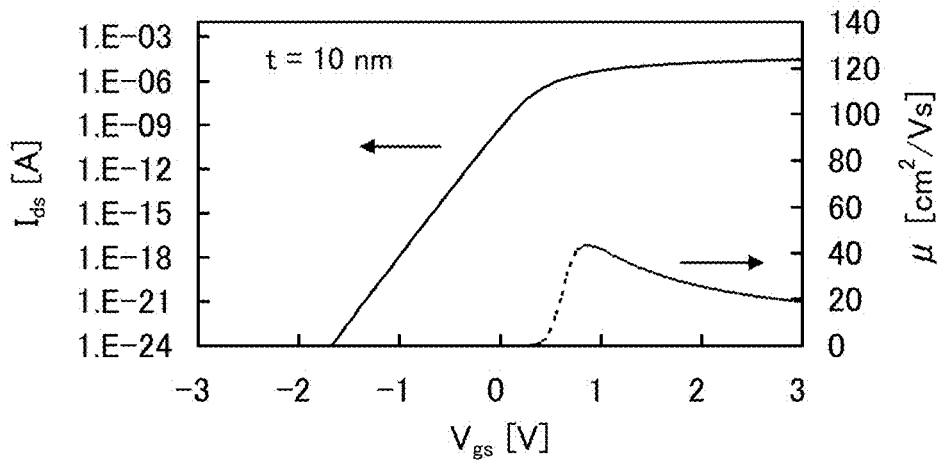
Figure 30C:
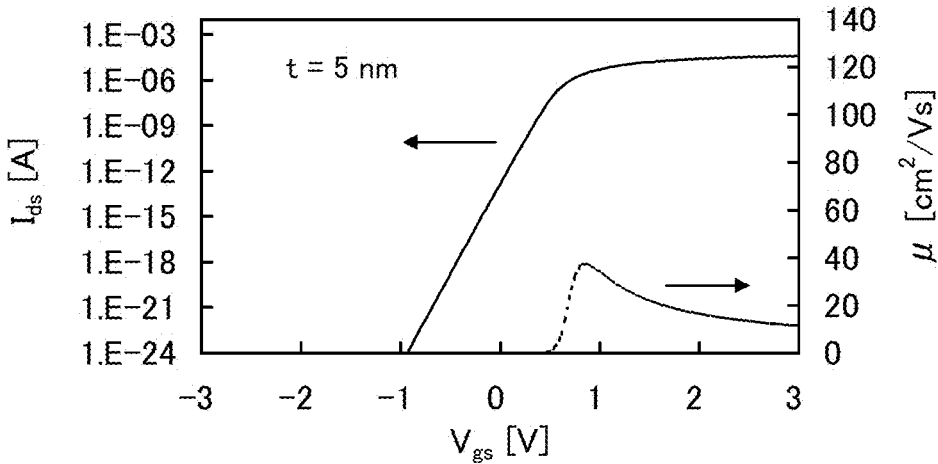

FIGS. 30A to 30C show $V_{gs}$ dependence of the drain current $I_{ds}$ (solid line) and the field-effect mobility μ (dotted line) of the transistor in FIG. 15C in which the offset length $L_{off}$ is 15 nm. Note that the drain current $I_{ds}$ was calculated under the assumption that the drain voltage $V_{ds}$ was 1 V, and the field-effect mobility μ was calculated under the assumption that the drain voltage $V_{ds}$ was 0.1 V. FIG. 30A shows the results where the thickness of the gate insulating film was 15 nm, FIG. 30B shows the results where the thickness of the gate insulating film was 10 nm, and FIG. 30C shows the results where the thickness of the gate insulating film was 5 nm.

The calculation results in FIGS. 29A to 29C and FIGS. 30A to 30C show that as the gate insulating film becomes thinner, the drain current $I_{ds}$ in an off state (here, in the range of the gate voltage $V_{gs}$ from −3 V to 0 V) decreases, in a manner similar to that in FIGS. 28A to 28C. On the other hand, there is no noticeable change in the peak value of the field-effect mobility μ and the drain current $I_{ds}$ in an on state (here, in the range of the gate voltage $V_{gs}$ from 0 V to 3 V).

The peak of the field-effect mobility μ is approximately 80 cm²/Vs in FIGS. 28A to 28C, approximately 60 cm²/Vs in FIGS. 29A to 29C, and approximately 40 cm²/Vs in FIGS. 30A to 30C. These results show that the peak of the mobility μ is decreased as the offset length $L_{off}$ is increased and the same applies to the drain current $I_{ds}$ in an off state. The drain current $I_{ds}$ in an on state is also decreased as the offset length $L_{off}$ is increased; however, the decrease in the drain current $I_{ds}$ in an on state is much more gradual than the decrease in the drain current $I_{ds}$ in an off state. Further, all of the calculation results reveal that the drain current $I_{ds}$ exceeds 10 μA, which is requisite for a memory and the like, at the gate voltage $V_{gs}$ of around 1 V.

Next, the electric characteristics of a transistor formed using an oxide semiconductor will be described.

Figure 31A:
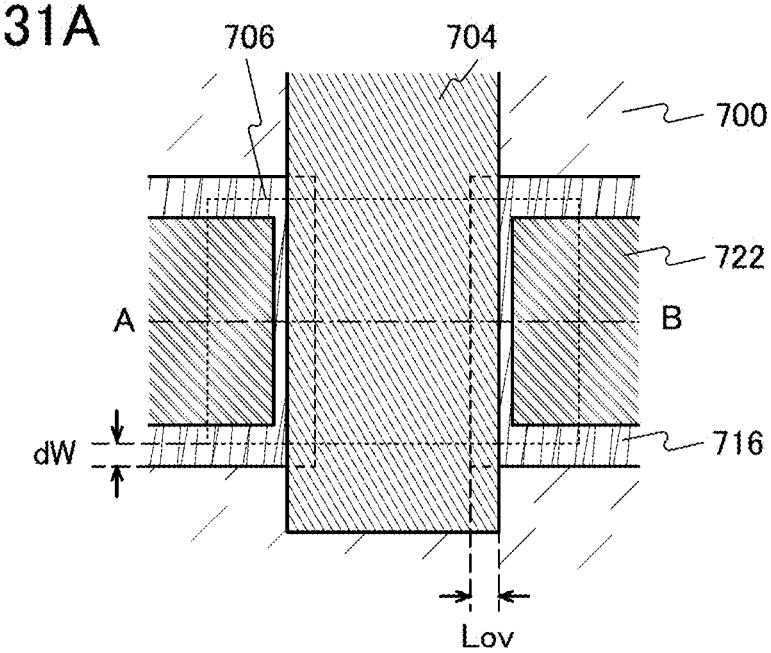
FIGS. 31A and 31B are a top view and cross-sectional view illustrating an example of a transistor.
Figure 31B:
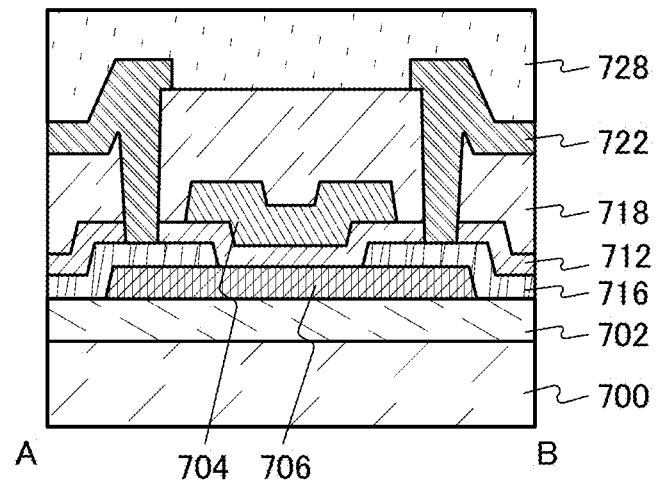

FIGS. 31A and 31B are a top view illustrating a structure of each of formed transistors (Sample 1 and Sample 2) and a cross-sectional view taken along the dashed-dotted line A-B in FIG. 31A.

The transistor in FIG. 31B includes a substrate 700, a base insulating film 702 provided over the substrate 700, an oxide semiconductor film 706 provided over the base insulating film 702, a pair of electrodes 716 provided in contact with the oxide semiconductor film 706, a gate insulating film 712 provided over the oxide semiconductor film 706 and the pair of electrodes 716, a gate electrode 704 provided to overlap with the oxide semiconductor film 706 with the gate insulating film 712 provided therebetween, an interlayer insulating film 718 covering the gate insulating film 712 and the gate electrode 704, wirings 722 connected to the pair of electrodes 716 through openings formed in the interlayer insulating film 718, and a protective insulating film 728 covering the interlayer insulating film 718 and the wirings 722.

As the substrate 700, a glass substrate was used. As the base insulating film 702, a silicon oxide film was used. As the oxide semiconductor film 706, an In—Sn—Zn—O film was used. As the pair of electrodes 716, a tungsten film was used. As the gate insulating film 712, a silicon oxide film was used. The gate electrode 704 had a layered structure of a tantalum nitride film and a tungsten film. The interlayer insulating film 718 had a layered structure of a silicon oxynitride film and a polyimide film. The wiring 722 had a layered structure in which a titanium film, an aluminum film, and a titanium film were formed in this order. As the protective insulating film 728, a polyimide film was used.

Note that in the transistor having the structure in FIG. 31A, the width of a portion where the gate electrode 704 overlaps with one of the pair of electrodes 716 is referred to as a width Lov. In a similar manner, the width of a portion of the pair of electrodes 716, which does not overlap with the oxide semiconductor film 706, is referred to as a width dW.

Methods for forming the transistors (samples 1 and 2) each having the structure in FIG. 31B will be described below.

First, plasma treatment was performed on a surface of the substrate 700 in an argon atmosphere. The plasma treatment was carried out with a sputtering apparatus by applying 200 W of bias power (RF) to the substrate 700 side for 3 minutes.

Subsequently, without breaking the vacuum, the silicon oxide film as the base insulating film 702 was formed to a thickness of 300 nm.

The silicon oxide film was deposited with a sputtering apparatus with 1500 W of power (RF) in an oxygen atmosphere. A quartz sputtering target was used as a sputtering target. The substrate temperature at the time of the deposition was set to 100° C.

A top surface of the base insulating film 702 was subjected to CMP treatment to be planarized such that the average surface roughness Ra was about 0.2 nm.

Then, the In—Sn—Zn—O film as the oxide semiconductor film was deposited to have a thickness of 15 nm.

The In—Sn—Zn—O film was deposited with a sputtering apparatus with 100 W of power (DC) in a mixed atmosphere having a volume ratio of argon to oxygen which is 2:3. An In—Sn—Zn—O target having an atomic ratio of In:Sn:Zn=1:1:1 was used as a sputtering target. The substrate temperature at the time of the deposition was set to 200° C.

Then, heat treatment at 650° C. was performed only on the sample 2. As the heat treatment, heat treatment in a nitrogen atmosphere was first performed for 1 hour and then heat treatment in an oxygen atmosphere was performed for 1 hour while keeping the temperature.

The oxide semiconductor film was processed through a photolithography process, so that the oxide semiconductor film 706 was formed.

Next, a tungsten film was deposited to a thickness of 50 nm.

The tungsten film was deposited with a sputtering apparatus with 1000 W of power (DC) in an argon atmosphere. The substrate temperature at the time of the deposition was set to 200° C.

The tungsten film was processed through a photolithography process so that the pair of electrodes 716 was formed.

Then, a silicon oxide film to be used as the gate insulating film 712 was deposited to a thickness of 100 nm. The relative permittivity of the silicon oxide film was set to 3.8.

The silicon oxide film as the gate insulating film 712 was deposited in a manner similar to that of the base insulating film 702.

Next, a tantalum nitride film and a tungsten film were deposited in this order to have thicknesses of 15 nm and 135 nm, respectively.

The tantalum nitride film was deposited with a sputtering apparatus with 1000 W of power (DC) in a mixed atmosphere having a volume ratio of argon to oxygen which is 5:1. Substrate heating was not performed at the time of the deposition.

The tungsten film was deposited with a sputtering apparatus with 4000 W of power (DC) in an argon atmosphere. The substrate temperature at the time of the deposition was set to 200° C.

The tantalum nitride film and the tungsten film were processed through a photolithography process, so that the gate electrode 704 was formed.

Next, a silicon oxynitride film to be used as a part of the interlayer insulating film 718 was deposited to a thickness of 300 nm.

The silicon oxynitride film to be part of the interlayer insulating film 718 was formed with a PCVD apparatus with 35 W of power (RF) in a mixed atmosphere having a volume ratio of monosilane to nitrous oxide which is 1:200. The substrate temperature at the time of the deposition was set to 325° C.

The silicon oxynitride film to be part of the interlayer insulating film 718 was processed through a photolithography process.

Then, photosensitive polyimide to be used as a part of the interlayer insulating film 718 was deposited to a thickness of 1500 nm.

The photosensitive polyimide to be part of the interlayer insulating film 718 was exposed to light with the use of a photomask used in the photolithography process performed on the silicon oxynitride film, developed, and then subjected to heat treatment so that the photosensitive polyimide film was hardened. In this manner, the interlayer insulating film 718 was formed of the silicon oxynitride film and the photosensitive polyimide film. The heat treatment was performed at 300° C. in a nitrogen atmosphere.

Next, a titanium film, an aluminum film, and a titanium film were deposited in this order to thicknesses of 50 nm, 100 nm, and 5 nm, respectively.

The two titanium films were deposited with a sputtering apparatus with 1000 W of power (DC) in an argon atmosphere. Substrate heating was not performed at the time of the deposition.

The aluminum film was deposited with a sputtering apparatus with 1000 W of power (DC) in an argon atmosphere. Substrate heating was not performed at the time of the deposition.

The titanium film, the aluminum film, and the titanium film were processed through a photolithography process, so that the wirings 722 were formed.

Next, the photosensitive polyimide film as the protective insulating film 728 was deposited to a thickness of 1500 nm.

The photosensitive polyimide film was exposed to light with the use of a photomask used in the photolithography process performed on the wirings 722, and developed, so that openings exposing the wirings 722 were formed in the protective insulating film 728.

Then, heat treatment was performed so that the photosensitive polyimide film was hardened. The heat treatment was performed in a manner similar to that of the heat treatment performed on the photosensitive polyimide film as the interlayer insulating film 718.

Through the above process, the transistor having the structure illustrated in FIG. 31B was formed.

Next, the electric characteristics of the transistor having the structure in FIG. 31B were evaluated.

Figure 32A:
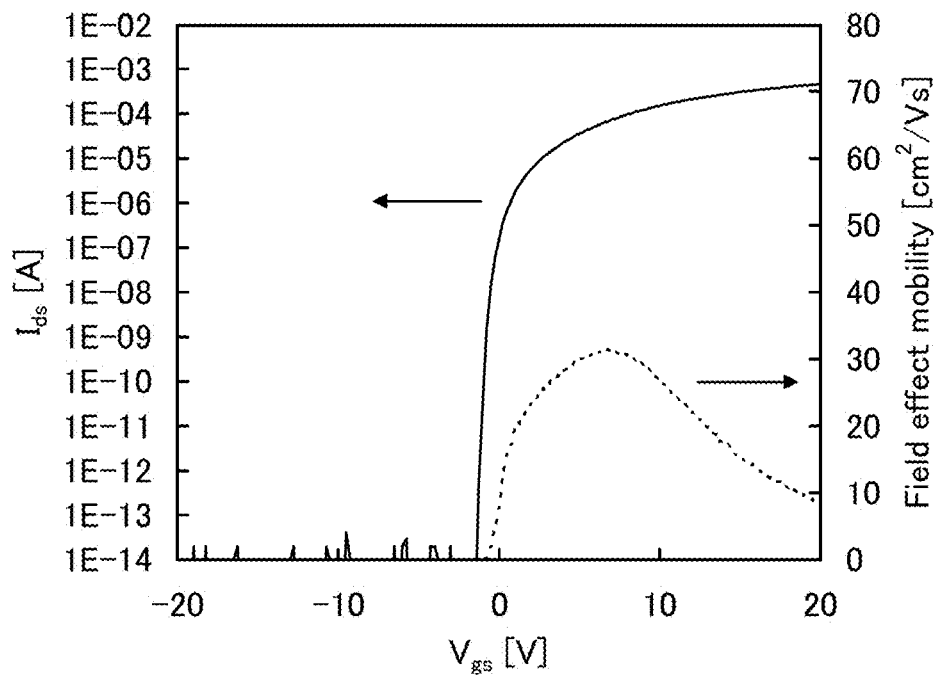
FIGS. 32A and 32B show $V_{gs}$-$I_{ds}$ characteristics and field-effect mobility of transistors of samples 1 and 2.
Figure 32B:
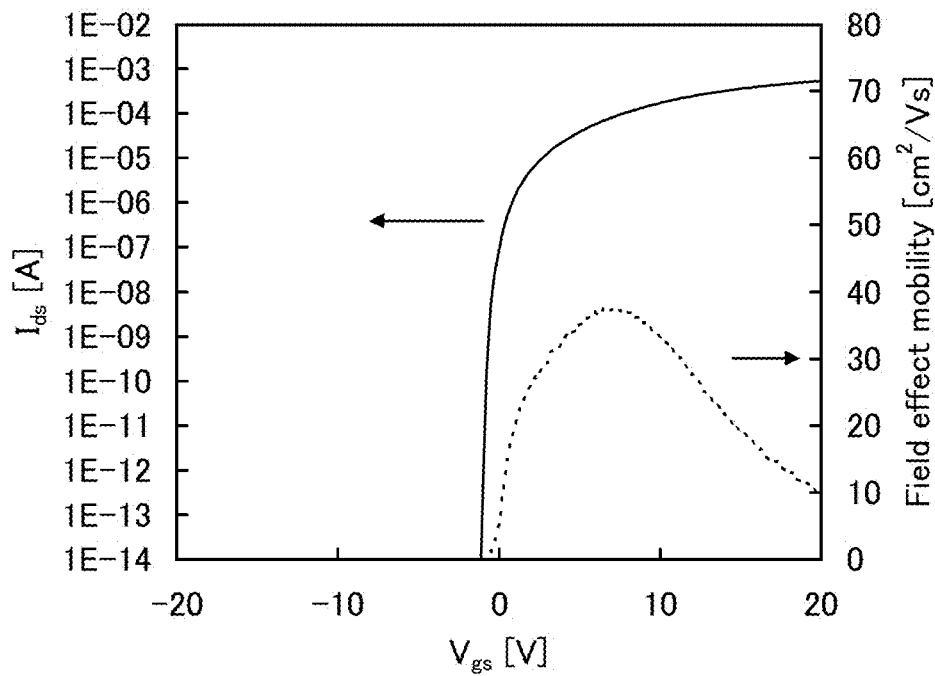

Here, $V_{gs}$-$I_{ds}$ characteristics of the transistor having the structure in FIG. 31B were measured; the results of the sample 1 are shown in FIG. 32A, and the results of the sample 2 are shown in FIG. 32B. The transistors used for the measurement each have a channel length L of 3 µm, a channel width W of 10 µm, a width Lov of 3 µm per side (6 µm in total), and a width dW of 3 µm per side (6 µm in total). The drain voltage $V_{ds}$ was set to 10 V.

Comparing the samples 1 and 2, it is found that the field-effect mobility of the transistor was increased by performing heat treatment after deposition of the oxide semiconductor film. The inventors deemed that the increase in field-effect mobility of the transistor might result from a reduction in impurity concentration in the oxide semiconductor film by the heat treatment. Accordingly, it is understood that the impurity concentration in the oxide semiconductor film was reduced by the heat treatment performed after the oxide semiconductor film was deposited, resulting in the field-effect mobility of the transistor close to ideal field-effect mobility.

Thus, the results suggest that the impurity concentration in an oxide semiconductor film might be reduced by performing heat treatment after deposition of the oxide semiconductor film, resulting in an increase in field-effect mobility of a transistor.

Next, BT tests were performed on the samples 1 and 2. The BT tests will be described below.

First, $V_{gs}$-$I_{ds}$ characteristics of the transistors were measured at a substrate temperature of 25° C. and a drain voltage $V_{ds}$ of 10 V. Note that a drain voltage (a potential difference between a drain and a source) is denoted by $V_{ds}$. Then, the substrate temperature was set to 150° C. and the drain voltage $V_{ds}$ was set to 0.1 V. After that, 20 V of the gate voltage $V_{gs}$ was applied so that the intensity of an electric field applied to the gate insulating films was 2 MV/cm, and the condition was kept for one hour. Next, the gate voltage $V_{gs}$ was set to 0 V. Then, $V_{gs}$-$I_{ds}$ characteristics of the transistors were measured at a substrate temperature of 25° C. and the drain voltage $V_{ds}$ of 10 V. This process is called a positive BT test.

In a similar manner, first, $V_{gs}$-$I_{ds}$ characteristics of the transistors were measured at a substrate temperature of 25° C. and the drain voltage $V_{ds}$ of 10 V. Then, the substrate temperature was set to 150° C. and the drain voltage $V_{ds}$ was set to 0.1 V. After that, −20 V of the gate voltage $V_{gs}$ was applied so that the intensity of an electric field applied to the gate insulating films was −2 MV/cm, and the condition was kept for one hour. Next, the gate voltage $V_{gs}$ was set to 0 V. Then, $V_{gs}$-$I_{ds}$ characteristics of the transistors were measured at a substrate temperature of 25° C. and the drain voltage $V_{ds}$ of 10 V. This process is called a negative BT test.

Figure 33A:
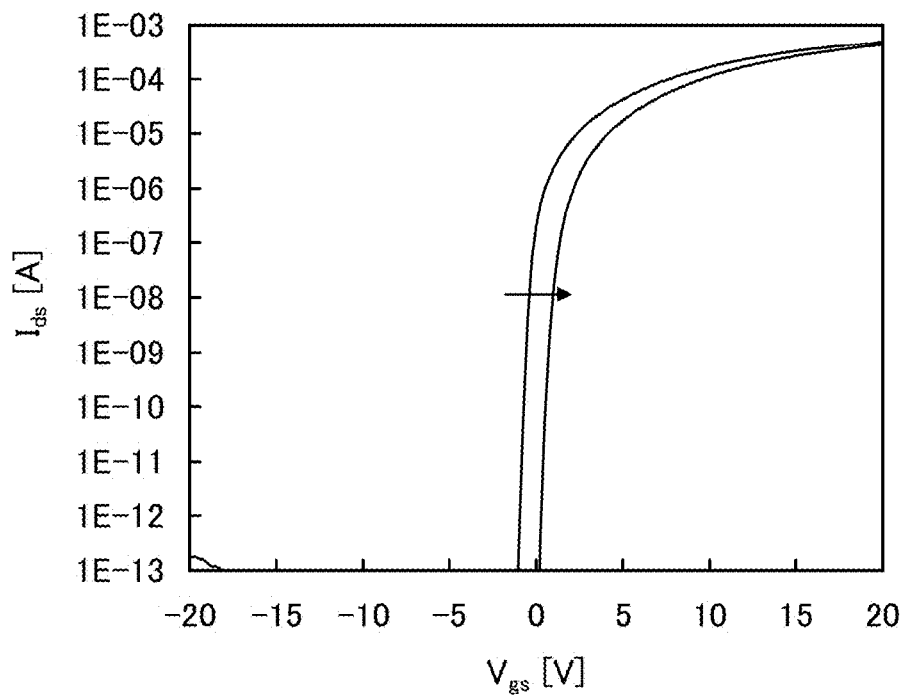
FIGS. 33A and 33B show $V_{gs}$-$I_{ds}$ characteristics of a transistor of a sample 1 before and after BT tests.
Figure 33B:
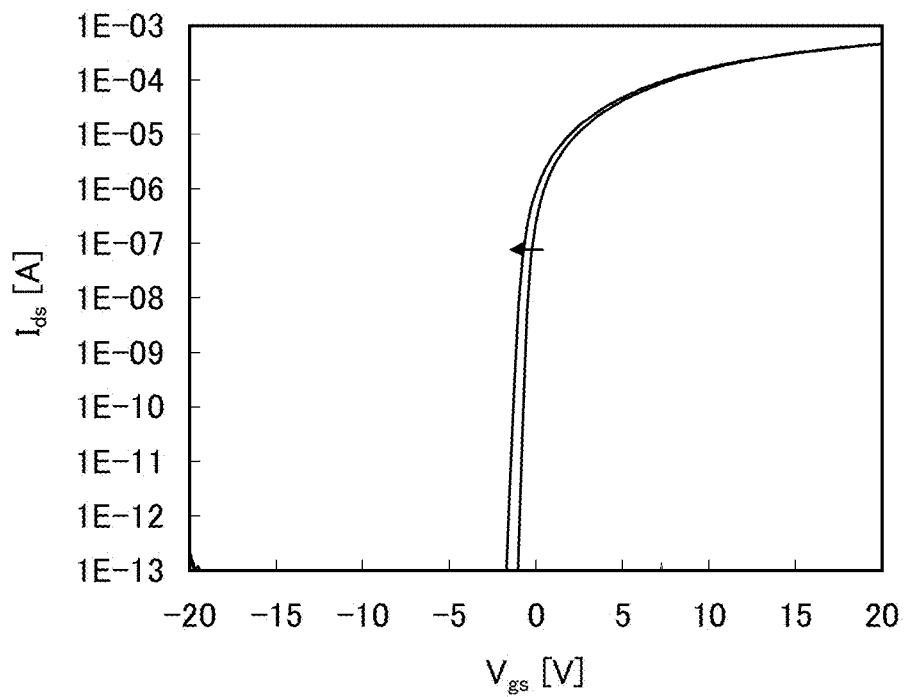
Figure 34A:
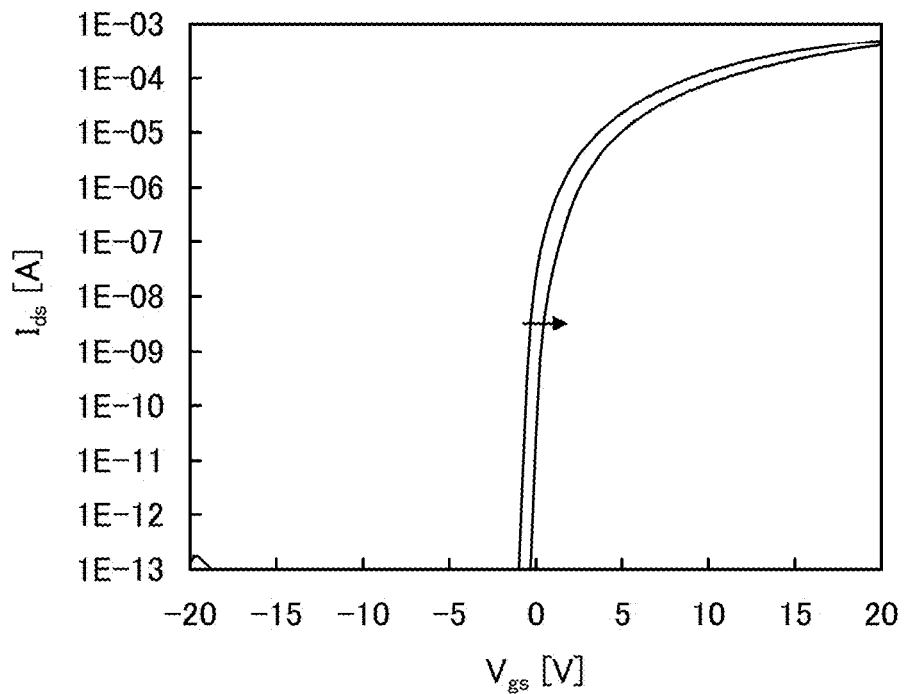
FIGS. 34A and 34B show $V_{gs}$-$I_{ds}$ characteristics of a transistor of a sample 2 before and after BT tests.
Figure 34B:
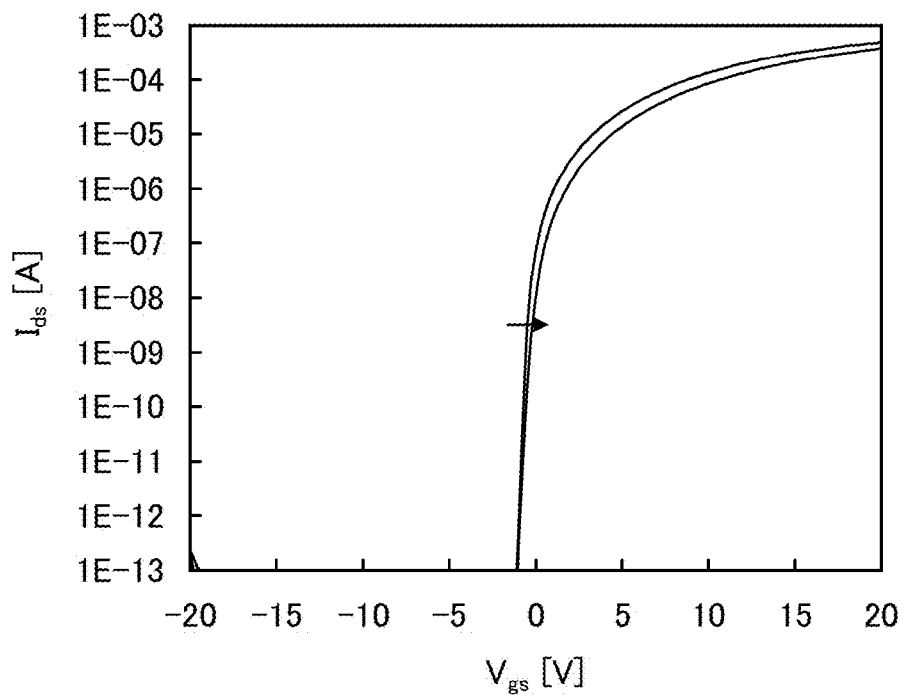

FIGS. 33A and 33B show a result of the positive BT test of the sample 1 and a result of the negative BT test of the sample 1, respectively. FIGS. 34A and 34B show a result of the positive BT test of the sample 2 and a result of the negative BT test of the sample 2, respectively. Note that arrows are used in the graphs to clearly show changes in $V_{gs}$-$I_{ds}$ characteristics between before and after the BT tests.

The amount of shift in the threshold voltage of the sample 1 due to the positive BT test and that due to the negative BT test were 1.80 V and −0.42 V, respectively. The amount of shift in the threshold voltage of the sample 2 due to the positive BT test and that due to the negative BT test were 0.79 V and 0.76 V, respectively.

It is found that, in each of the samples 1 and 2, the amount of shift in the threshold voltage between before and after the BT tests is small and the samples are highly reliable transistors.

Next, the relation between the substrate temperature and electric characteristics of the transistor of the sample 2 was evaluated.

The transistor used for the measurement has a channel length L of 3 µm, a channel width W of 10 µm, a width Lov of 3 µm on one side (total Lov of 6 µm), and a width dW of 0 µm. Note that the drain voltage $V_{ds}$ was set to 10 V. The substrate temperature was −40° C., −25° C., 25° C., 75° C., 125° C., and 150° C.

Figure 35A:
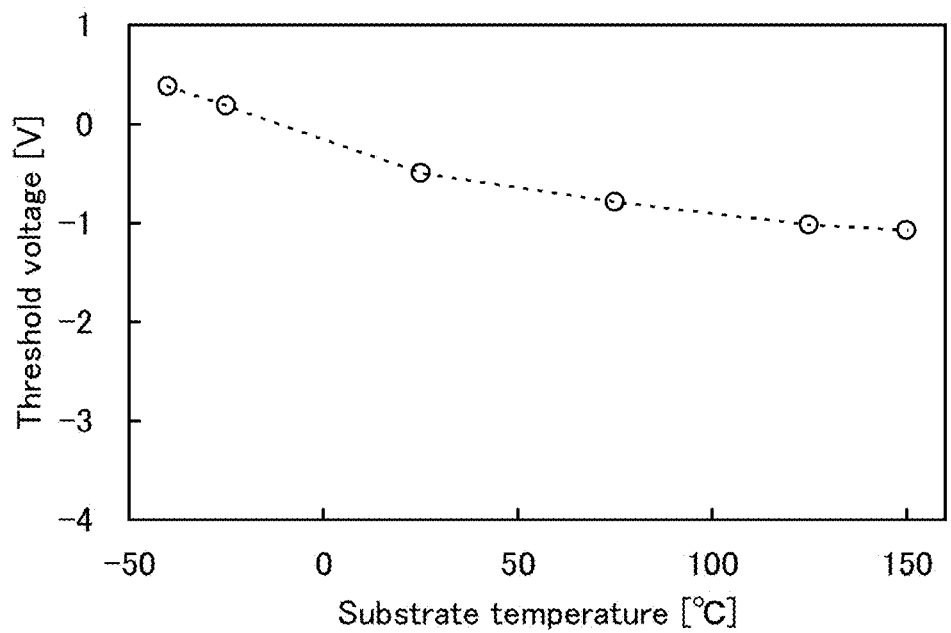
FIGS. 35A and 35B are show a relation between the substrate temperature and the threshold voltage and a relation between the substrate temperature and the field-effect mobility of a transistor of a sample 2.
Figure 35B:
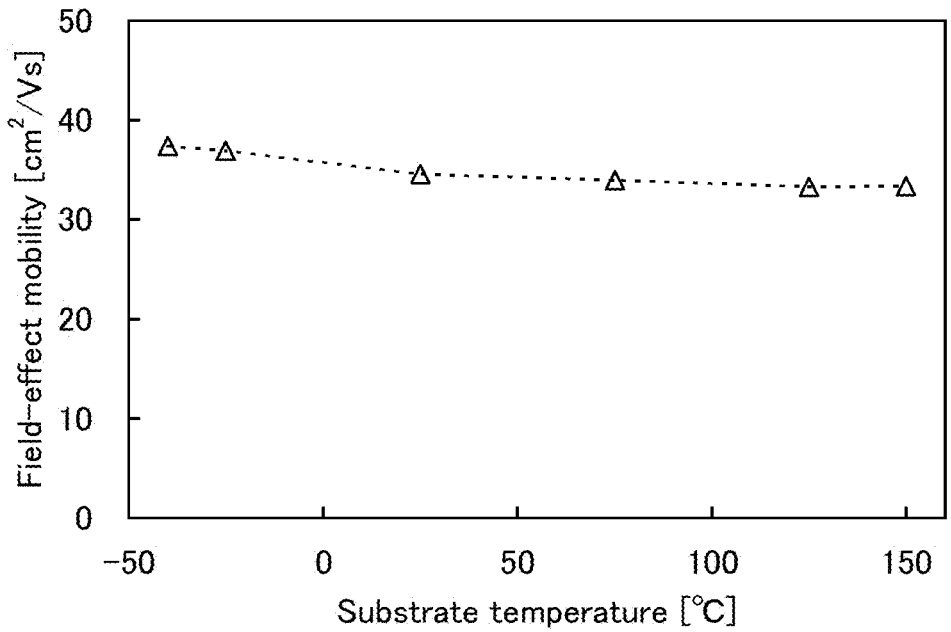

FIG. 35A shows the relation between the substrate temperature and the threshold voltage, and FIG. 35B shows the relation between the substrate temperature and the field-effect mobility.

From FIG. 35A, it is found that the threshold voltage gets lower as the substrate temperature increases. Note that the threshold voltage is decreased from 0.38 V to −1.08 V in the range from −40° C. to 150° C.

From FIG. 35B, it is found that the field-effect mobility gets lower as the substrate temperature increases. Note that the mobility is decreased from 37.4 cm$^2$/Vs to 33.4 cm$^2$/Vs in the range from −40° C. to 150° C.

Thus, it is found that variation in electric characteristics of the sample 2 is small in the above temperature range.

It is also found that the transistor described above has a high field-effect mobility and thus is highly reliable.

In a similar manner, the off-state current per micrometer in channel width of a transistor applicable to a memory element according to one embodiment of the present invention was evaluated.

A sample was formed by a method similar to that of the sample 2. Note that the transistor used for the measurement has a channel length L of 3 µm, a channel width W of 10 cm, a width Lov of 2 µm, and a width dW of 0 µm.

Figure 36:
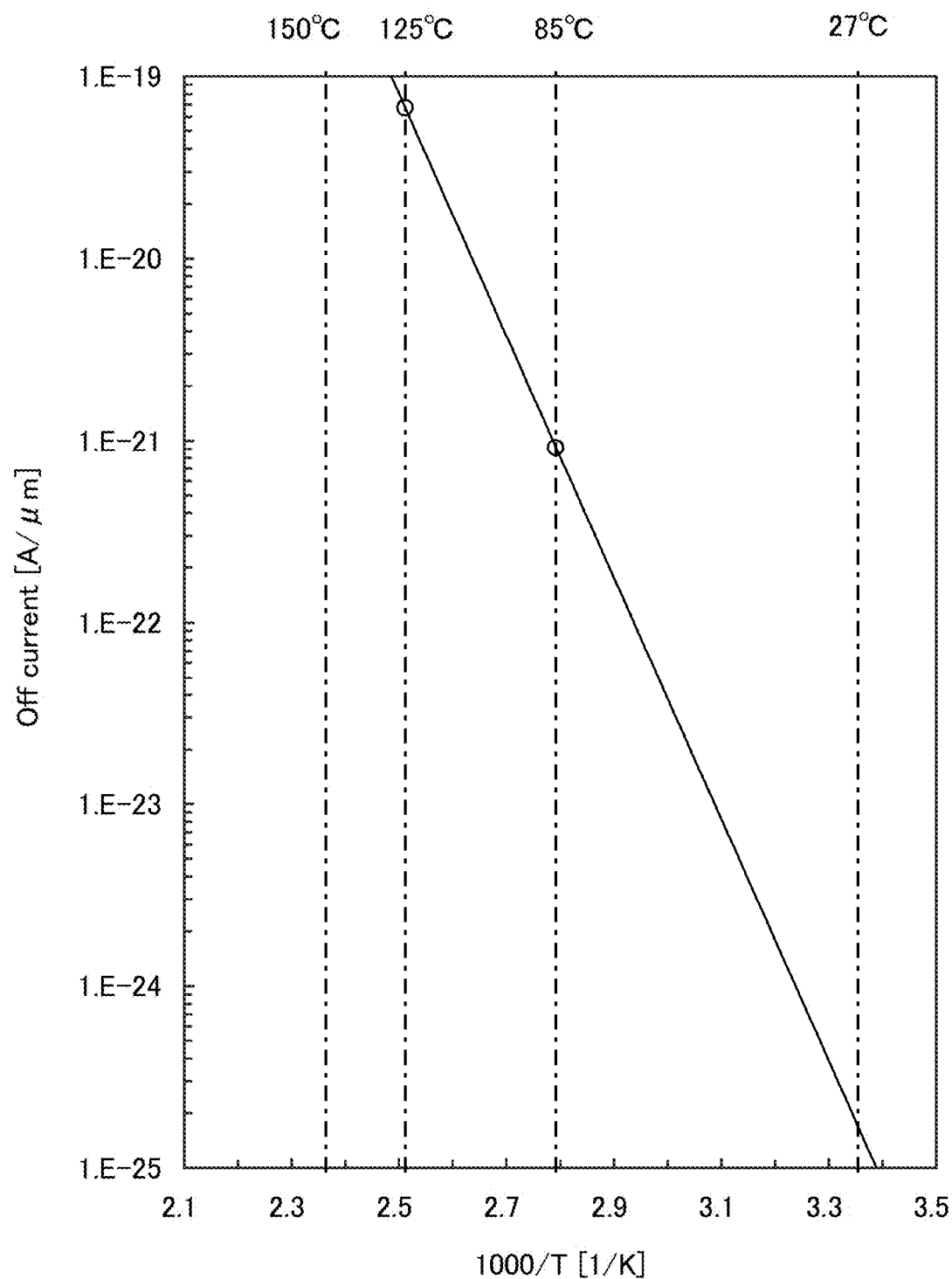
FIG. 36 shows the off-state current of a transistor formed using an oxide semiconductor film.

FIG. 36 shows the relation between the off-state current of a transistor and the inverse of substrate temperature (absolute temperature) at measurement of the off-state current. In FIG. 36, the horizontal axis represents a value (1000/T) obtained by multiplying an inverse of substrate temperature at measurement by 1000, for the sake of simplicity.

A method for measuring the off-state current of the transistor will be briefly described below. Here, the transistor used for the measurement is called a first transistor for the sake of convenience.

A drain of the first transistor is connected to a floating gate FG, and the floating gate FG is connected to a gate of a second transistor.

First, the first transistor is turned off and then, electric charge is applied to the floating gate FG. Note that a constant drain voltage is applied to the second transistor.

At this time, the electric charge of the floating gate FG gradually leaks through the first transistor. When the electric charge of the floating gate FG is lost, the potential of a source of the second transistor is changed. The amount of electric charge leaking from the first transistor is estimated from the amount of change in potential of the source with respect to time; thus, the off-state current can be measured.

FIG. 36 shows that the off-state current per micrometer in channel width of the formed transistor was $2\times10^{-21}/\mu m$ (2 zA/μm) when the substrate temperature at measurement was 85° C.

Thus, the above result shows that the off-state current of the formed transistor was significantly small.

As described above, a highly reliable transistor can be formed with the use of an oxide semiconductor film having a crystal region in which the direction of the c-axis is parallel to a normal vector of the top surface of the oxide semiconductor film.

Further, a transistor having excellent electric characteristics can be obtained.

This embodiment can be implemented in appropriate combination with any of the other embodiments.

Embodiment 4

In this embodiment, a liquid crystal display device manufactured using the transistor described in Embodiment 3 will be described. Note that although an example in which the transistor according to one embodiment of the present invention is applied to the liquid crystal display device is described in this embodiment, one embodiment of the present invention is not limited thereto. For example, application of the transistor according to one embodiment of the present invention to an electroluminescence (EL) display device is readily conceived by those skilled in the art.

Figure 17:
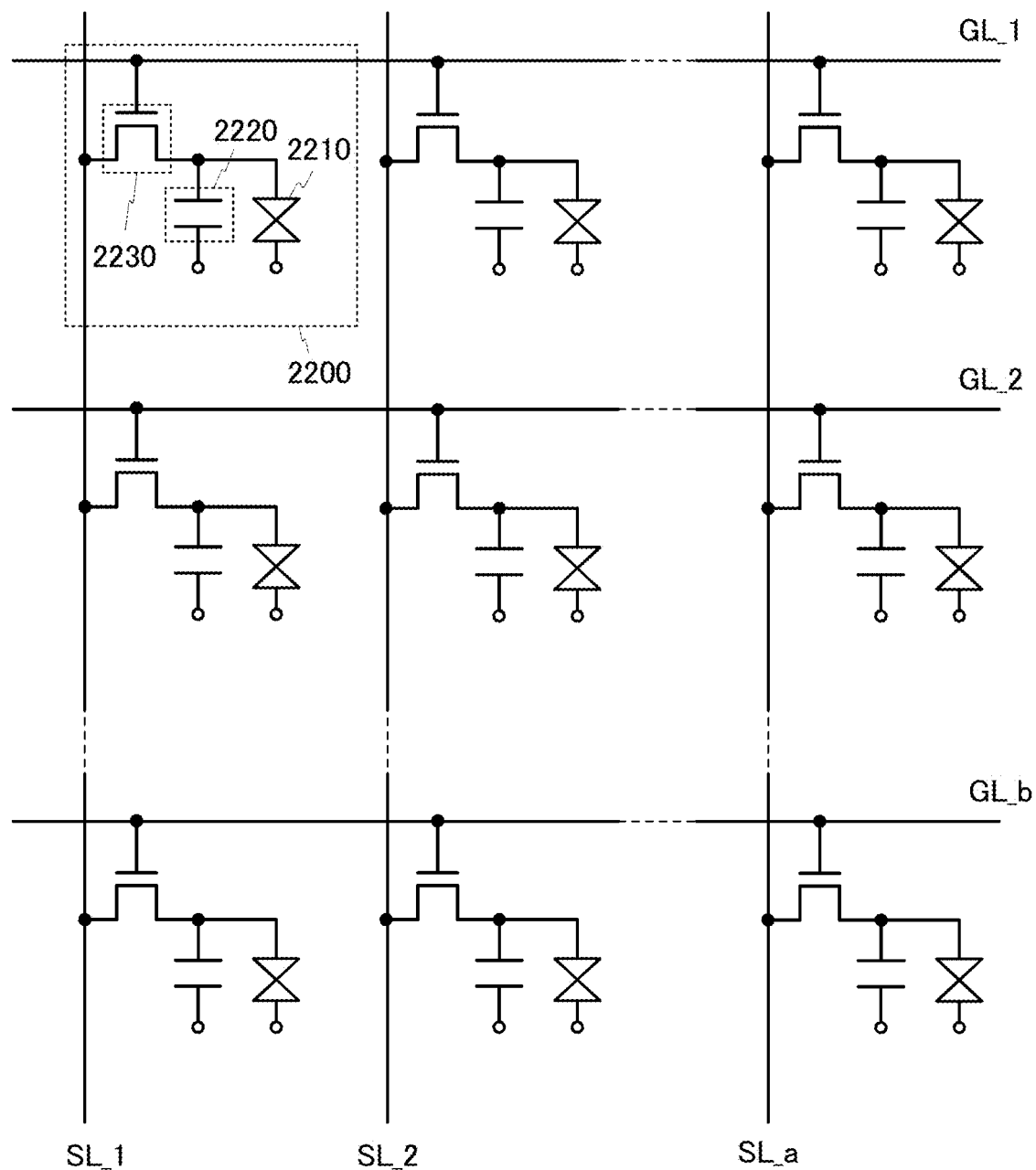
FIG. 17 is a circuit diagram illustrating an example of a display device.

FIG. 17 is a circuit diagram of an active matrix liquid crystal display device. The liquid crystal display device includes source lines SL_1 to SL_a, gate lines GL_1 to GL_b, and a plurality of pixels 2200. The pixels 2200 each include a transistor 2230, a capacitor 2220, and a liquid crystal element 2210. A pixel portion in the liquid crystal display device includes the pixels 2200 arranged in matrix. Note that a "source line SL" and a "gate line GL" simply refer to a source line and a gate line, respectively.

As the transistor 2230, the transistor described in Embodiment 3 can be used. With the use of the transistor according to one embodiment of the present invention, a liquid crystal display device with high display quality and high reliability can be obtained.

The gate line GL is connected to a gate of the transistor 2230, the source line SL is connected to a source of the transistor 2230, and a drain of the transistor 2230 is connected to one of capacitor electrodes of the capacitor 2220 and one of pixel electrodes of the liquid crystal element 2210. The other capacitor electrode of the capacitor 2220 and the other pixel electrode of the liquid crystal element 2210 are connected to a common electrode. Note that the common electrode may be formed using the same material in the same layer as the gate line GL.

Further, the gate line GL is connected to a gate driver circuit. The gate driver circuit may include the transistor described in Embodiment 3.

The source line SL is connected to a source driver circuit. The source driver circuit may include the transistor described in Embodiment 3.

Note that either or both of the gate driver circuit and the source driver circuit may be formed over a separately prepared substrate and connected using a method such as chip on glass (COG), wire bonding, or tape automated bonding (TAB).

Since a transistor is easily broken by static electricity or the like, a protection circuit is preferably provided. The protection circuit is preferably formed using a nonlinear element.

When a potential is supplied to the gate line GL to be higher than or equal to the threshold voltage of the transistor 2230, electric charge supplied from the source line SL flows as the drain current of the transistor 2230 and is accumulated (also referred to as charged) in the capacitor 2220. When the transistors 2230 in the row are turned off after charging the capacitor 2220 for one row, voltage application from the source line SL stops; however, a voltage which is needed can be kept by the electric charge accumulated in the capacitors 2220. Then, the capacitors 2220 in the next row are charged. In this manner, the capacitors in the first row to the b-th row are charged.

Since the off-state current of the transistor 2230 is low, the electric charge held in the capacitor 2220 is not easily lost and capacitance of the capacitor 2220 can be reduced, so that power consumption needed for charging can be reduced.

Thus, with the use of the transistor according to one embodiment of the present invention, a liquid crystal display device with high display quality and high reliability can be obtained.

This embodiment can be implemented in appropriate combination with any of the other embodiments.

Embodiment 5

In this embodiment, an example of manufacturing a memory which is a semiconductor device with the use of the transistor described in Embodiment 3 will be described.

Typical examples of volatile memories include a dynamic random access memory (DRAM) which stores data by selecting a transistor included in a memory element and accumulating electric charge in a capacitor and a static random access memory (SRAM) which holds stored data using a circuit such as a flip-flop.

The transistor described in Embodiment 3 can be applied to some of transistors included in a memory.

An example of a memory element to which the transistor described in Embodiment 3 is applied will be described with reference to FIGS. 18A to 18C.

Figure 18A:
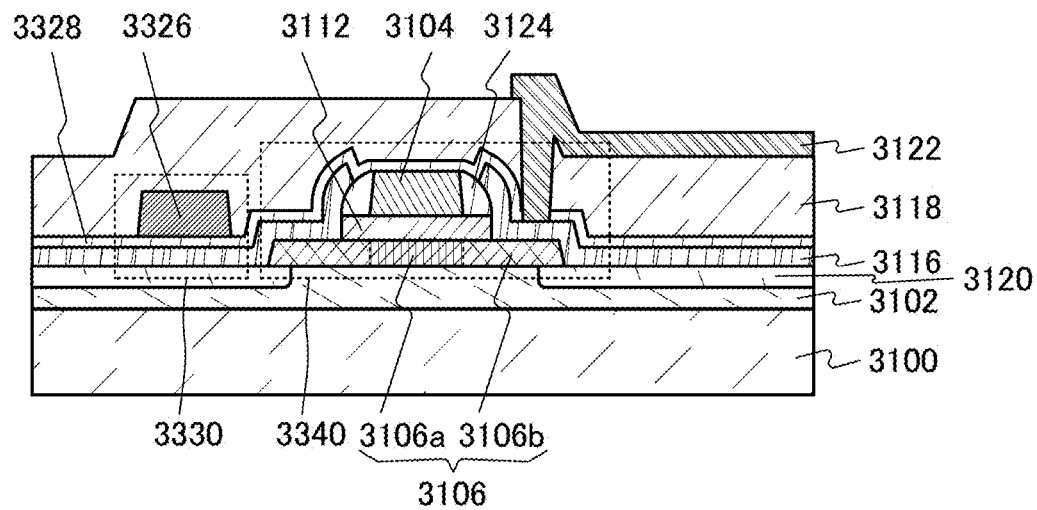
FIG. 18A is a cross-sectional view illustrating an example of a semiconductor device.

FIG. 18A is a cross-sectional view of the memory cell. A transistor 3340 includes a substrate 3100; a base insulating film 3102 provided over the substrate 3100; a protective film 3120 provided on the periphery of the base insulating film 3102; an oxide semiconductor film 3106, which is provided over the base insulating film 3102 and the protective film 3120 and includes a high-resistance region 3106a and low-resistance regions 3106b; a gate insulating film 3112 provided over the oxide semiconductor film 3106; a gate electrode 3104 provided so that the oxide semiconductor film 3106 overlaps with the gate electrode 3104 with the gate insulating film 3112 provided therebetween; sidewall insulating films 3124 provided in contact with a side surface of the gate electrode 3104; and a pair of electrodes 3116 provided in contact with at least the oxide semiconductor film 3106.

Here, the substrate 3100, the base insulating film 3102, the protective film 3120, the oxide semiconductor film 3106, the gate insulating film 3112, the gate electrode 3104, the sidewall insulating films 3124, and the pair of electrodes 3116 can be provided using methods and materials which are similar to those of the substrate 100, the base insulating film 502, the protective film 520, the oxide semiconductor film 506, the gate insulating film 512, the gate electrode 504, the sidewall insulating films 524, and the pair of electrodes 516, respectively.

Further, the transistor 3340 includes an interlayer insulating film 3328 provided so as to cover the transistor 3340, and an electrode 3326 provided over the interlayer insulating film 3328. A capacitor 3330 includes one of the pair of electrodes 3116, the interlayer insulating film 3328, and the electrode 3326. Although a parallel plate-type capacitor is illustrated in the drawing, a stack-type capacitor or a trench-type capacitor may alternatively be used to increase capacity. The interlayer insulating film 3328 can be provided using a material selected from materials similar to those of the protective insulating film 518. The electrode 3326 can be provided using a material selected from materials similar to those of the pair of electrodes 516.

Furthermore, the transistor 3340 includes an interlayer insulating film 3118 provided so as to cover the interlayer insulating film 3328 and the electrode 3326, and a wiring 3122 connected to the other of the pair of electrodes 3116 through an opening formed in the interlayer insulating film 3118 and the interlayer insulating film 3328. Although not illustrated, a protective film may be provided to cover the interlayer insulating film 3118 and the wiring 3122. With the protective film, a minute amount of leakage current generated due to surface conduction of the interlayer insulating film 3118 can be reduced and thus the off-state current of the transistor can be reduced. The wiring 3122 can be provided using methods and materials which are similar to those of the wiring 522.

Figure 18B:
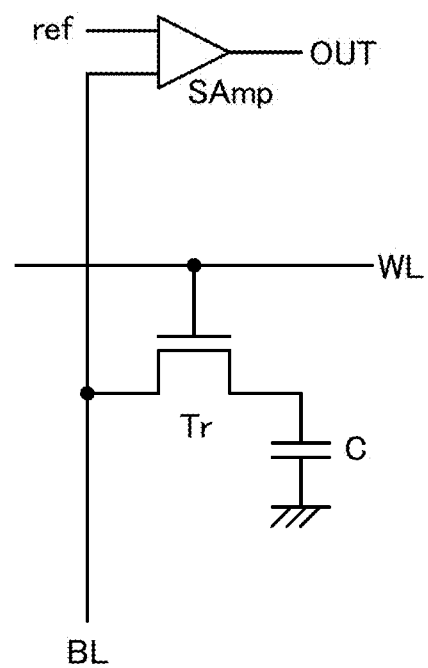
FIG. 18B is a circuit diagram of the semiconductor device.

FIG. 18B is a circuit diagram of the memory cell in FIG. 18A. The memory cell includes a bit line BL, a word line WL, a sense amplifier SAmp, a transistor Tr, and a capacitor C. Note that the transistor Tr and the capacitor C correspond to the transistor 3340 and the capacitor 3330, respectively.

Figure 18C:
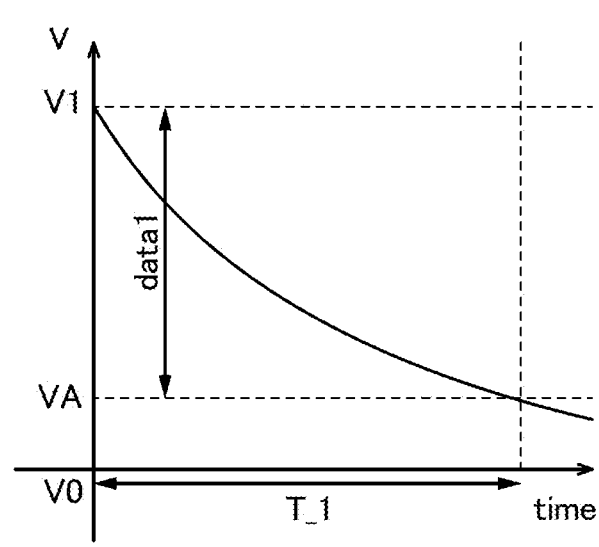
FIG. 18C shows electric characteristics thereof.

It is known that the potential held in the capacitor is gradually decreased over time as shown in FIG. 18C owing to the off-state current of the transistor Tr. The potential, originally at $V_0$, is set to $V_1$ by charging the capacitor, and is reduced over time to $V_A$ that is a limit for reading out data 1. This period is called a holding period T_1. Thus, in the case of a two-level memory cell, a refresh operation needs to be performed within the holding period T_1.

Here, when the transistor 3340 is used as the transistor Tr, the off-state current of the transistor Tr can be significantly small, so that the holding period T_1 can be made to be longer. In other words, an interval between refresh operations can be extended; thus, power consumption of the memory cell can be reduced. Further, since the transistor Tr is highly reliable, the memory cell can have high reliability.

In the case where a memory cell is formed using a transistor whose off-state current is lower than or equal to $1 \times 10^{-18}$ A, lower than or equal to $1 \times 10^{-21}$ A, or lower than or equal to $1 \times 10^{-24}$ A, which is shown in Embodiment 3, an interval between refresh operations can be several tens of seconds to several tens of years.

As described above, the use of the transistor according to one embodiment of the present invention allows formation of a memory element with high reliability and low power consumption.

Next, another example of a memory element to which the transistor described in Embodiment 3 is applied will be described with reference to FIGS. 19A to 19C.

Figure 19A:
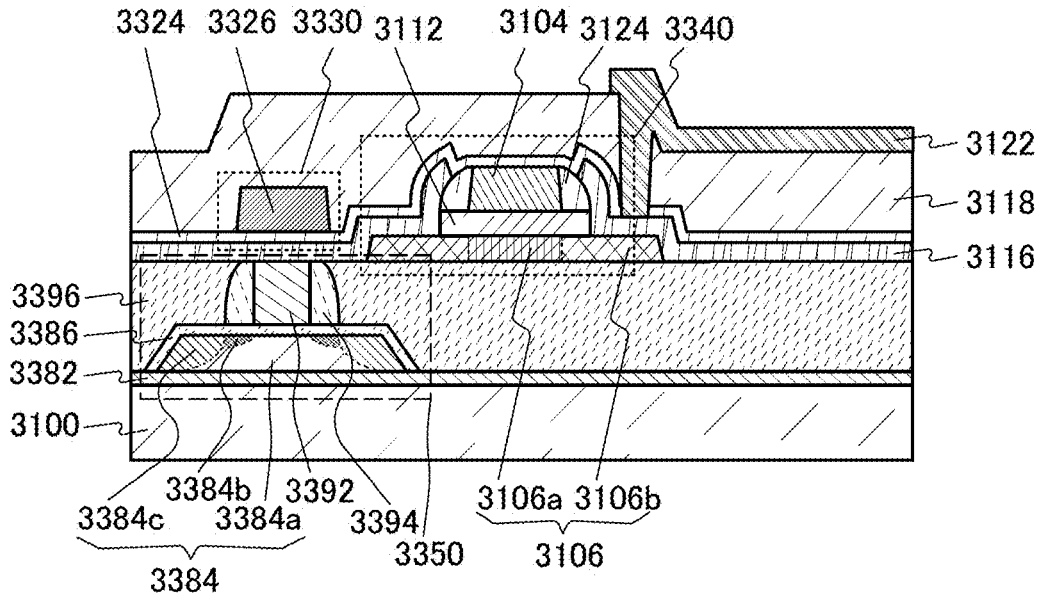
FIG. 19A is a cross-sectional view illustrating an example of a semiconductor device.

FIG. 19A is a cross-sectional view of a memory cell which is the memory element. A transistor 3350 includes a substrate 3100; a base insulating film 3382 provided over the substrate 3100; a semiconductor film 3384, which is provided over the base insulating film 3382 and includes a first resistance region 3384a, second resistance regions 3384b, and third resistance regions 3384c; a gate insulating film 3386 provided over the semiconductor film 3384; a gate electrode 3392 provided to overlap with the first resistance region 3384a with the gate insulating film 3386 provided therebetween; and sidewall insulating films 3394 provided in contact with side surfaces of the gate electrode 3392. The descending order of resistance in the semiconductor film 3384 is as follows: the first resistance region 3384a, the second resistance regions 3384b, and the third resistance regions 3384c. In the first resistance region 3384a, a channel is formed when a voltage higher than or equal to the threshold voltage of the transistor 3350 is applied to the gate electrode 3392. Although not illustrated, a pair of electrodes in contact with the third resistance regions 3384c may be provided.

As the transistor 3350, either a transistor formed using a semiconductor film which is other than an oxide semiconductor film and which contains a Group 14 element, such as a polycrystalline silicon film, a single crystal silicon film, a polycrystalline germanium film, or a single crystal germanium film, or the transistor formed using the oxide semiconductor film described in Embodiment 3 may be used.

Further, an interlayer insulating film 3396 is provided in contact with the transistor 3350. Note that a top surface of the interlayer insulating film 3396 is a surface over which the transistor 3340 is formed; thus, the top surface of the interlayer insulating film 3396 is planarized as much as possible. Specifically, the average surface roughness Ra of the top surface of the interlayer insulating film 3396 is preferably less than or equal to 1 nm, preferably less than or equal to 0.3 nm, more preferably less than or equal to 0.1 nm.

The interlayer insulating film 3396 can have a single-layer structure or a layered structure, in which a layer that is in contact with the oxide semiconductor film 3106 is preferably an insulating film from which oxygen is released by heat treatment.

The transistor 3340 is provided over the interlayer insulating film 3396. One of the pair of electrodes 3116 of the transistor 3340 is connected to the gate electrode 3392 of the transistor 3350. The capacitor 3330 includes one of the pair of electrodes 3116 and the interlayer insulating film 3328, which are include in the transistor 3340, and the electrode 3326. Although a parallel plate-type capacitor is illustrated in the drawing, a stack-type capacitor or a trench-type capacitor may alternatively be used to increase capacity.

Figure 19B:
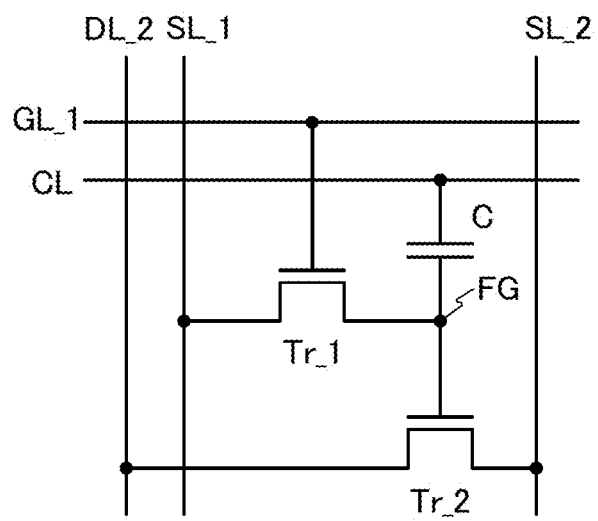
FIG. 19B is a circuit diagram of the semiconductor device.

FIG. 19B is a circuit diagram of the memory cell in FIG. 19A. The memory cell includes a transistor Tr_1, a gate line GL_1 connected to a gate of the transistor Tr_1, a source line SL_1 connected to a source of the transistor Tr_1, a transistor Tr_2, a source line SL_2 connected to a source of the transistor Tr_2, a drain line DL_2 connected to a drain of the transistor Tr_2, a capacitor C, a capacitor line CL connected to one end of the capacitor C, and a floating gate FG connected to the other end of the capacitor C, a drain of the transistor Tr_1, and a gate of the transistor Tr_2. Note that the transistor Tr_1, the transistor Tr_2, and the capacitor C correspond to the transistor 3340, the transistor 3350, and the capacitor 3330, respectively.

Figure 19C:
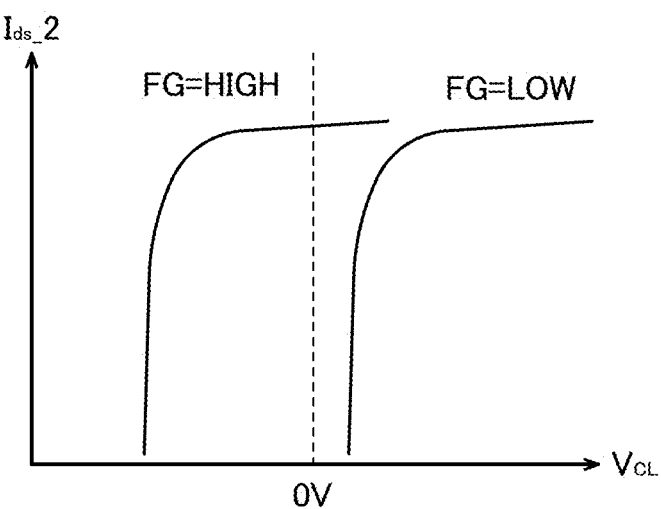
FIG. 19C shows electric characteristics thereof.

The above memory element utilizes variation in an apparent threshold value of the transistor Tr_2 in accordance with the potential of the floating gate FG For example, FIG. 19C shows the relation between a potential $V_{CL}$ of the capacitor wiring CL and a drain current $I_{ds}\_2$ flowing through the transistor Tr_2.

Here, the potential of the floating gate FG can be adjusted through the transistor Tr_1. For example, the potential of the source line SL_1 is set to VDD. In this case, when the potential of the gate line GL_1 is set to higher than or equal to a potential obtained by adding VDD to the threshold voltage $V_{th}$ of the transistor Tr_1, the potential of the floating gate FG can be HIGH. Further, when the potential of the gate line GL_1 is set to lower than or equal to the threshold voltage $V_{th}$ of the transistor Tr_1, the potential of the floating gate FG can be LOW.

Thus, either a $V_{CL}$-$I_{ds\_2}$ curve (FG=LOW) or a $V_{CL}$-$I_{ds\_2}$ curve (FG=HIGH) can be obtained. That is, when the potential of the floating gate FG is LOW, the drain current $I_{ds\_2}$ is small at the potential $V_{CL}$ of 0V; accordingly, data 0 is stored. Further, when the potential of the floating gate FG is HIGH, the drain current $I_{ds\_2}$ is large at the potential $V_{CL}$ of 0V; accordingly, data 1 is stored. In this manner, data can be stored.

Since the off-state current of the transistor Tr_1 can be made to be extremely small when the transistor 3340 is used as the transistor Tr_1 here, unintentional leak of electric charge accumulated in the floating gate FG in FIG. 19B through the transistor Tr_1 can be suppressed. Therefore, data can be held for a long period. Further, the field-effect mobility of the transistor Tr_1 is high; thus, the memory element can be operated at high speed.

As described above, the use of the transistor according to one embodiment of the present invention for at least a part of the memory element allows formation of a semiconductor device having high reliability and low power consumption and being capable of high-speed operation.

This embodiment may be implemented in appropriate combination with any of the other embodiments.

Embodiment 6

A central processing unit (CPU) can be formed with the use of the transistor described in Embodiment 3 and the semiconductor device described in Embodiment 5 for at least a part of the CPU.

Figure 20A:
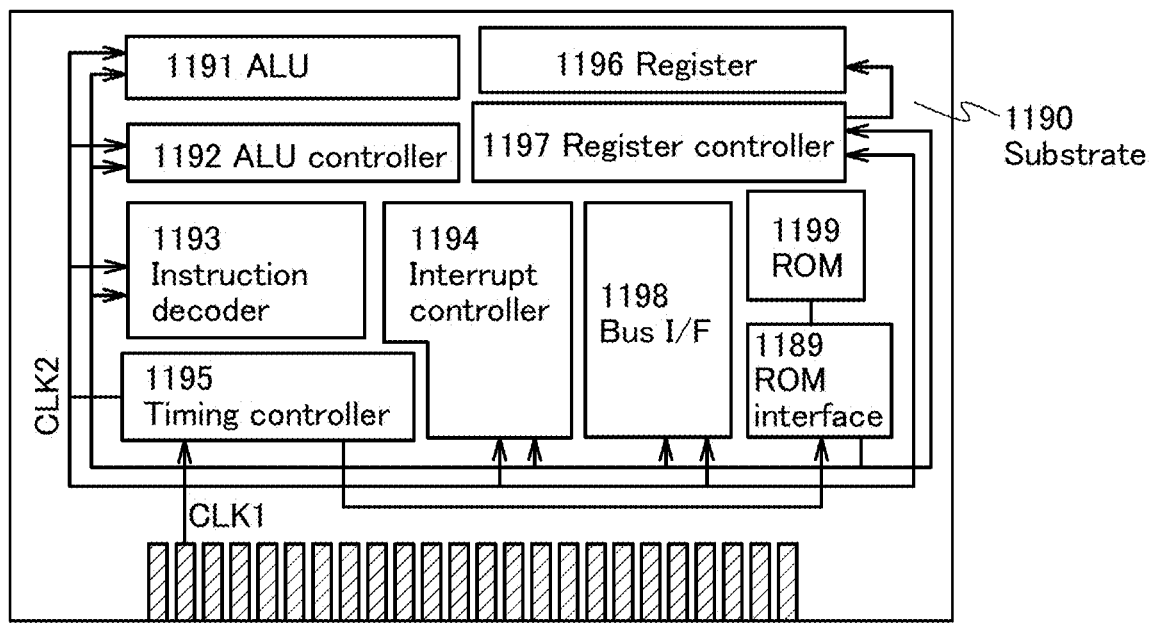
FIG. 20A is a block diagram illustrating a specific example of a CPU including a transistor according to one embodiment of the present invention.

FIG. 20A is a block diagram illustrating a specific configuration of a CPU. The CPU illustrated in FIG. 20A includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. It is needless to say that the CPU in FIG. 20A is only an example in which the configuration is simplified, and actual CPUs have various configurations depending on applications.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 depending on the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the clock signal CLK2 to the above circuits.

In the CPU in FIG. 20A, the semiconductor device according to Embodiment 5 is provided in the register 1196.

In the CPU in FIG. 20A, the register controller 1197 selects an operation of holding data in the register 1196, in response to an instruction from the ALU 1191. That is, the semiconductor device in the register 1196 determines which of a phase-inversion element and a capacitor holds data. When data holding by the phase-inversion element is selected, power supply voltage is supplied to the semiconductor device in the register 1196. When data holding by the capacitor is selected, the data is rewritten in the capacitor, and supply of the power supply voltage to the semiconductor memory device in the register 1196 can be stopped.

Figure 20B:
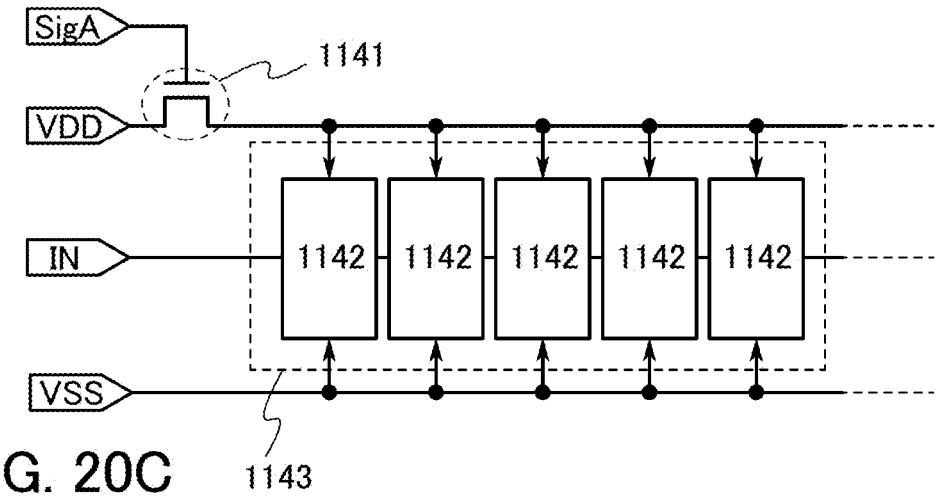
FIGS. 20B and 20C are circuit diagrams each illustrating a part of the CPU.
Figure 20C:
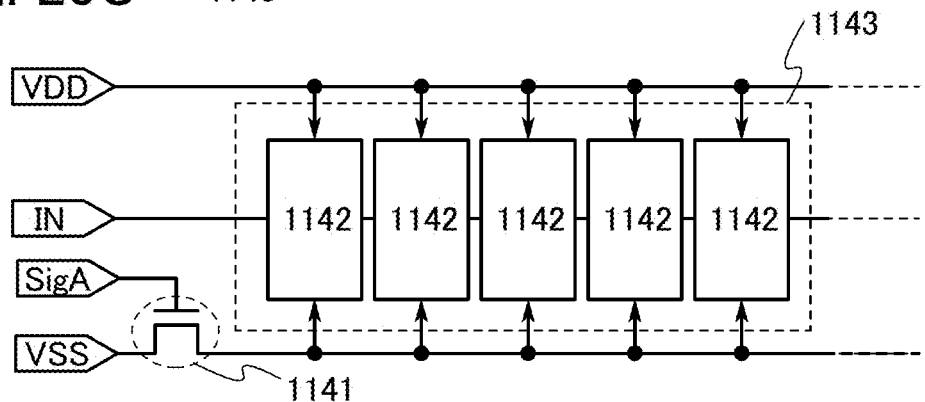

The power supply can be stopped with a switching element provided between a semiconductor device group and a node to which a power supply potential VDD or a power supply potential VSS is supplied, as illustrated in FIG. 20B or FIG. 20C. Circuits illustrated in FIGS. 20B and 20C will be described below.

FIGS. 20B and 20C each illustrate an example of a configuration of a memory circuit including the transistor, whose active layer is formed using an oxide semiconductor, for a switching element for controlling supply of power supply potential to a semiconductor device.

The memory device illustrated in FIG. 20B includes a switching element 1141 and a semiconductor device group 1143 including a plurality of semiconductor devices 1142. Specifically, as each of the semiconductor devices 1142, the semiconductor device described in Embodiment 5 can be used. Each of the semiconductor devices 1142 included in the semiconductor device group 1143 is supplied with the high-level power supply potential VDD through the switching element 1141. Further, each of the semiconductor devices 1142 included in the semiconductor device group 1143 is supplied with a potential of a signal IN and the low-level power supply potential VSS.

In FIG. 20B, as the switching element 1141, the transistor described in Embodiment 3 can be used. The switching of the transistor is controlled by a signal SigA input to a gate thereof.

Note that FIG. 20B illustrates the configuration in which the switching element 1141 includes only one transistor; however, one embodiment of the present invention is not limited thereto. The switching element 1141 may include a plurality of transistors. In the case where the switching element 1141 includes a plurality of transistors which serves as switching elements, the plurality of transistors may be connected to each other in parallel, in series, or in combination of parallel connection and serial connection.

FIG. 20C illustrates an example of a memory device in which each of the semiconductor devices 1142 included in the semiconductor device group 1143 is supplied with the low-level power supply potential VSS through the switching element 1141. The supply of the low-level power supply potential VSS to each of the semiconductor devices 1142 included in the semiconductor device group 1143 can be controlled by the switching element 1141.

When a switching element is provided between a semiconductor device group and a node to which the power supply potential VDD or the power supply potential VSS is supplied, data can be held even in the case where operation of a CPU is temporarily stopped and the supply of the power supply voltage is stopped; accordingly, power consumption can be reduced. For example, while a user of a personal computer does not input data to an input device such as a keyboard, the operation of the CPU can be stopped, so that the power consumption can be reduced.

Further, when the transistor described in Embodiment 3 and the semiconductor device described in Embodiment 5 are used, the CPU can operate at high speed while consuming less power.

Although the CPU is given as an example here, one embodiment of the present invention can also be applied to an LSI such as a digital signal processor (DSP), a custom LSI, or a field programmable gate array (FPGA).

This embodiment may be implemented in appropriate combination with any of the other embodiments.

Embodiment 7

In this embodiment, examples of electronic devices to which the semiconductor device described in any of Embodiments 3 to 6 can be applied will be described.

Figure 21A:
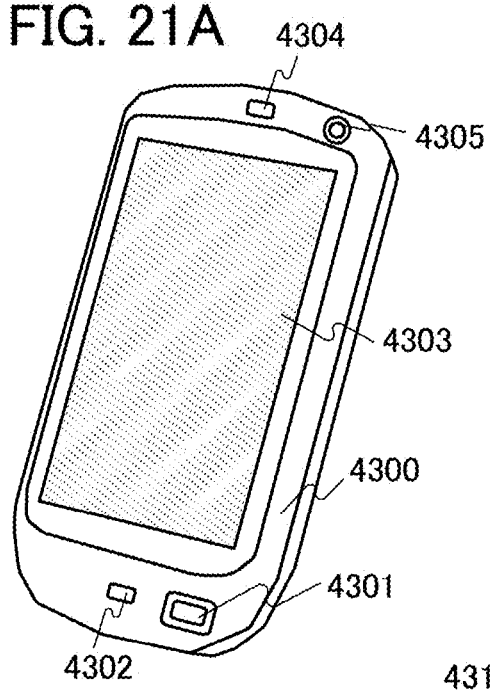
FIGS. 21A to 21C are perspective views illustrating examples of electronic devices according to one embodiment of the present invention.

FIG. 21A illustrates a portable information terminal. The portable information terminal includes a housing 4300, a button 4301, a microphone 4302, a display portion 4303, a speaker 4304, and a camera 4305, and has a function of a mobile phone.

Figure 21B:
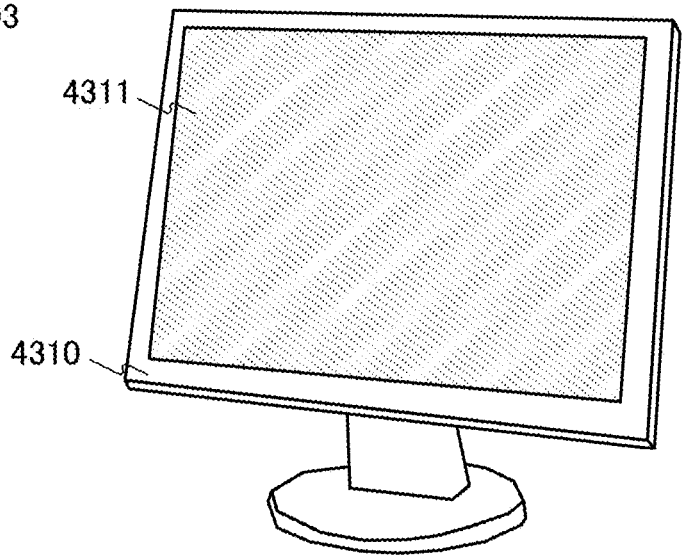

FIG. 21B illustrates a display. The display includes a housing 4310 and a display portion 4311.

Figure 21C:
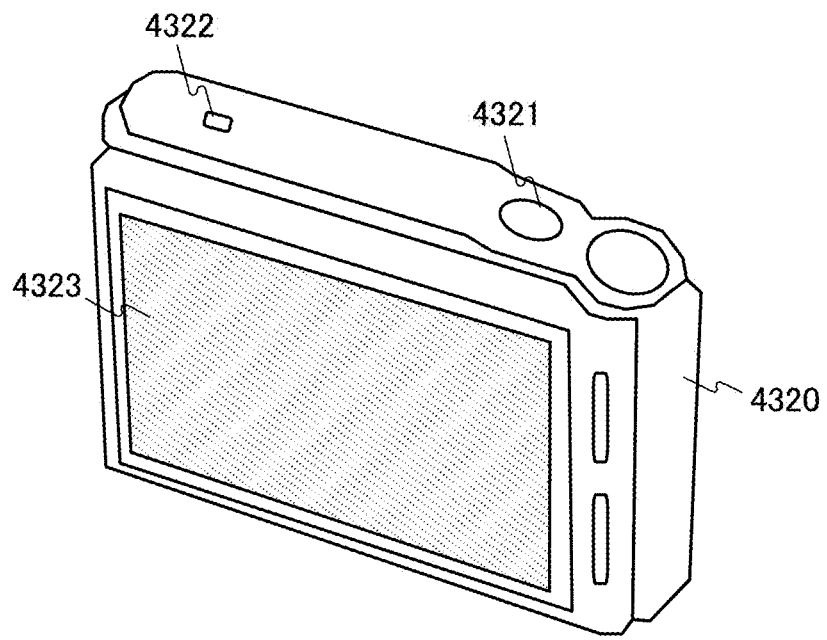
Figure 22A:
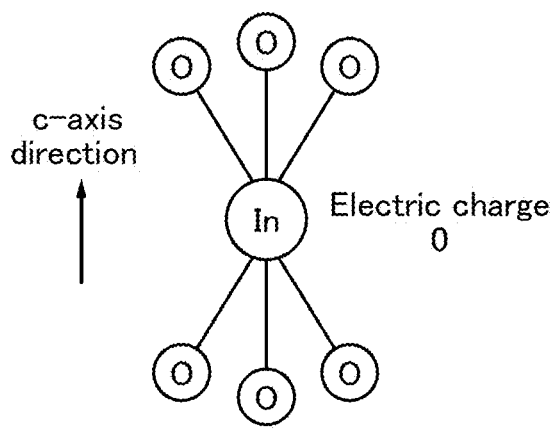
FIGS. 22A to 22E each illustrate a crystal structure of an oxide semiconductor according to one embodiment of the present invention.
Figure 22D:
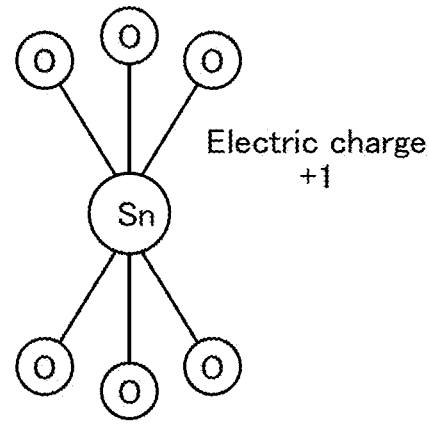
Figure 22B:
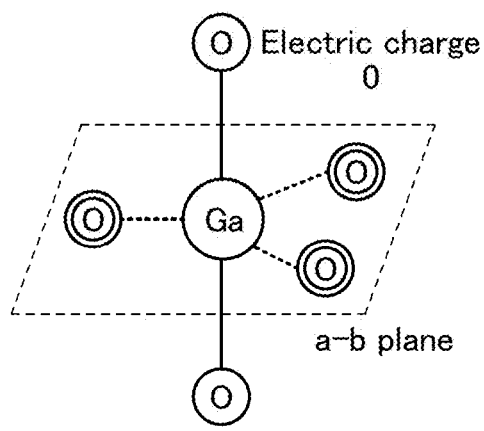
Figure 22E:
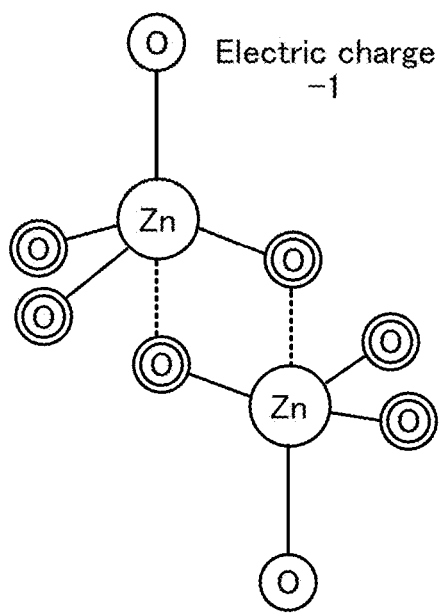
Figure 22C:
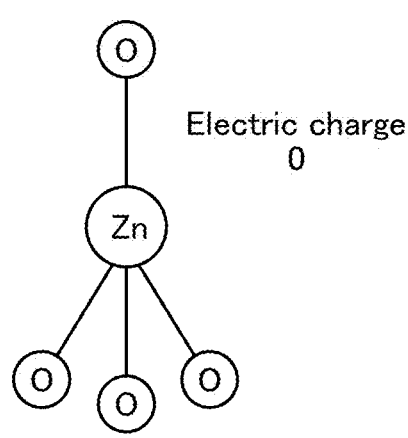
Figure 23A:
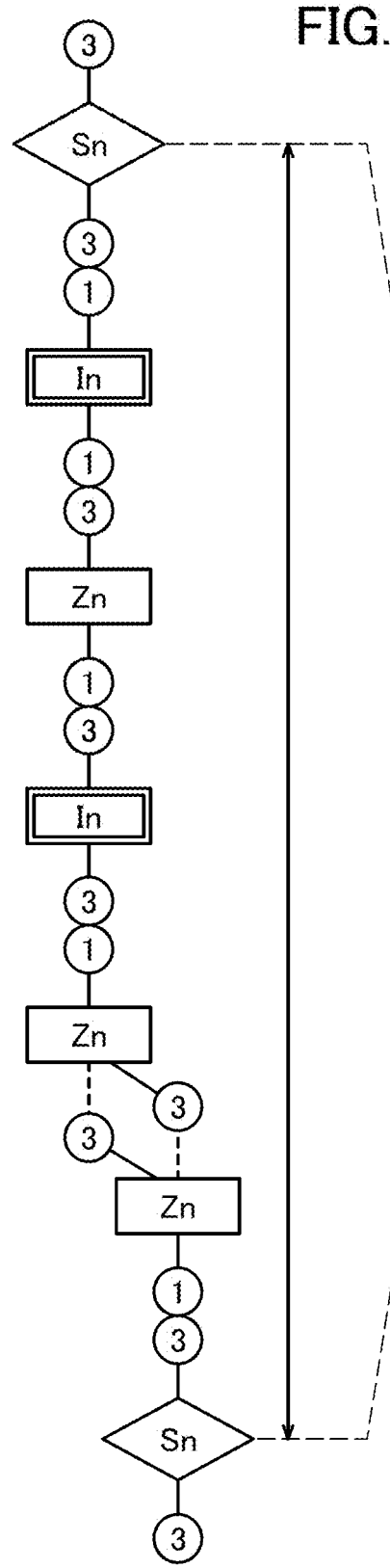
FIGS. 23A to 23C illustrate a crystal structure of an oxide semiconductor according to one embodiment of the present invention.
Figure 23B:
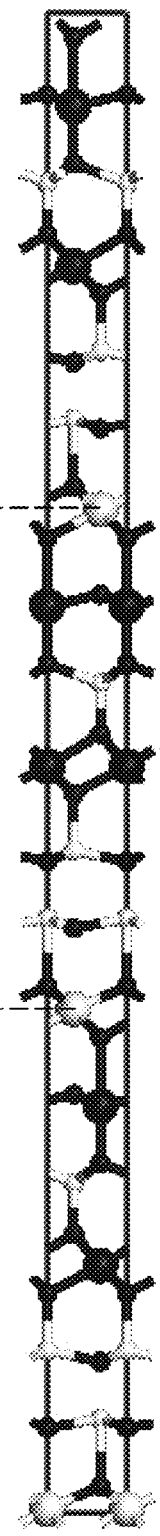
Figure 23C:
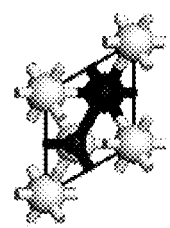
Figure 24A:
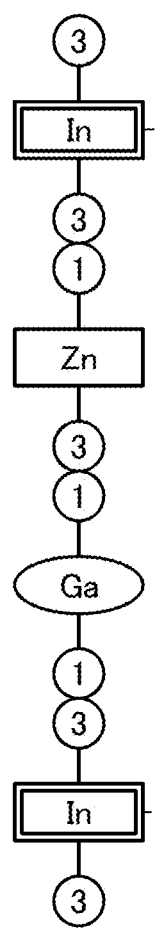
FIGS. 24A to 24C illustrate a crystal structure of an oxide semiconductor according to one embodiment of the present invention.
Figure 24B:
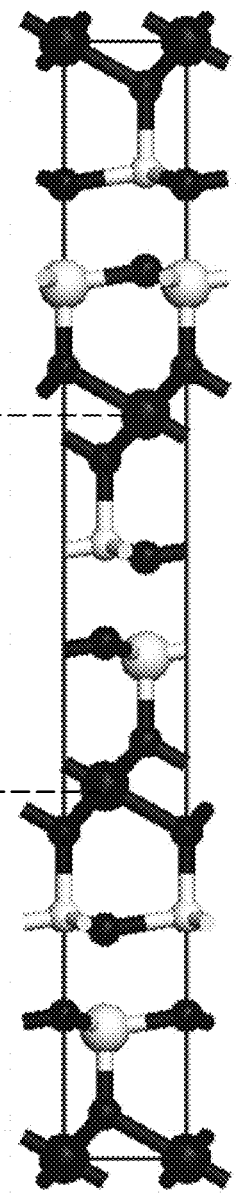
Figure 24C:
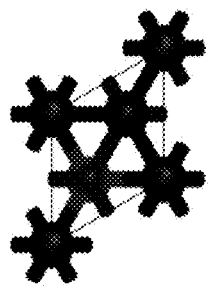
Figure 25A:
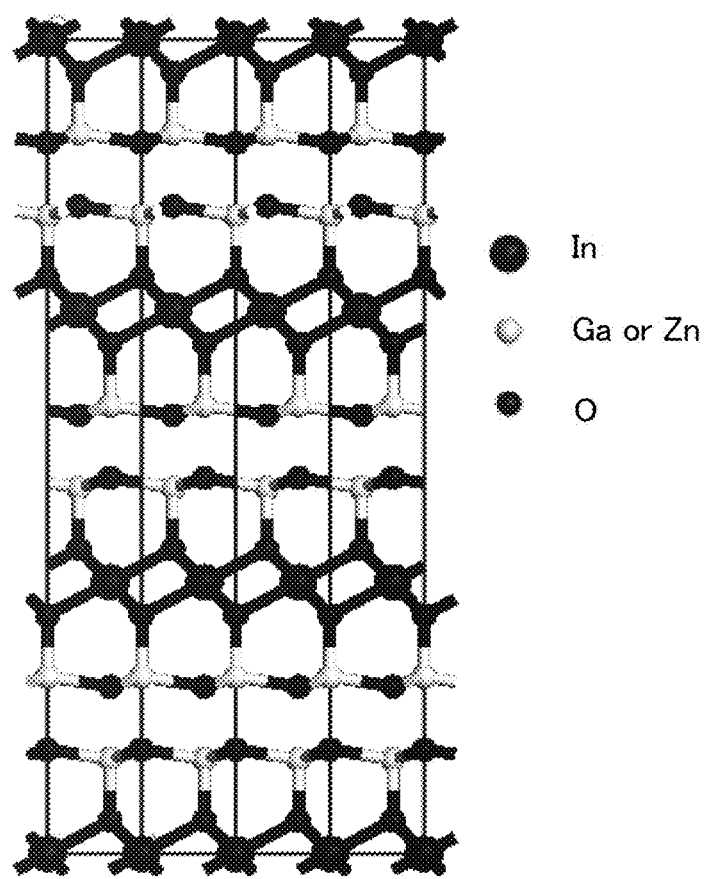
FIGS. 25A and 25B each illustrate a crystal structure of an oxide semiconductor according to one embodiment of the present invention.
Figure 25B:
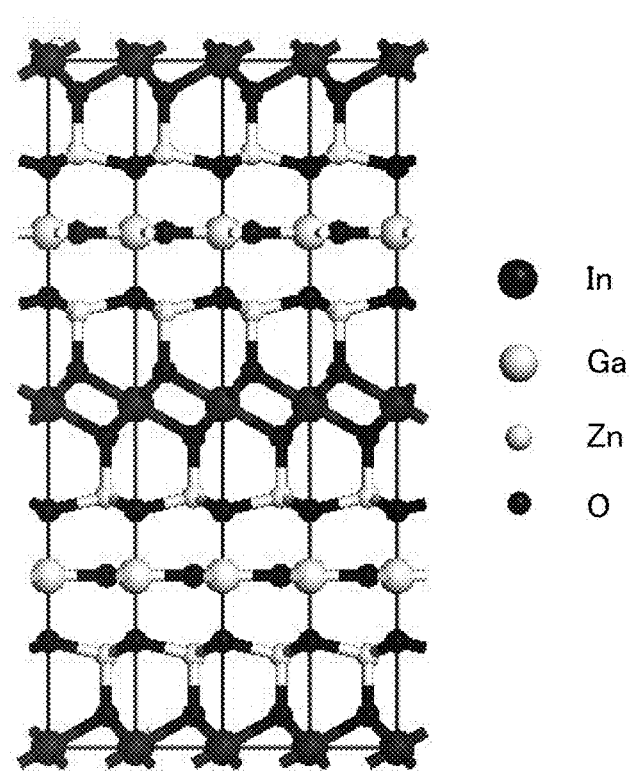

FIG. 21C illustrates a digital still camera. The digital still camera includes a housing 4320, a button 4321, a microphone 4322, and a display portion 4323.

With the use of the semiconductor device according to one embodiment of the present invention, an electronic device with favorable quality can be obtained.

This embodiment can be combined with any of the other embodiments as appropriate.

Example 1

In this example, a crystal state of an oxide semiconductor film was evaluated by an X-ray diffraction (XRD) method.

Note that in this example, oxide semiconductor films of all samples are each deposited by a sputtering method, using the sputtering target including an oxide semiconductor having a crystal region in which the direction of the c-axis is parallel to a normal vector of the top surface of the oxide semiconductor, which is described in Embodiment 1, and the deposition apparatus described in Embodiment 2.

First, difference in crystallinity of the oxide semiconductor films due to planarity of a film serving as a base was evaluated. A method for forming samples is as follows.

In a sample 4, a 300 nm thick silicon oxide film was deposited over a silicon wafer by a sputtering method. The average surface roughness Ra of the top surface of the silicon oxide film was 0.9 nm.

In a sample 5, a 300 nm thick silicon oxide film was deposited over a silicon wafer by a sputtering method, and the top surface was planarized by CMP treatment. The average surface roughness Ra of the top surface of the silicon oxide film subjected to planarization treatment was 0.2 nm.

In a sample 6, a 300 nm thick thermal oxidation film was formed over a silicon wafer by thermal oxidation. The average surface roughness Ra of the top surface of the thermal oxidation film was 0.2 nm.

Next, a 100 nm thick In—Ga—Zn—O compound film was deposited over each of the samples 4 to 6 by a sputtering method. Note that the deposition was performed under conditions in which an In—Ga—Zn—O compound sputtering target having an atomic ratio of In:Ga:Zn=1:1:1 was used, the power was 0.5 kW (DC), a deposition gas was 45 sccm of an oxygen gas, the pressure was 0.4 Pa, and the substrate temperature was 250° C.

Figure 37:
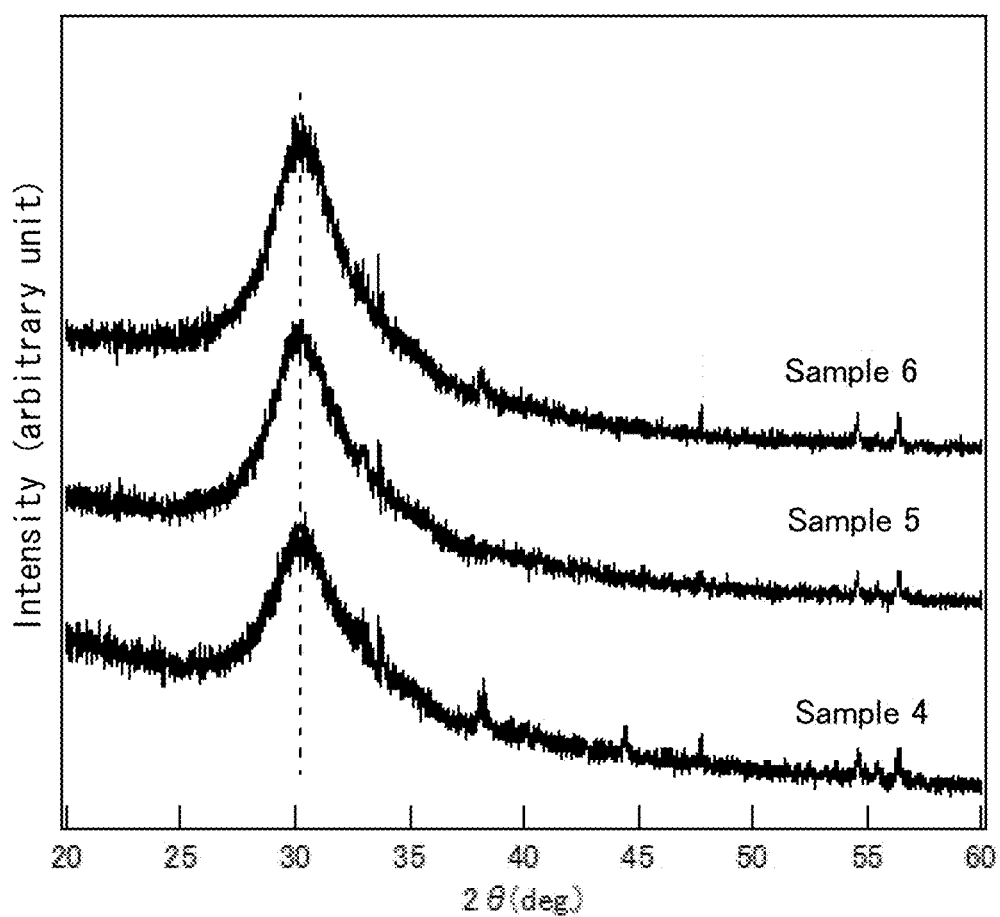
FIG. 37 shows XRD spectra of samples 4 to 6.

FIG. 37 shows XRD spectra of samples 4 to 6. The XRD analysis was conducted using an X-ray diffractometer D8 ADVANCE manufactured by Bruker AXS, and measurement was performed by an out-of-plane method.

FIG. 37 shows that the intensity of the peak indicating crystallinity in the vicinity of 2θ=30° was higher in the samples 5 and 6 than in the sample 4. That is, when the film serving as a base has higher planarity, the crystallinity of an oxide semiconductor film to be obtained is improved.

Next, difference in crystallinity of the oxide semiconductor films due to a substrate temperature at the time of deposition was evaluated. A method for forming samples is as follows.

In each sample, a 200 nm thick In—Ga—Zn—O compound film was deposited over a glass substrate by a sputtering method. Note that the deposition was performed under conditions in which an In—Ga—Zn—O compound sputtering target having an atomic ratio of In:Ga:Zn=1:1:1 was used, the power was 5 kW (DC), deposition gas flows were 50 sccm of an argon gas and 50 sccm of an oxygen gas, the pressure was 0.6 Pa, and the substrate temperatures were room temperature (sample 7), 120° C. (sample 8), 150° C. (sample 9), and 170° C. (sample 10).

Figure 38:
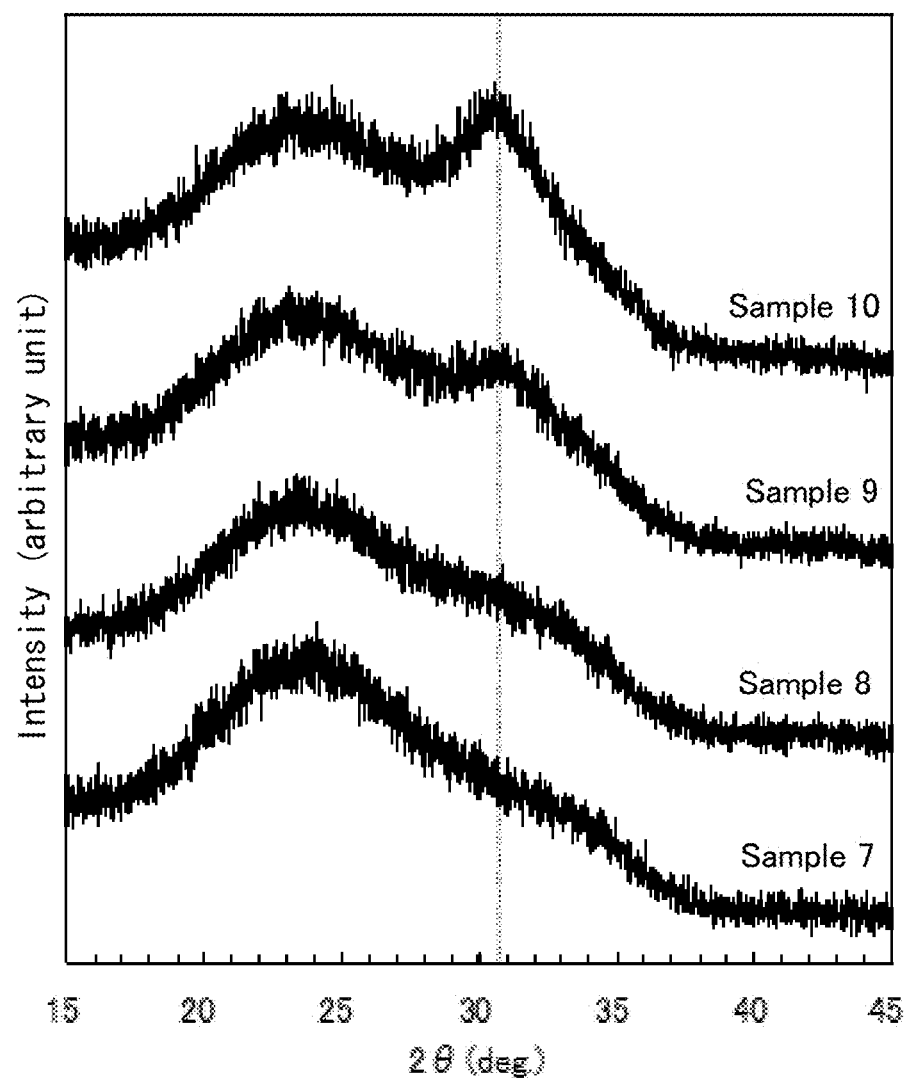
FIG. 38 shows XRD spectra of samples 7 to 10.

FIG. 38 shows XRD spectra of samples 7 to 10. The XRD analysis was conducted using an X-ray diffractometer D8 ADVANCE manufactured by Bruker AXS, and measurement was performed by an out-of-plane method.

FIG. 38 shows that the intensity of the peak indicating crystallinity in the vicinity of 2θ=30° was higher in the order of the sample 10, the sample 9, the sample 8, and the sample 7. That is, when the substrate temperature at the time of the deposition is higher, the crystallinity of an oxide semiconductor film to be obtained is improved.

Next, difference in crystallinity of the oxide semiconductor films due to the percentage of an oxygen gas at the time of deposition was evaluated. A method for forming samples is as follows.

In each sample, a 200 nm thick In—Ga—Zn—O compound film was deposited over a glass substrate by a sputtering method. Note that the deposition was performed under conditions in which an In—Ga—Zn—O compound sputtering target having an atomic ratio of In:Ga:Zn=1:1:1 was used; the power was 5 kW (DC); the percentage of an oxygen gas (the flow rate of the oxygen gas obtained by dividing it by the total amount of the flow rate of the oxygen gas and the flow rate of an argon gas) was 10% (sample 11), 20% (sample 12), 30% (sample 13), 50% (sample 14), 70% (sample 15), and 100% (only oxygen; sample 16); the pressure was 0.6 Pa; and the substrate temperature was 170° C.

Figure 39:
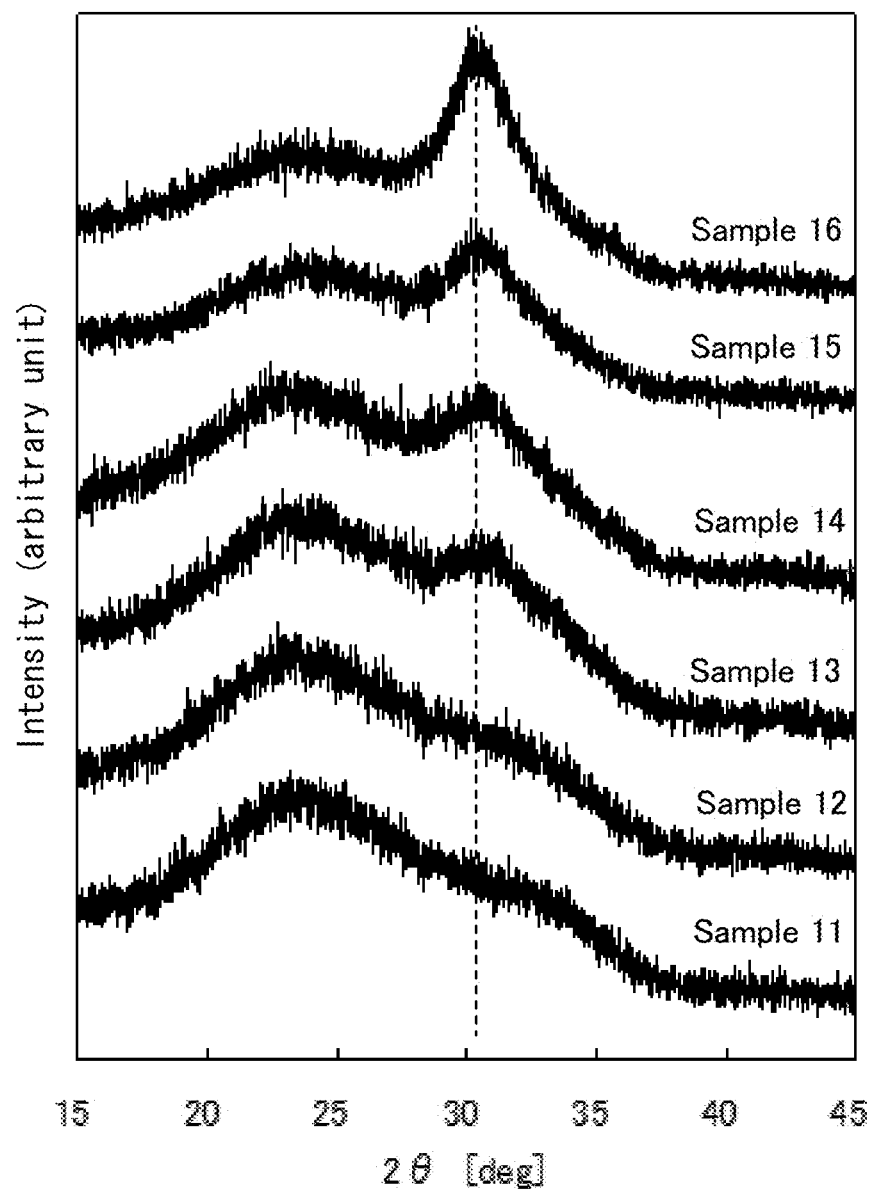
FIG. 39 shows XRD spectra of samples 11 to 16.
Figure 40:
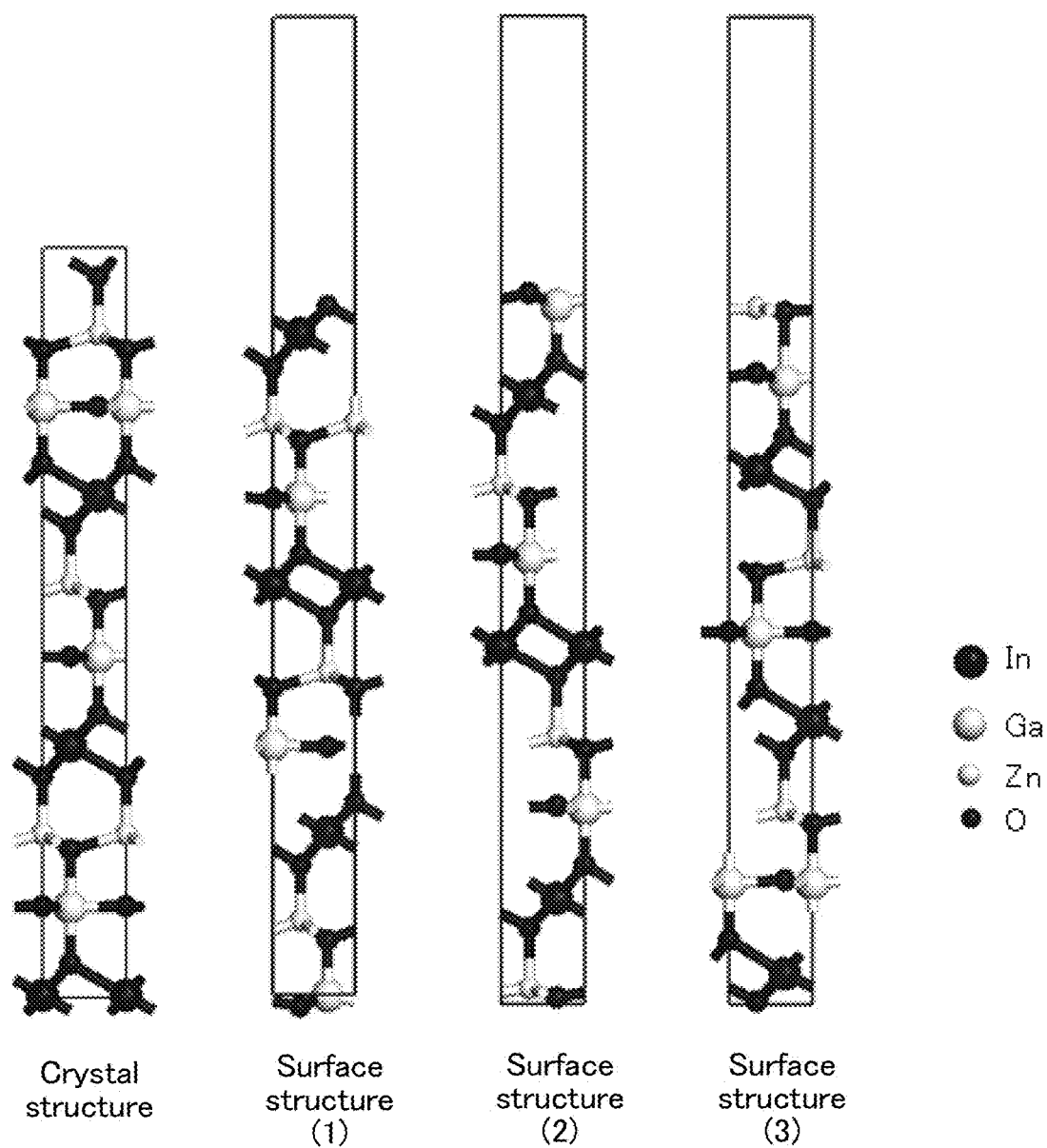
FIG. 40 illustrates a crystal structure and surface structures.
Figure 41:
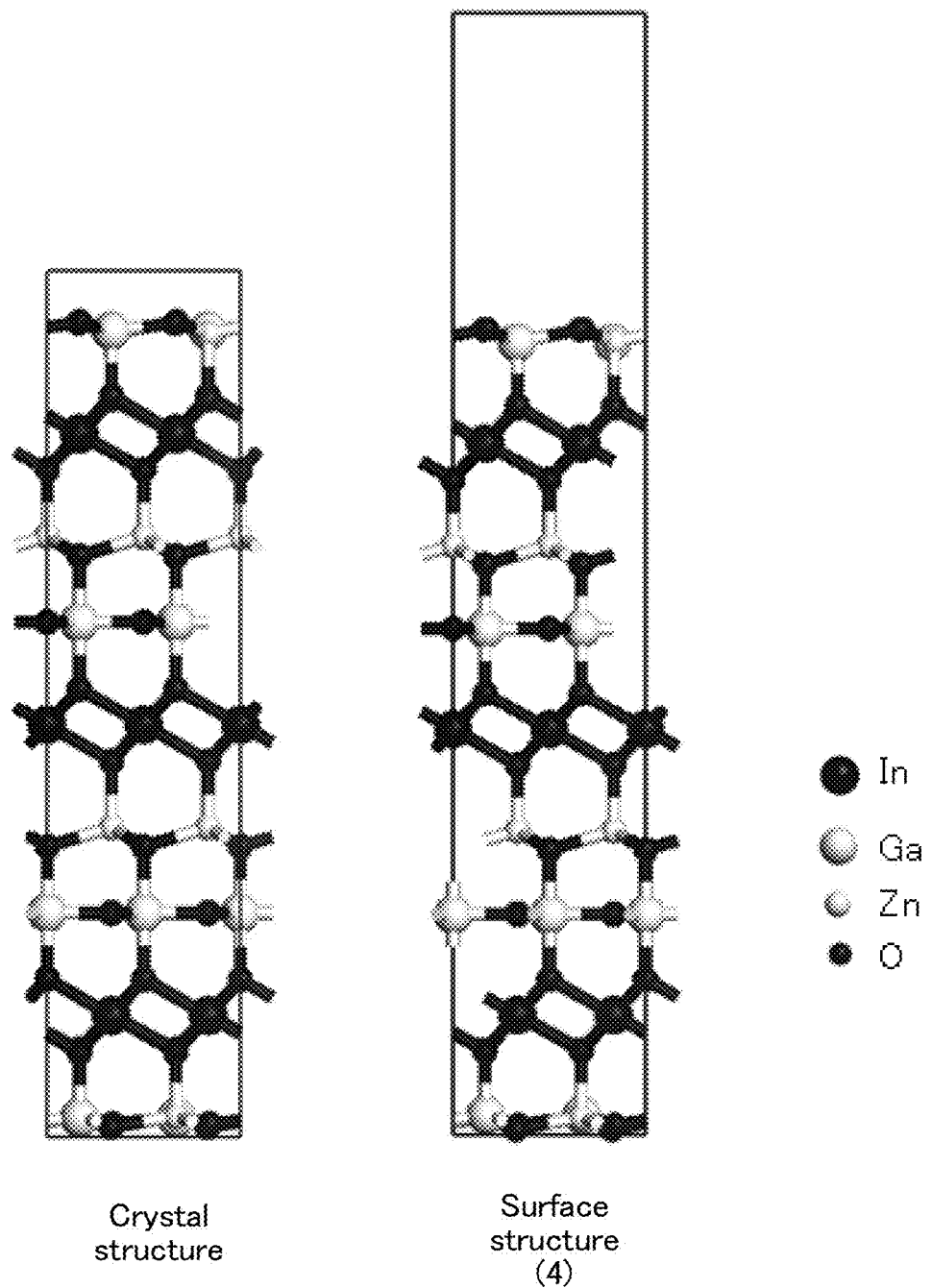
FIG. 41 illustrates a crystal structure and a surface structure.
Figure 42:
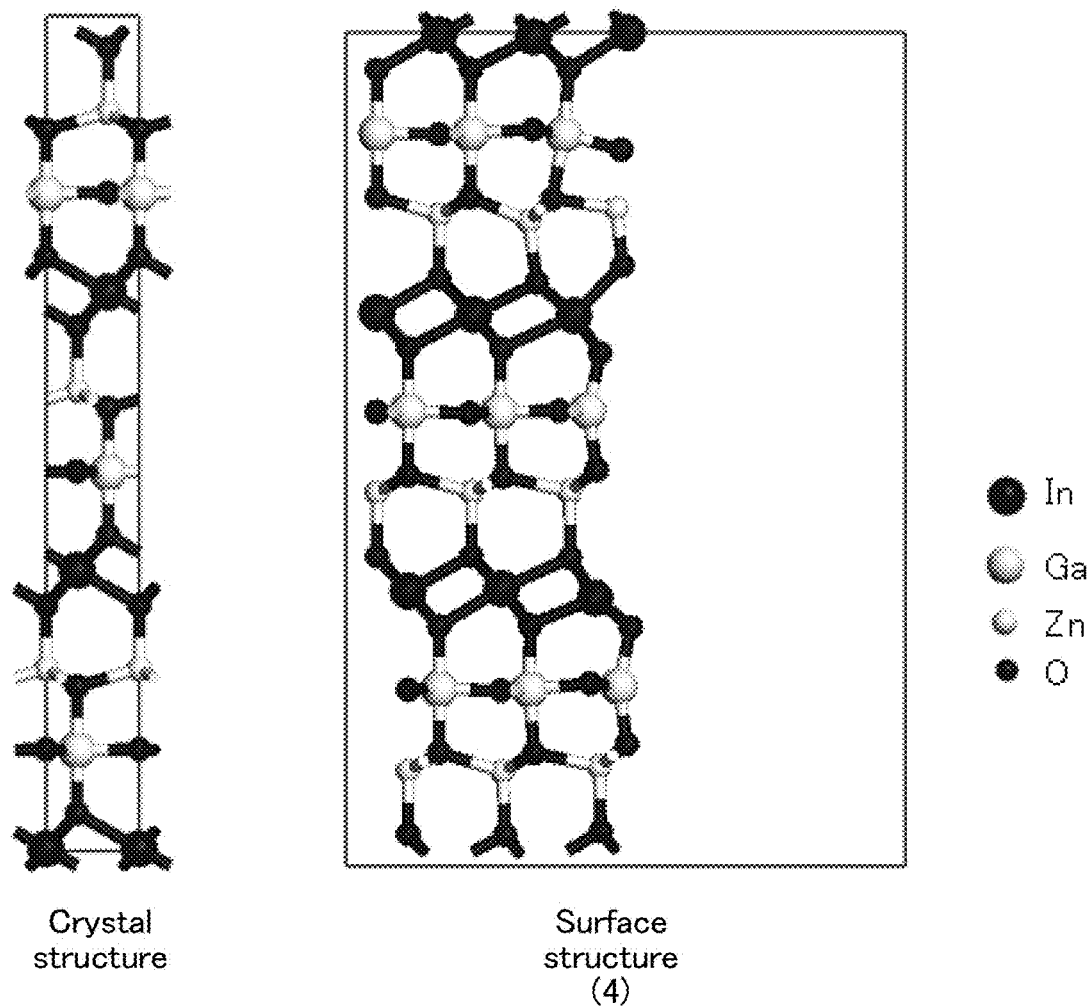
FIG. 42 illustrates a crystal structure and a surface structure.
Figure 43:
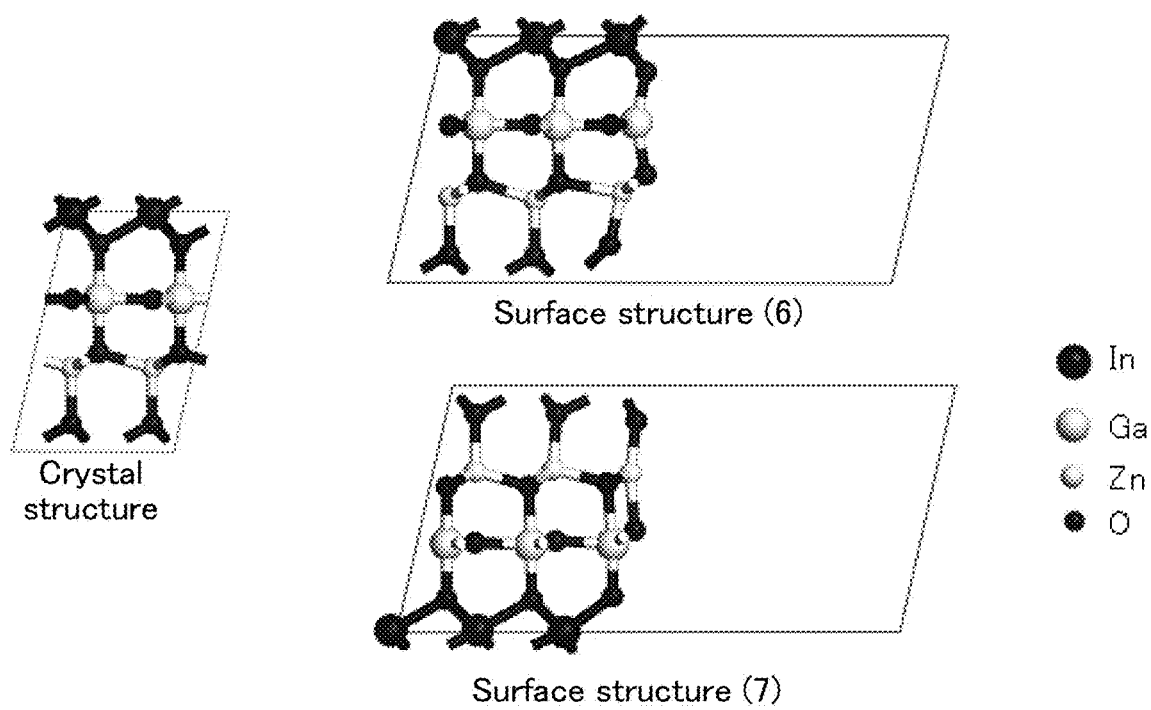
FIG. 43 illustrates a crystal structure and surface structures.

FIG. 39 shows XRD spectra of samples 11 to 16. The XRD analysis was conducted using an X-ray diffractometer D8 ADVANCE manufactured by Bruker AXS, and measurement was performed by an out-of-plane method.

FIG. 39 shows that the intensity of the peak indicating crystallinity was higher in the order of the sample 16, the sample 15, the sample 14, the sample 13, the sample 12, and the sample 11. That is, when the percentage of the oxygen gas at the time of the deposition is higher, the crystallinity of an oxide semiconductor film to be obtained is improved.

This example shows that the crystallinity of an oxide semiconductor film to be obtained is improved as a film serving as a base has higher planarity, as a substrate temperature at the time of deposition is higher, and as the percentage of an oxygen gas at the time of deposition is higher.

EXPLANATION OF REFERENCE

10: deposition chamber, 10a: deposition chamber, 10b: deposition chamber, 10c: deposition chamber, 11: substrate supply chamber, 12: load lock chamber, 12a: load lock chamber, 12b: load lock chamber, 13: transfer chamber, 14: cassette port, 15: substrate heating chamber, 20a: deposition chamber, 20b: deposition chamber, 22a: load lock chamber, 22b: load lock chamber, 25: substrate heating chamber, 32: sputtering target, 34: target holder, 54: refiner, 58a: cryopump, 58b: cryopump, 58c: turbo molecular pump, 58d: cryopump, 58e: cryopump, 58f: cryopump, 59: vacuum pump, 59a: vacuum pump, 59b: vacuum pump, 59c: vacuum pump, 60: mass flow controller, 62: gas heating system, 66: cryotrap, 100: substrate, 102: base insulating film, 104: gate electrode, 106: oxide semiconductor film, 112: gate insulating film, 116: pair of electrodes, 204: gate electrode, 206: oxide semiconductor film, 212: gate insulating film, 216: pair of electrodes, 304: gate electrode, 306: oxide semiconductor film, 312: gate insulating film, 316: pair of electrodes, 318: protective insulating film, 406: oxide semiconductor film, 416: pair of electrodes, 418: protective insulating film, 502: base insulating film, 504: gate electrode, 506: oxide semiconductor film, 506a: high-resistance region, 506b: low-resistance region, 507: oxide semiconductor film, 507a: high-resistance region, 507b: low-resistance region, 512: gate insulating film, 516: pair of electrodes, 518: protective insulating film, 520: protective film, 522: wiring, 524: sidewall insulating film, 602: base insulating film, 604: gate electrode, 606: oxide semiconductor film, 606a: high-resistance region, 606b: low-resistance region, 612: gate insulating film, 616: pair of electrodes, 618: protective insulating film, 622: wiring, 700: substrate, 702: base insulating film, 704: gate electrode, 706: oxide semiconductor film, 712: gate insulating film, 716: pair of electrodes, 718: interlayer insulating film, 722: wiring, 728: protective insulating film, 1141: switching element, 1142: semiconductor device, 1143: semiconductor device group, 1189: ROM interface, 1190: substrate, 1191: ALU, 1192: ALU controller, 1193: instruction decoder, 1194: interrupt controller, 1195: timing controller, 1196: register, 1197 register controller, 1198: bus interface, 1199: ROM, 2200: pixel, 2210: liquid crystal element, 2220: capacitor, 2230: transistor, 3100: substrate, 3102: base insulating film, 3104: gate electrode, 3106: oxide semiconductor film, 3106a: high-resistance region, 3106b: low-resistance region, 3112: gate insulating film, 3116: pair of electrodes, 3118: interlayer insulating film, 3120: protective film, 3122: wiring, 3124: sidewall insulating film, 3326: electrode, 3328: interlayer insulating film, 3330: capacitor, 3340: transistor, 3350: transistor, 3382: base insulating film, 3384: semiconductor film, 3384a: first low-resistance region, 3384b: second low-resistance region, 3384c: third low-resistance region, 3386: gate insulating film, 3392: gate electrode, 3394: sidewall insulating film, 3396: interlayer insulating film, 4300: housing, 4301: button, 4302: microphone, 4303: display portion, 4304: speaker, 4305: camera, 4310: housing, 4311: display portion, 4320: housing, 4321: button, 4322: microphone, 4323: display portion, 5001: mold, 5002: compound powder, 5012: compound film, 5022: compound film, 5032: plate-like compound, 5042: plate-like compound, 5101: mold, 5102: slurry, 5112: compound film, 5122: compound film, and 5132: plate-like compound.

This application is based on Japanese Patent Application serial No. 2011-128750 filed with the Japan Patent Office on Jun. 8, 2011 and Japanese Patent Application serial No. 2011-274954 filed with the Japan Patent Office on Dec. 15, 2011, the entire contents of which are hereby incorporated by reference.

The invention claimed is:

1. A semiconductor device comprising:
a transistor;
an oxide semiconductor film comprising a channel of the transistor;
a gate electrode of the transistor overlapping with the oxide semiconductor film with a gate insulating film of the transistor provided therebetween;
an insulating film over the gate electrode; and
a wiring over the insulating film,
wherein the wiring is electrically connected to the oxide semiconductor film via a first opening provided in the insulating film and the gate insulating film,
wherein the oxide semiconductor film comprises a second opening overlapping with the first opening,
wherein the oxide semiconductor film is in contact with the wiring in the second opening,
wherein a conductive film is provided below the oxide semiconductor film, and
wherein the conductive film comprises a first region overlapping with the oxide semiconductor film, a second region not overlapping with the oxide semiconductor film, and a third region overlapping with the wiring.

2. A semiconductor device comprising:
a transistor;
an oxide semiconductor film comprising a channel of the transistor;
a gate electrode of the transistor overlapping with the oxide semiconductor film with a gate insulating film of the transistor provided therebetween;
an insulating film over the gate electrode; and
a wiring over the insulating film,
wherein the wiring is electrically connected to the oxide semiconductor film via a first opening provided in the insulating film and the gate insulating film,
wherein the oxide semiconductor film comprises a second opening overlapping with the first opening,
wherein the oxide semiconductor film is in contact with the wiring in the second opening, and
wherein the wiring has a region overlapping with a conductive film provided below the oxide semiconductor film.

3. A semiconductor device comprising:
a transistor;
a first insulating film;
an oxide semiconductor film comprising a channel of the transistor over and in contact with the first insulating film;
a gate electrode of the transistor overlapping with the oxide semiconductor film with a gate insulating film of the transistor provided therebetween;
a second insulating film over the gate electrode; and
a wiring over the second insulating film, wherein the wiring is electrically connected to the oxide semiconductor film via a first opening provided in the second insulating film and the gate insulating film, wherein the oxide semiconductor film comprises a second opening overlapping with the first opening, wherein the oxide semiconductor film is in contact with the wiring in the second opening, wherein the wiring has a region overlapping with a conductive film provided below the oxide semiconductor film, and wherein the conductive film is in contact with the first insulating film.

4. The semiconductor device according to claim 1, wherein the oxide semiconductor film comprises indium.

5. The semiconductor device according to claim 2, wherein the oxide semiconductor film comprises indium.

6. The semiconductor device according to claim 3, wherein the oxide semiconductor film comprises indium.

\* \* \* \* \*